US007832840B2

(12) United States Patent
Silverbrook et al.

(10) Patent No.: US 7,832,840 B2
(45) Date of Patent: *Nov. 16, 2010

(54) PRINTED CIRCUIT BOARD ASSEMBLY WITH MODULAR PRINTED CIRCUIT BOARDS

(75) Inventors: Kia Silverbrook, Balmain (AU); Norman Micheal Berry, Balmain (AU); Garry Raymond Jackson, Balmain (AU); Akira Nakazawa, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 382 days.

This patent is subject to a terminal disclaimer.

(21) Appl. No.: 11/951,095

(22) Filed: Dec. 5, 2007

(65) Prior Publication Data

US 2008/0084674 A1 Apr. 10, 2008

Related U.S. Application Data

(63) Continuation of application No. 11/592,984, filed on Nov. 6, 2006, now Pat. No. 7,306,324, which is a continuation of application No. 10/760,200, filed on Jan. 21, 2004, now Pat. No. 7,152,959.

(51) Int. Cl.
*B41J 2/14* (2006.01)
(52) U.S. Cl. ...................................................... 347/50
(58) Field of Classification Search ................. 347/13, 347/42, 49, 50, 58–59
See application file for complete search history.

(56) References Cited

U.S. PATENT DOCUMENTS

| 7,152,959 | B2 | 12/2006 | Silverbrook et al. | |
| 7,645,005 | B2 * | 1/2010 | Silverbrook et al. | ........... 347/5 |
| 2002/0186285 | A1 | 12/2002 | Silverbrook | |
| 2005/0157087 | A1 | 7/2005 | Silverbrook et al. | |
| 2006/0238569 | A1 | 10/2006 | Silverbrook et al. | |

FOREIGN PATENT DOCUMENTS

| EP | 0615845 B1 | 6/1997 |
| GB | 2343415 A | 5/2000 |
| WO | WO 91/17051 A1 | 11/1991 |
| WO | WO 01/42026 A1 | 6/2001 |
| WO | WO 01/64441 A1 | 9/2001 |
| WO | WO 01/64444 A1 | 9/2001 |
| WO | WO 01/89849 A1 | 11/2001 |
| WO | WO 02/076748 A1 | 10/2002 |

* cited by examiner

*Primary Examiner*—Lamson D Nguyen

(57) ABSTRACT

A printed circuit board (PCB) assembly has a number of modular printhead controller printed circuit board (PCB), Electrical connector assemblies operatively connect respective PCBs to each other. Each connector assembly has a connecting member with a series of parallel spaced conducting strips. Each member is shaped and configured for fitment into a cavity defined by the raised and recessed portions of two abutting supports to connect the connecting strips of two PCBs via said conducting strips. Each PCB is mounted to a respective modular support that defines a raised portion and a recessed portion at an end thereof. The PCBs each have electrical connecting strips which overlie the respective recessed portions.

4 Claims, 60 Drawing Sheets

I-I

II-II

PRINTED CIRCUIT BOARD ASSEMBLY WITH MODULAR PRINTED CIRCUIT BOARDS

CROSS REFERENCE TO RELATED APPLICATION

This application is a continuation of U.S. application Ser. No. 11/592,984 filed Nov. 6, 2006, which is a continuation of U.S. application Ser. No. 10/760,200 filed Jan. 21, 2004, now issued U.S. Pat. No. 7,152,959, all of which are herein incorporated by reference.

FIELD OF THE INVENTION

The present invention relates to a printhead unit for use in a printing system. More particularly, the present invention relates to a printhead assembly which is mountable to and demountable from a printing unit.

CROSS-REFERENCE TO CO-PENDING APPLICATIONS

The following applications have been filed by the Applicant simultaneously with the present application:

| | | | | | |
|---|---|---|---|---|---|
| 7,156,508 | 7,159,972 | 7,083,271 | 7,165,834 | 7,080,894 | 7,201,469 |
| 7,090,336 | 7,156,489 | 10/760,233 | 10/760,246 | 7,083,257 | 7,258,422 |
| 7,255,423 | 7,219,980 | 10/760,253 | 10/760,255 | 10/760,209 | 7,118,192 |
| 10/760,194 | 10/760,238 | 7,077,505 | 7,198,354 | 7,077,504 | 10/760,189 |
| 7,198,355 | 10/760,232 | 10/760,231 | 7,213,906 | 7,178,901 | 7,222,938 |
| 7,108,353 | 7,104,629 | 10/760,254 | 10/760,210 | 10/760,202 | 7,201,468 |
| 10/760,198 | 10/760,249 | 7,234,802 | 10/760,196 | 7,287,846 | 7,156,511 |
| 10/760,264 | 7,258,432 | 7,097,291 | 10/760,222 | 10/760,248 | 7,083,273 |
| 10/760,192 | 10/760,203 | 10/760,204 | 10/760,205 | 10/760,206 | 10/760,267 |
| 10/760,270 | 7,198,352 | 10/760,271 | 10/760,275 | 7,201,470 | 7,121,655 |
| 10/760,184 | 7,232,208 | 10/760,186 | 10/760,261 | 7,083,272 | 10/760,180 |
| 7,111,935 | 10/760,213 | 10/760,219 | 10/760,237 | 7,261,482 | 10/760,220 |
| 7,002,664 | 10/760,252 | 10/760,265 | 7,237,888 | 7,168,654 | 7,201,272 |
| 6,991,098 | 7,217,051 | 6,944,970 | 10/760,215 | 7,108,434 | 10/760,257 |
| 7,210,407 | 7,186,042 | 10/760,266 | 6,920,704 | 7,217,049 | 10/760,214 |
| 10/760,260 | 7,147,102 | 7,287,828 | 7,249,838 | 10/760,241 | |

The disclosures of these co-pending applications are incorporated herein by cross-reference.

BACKGROUND OF THE INVENTION

Pagewidth printheads, for use in printing systems, are known. Such printheads typically span the width of the print media on which information is to be printed, and as such the dimensions and configuration of the printheads vary depending upon the application of the printing system and the dimensions of the print media. In this regard, due to the large variation in the required dimensions of such printheads, it is difficult to manufacture such printheads in a manner which caters for this variability.

Accordingly, the applicant has proposed the use of a pagewidth printhead made up of a plurality of replaceable printhead tiles arranged in an end-to-end manner. Each of the tiles mount an integrated circuit incorporating printing nozzles which eject printing fluid, e.g., ink, onto the print media in a known fashion. Such an arrangement has made it easier to manufacture printheads of variable dimensions and has also enabled the ability to remove and replace any defective tile in a pagewidth printhead without having to scrap the entire printhead.

However, apart from the ability to remove and replace any defective tiles, the previously proposed printhead is generally formed as an integral unit, with each component of the printhead fixedly attached to other components. Such an arrangement complicates the assembly process and does not provide for easy disassembly should the need to replace components other than just the defective tiles be necessary. Accordingly, a printhead unit which is easier to assemble and disassemble and which is made up of a number of separable individual parts to form a printhead unit of variable dimensions is required.

SUMMARY OF THE INVENTION

In one embodiment of the present invention, there is provided a printhead assembly, comprising:

at least one printhead module comprising at least two printhead integrated circuits, each of which has nozzles formed therein for delivering printing fluid onto the surface of print media, a support member supporting and carrying the printing fluid to the at least two printhead integrated circuits, and an electrical connector for connecting electrical signals to the at least two printhead integrated circuits;

drive electronics arranged to control the printing operation of at least one of the at least two printhead integrated circuits via the electrical connector;

a plurality of longitudinally extending electrical conductors for providing power from a power supply to the drive electronics and the at least two printhead integrated circuits;

a casing comprising a support frame supporting the at least one printhead module; and at least one mounting element held by the support frame, the at least one mounting element mounting the drive electronics and electrical conductors and incorporating a clamping arrangement for clamping the at least one printhead module to the support frame.

To facilitate the clamping, the support member includes longitudinally extending tabs on the two parallel sides thereof, with the support frame comprising a first side wall having a longitudinally extending recessed groove and a second side wall substantially parallel to the first side wall. Consequently, the longitudinally extending tab on one side of the support member is received in the longitudinally extending recessed groove of the support frame and the longitudinally extending tab on the other side of the support member is received on an upper surface of the second side wall of the support frame.

The clamping arrangement comprises locking members for interlocking with lug members of the printhead module, where the lug members are provided along the longitudinally extending tabs of the support member and are spaced so as to correspond to the mounted positions of the at least two printhead integrated circuits. The locking members interlock with the lug members by being provided as recessed portions which engage with the lug members on the clamped longitudinally extending tab.

The mounting element(s) incorporate the clamping arrangement by comprising at least one extending arm portion arranged so as to clamp the longitudinally extending tab of the support member to the upper surface of the second side wall of the support frame. In this arrangement, the extending arm portion(s) includes the recessed portions of the clamping arrangement.

The printhead module(s) may be formed as a unitary arrangement of the at least two printhead integrated circuits, the support member, the electrical connector, and at least one fluid distribution member mounting the at least two printhead integrated circuits to the support member. In this arrangement, the support member has at least one longitudinally extending channel for carrying the printing fluid for the printhead integrated circuits and includes a plurality of apertures extending through a wall of the support member arranged so as to direct the printing fluid from the at least one channel to associated nozzles in both, or if more than two, all of the printhead integrated circuits by way of respective ones of the fluid distribution members.

An embodiment of a printhead module that incorporates features of the present invention is now described by way of example with reference to the accompanying drawings, as is an embodiment of a printhead assembly that incorporates the printhead module.

DETAILED DESCRIPTION OF EXEMPLARY EMBODIMENTS

The exemplary embodiments of the present invention are described as a printhead assembly and a printhead module that is incorporated in the printhead assembly.

General Overview

Figure 1:
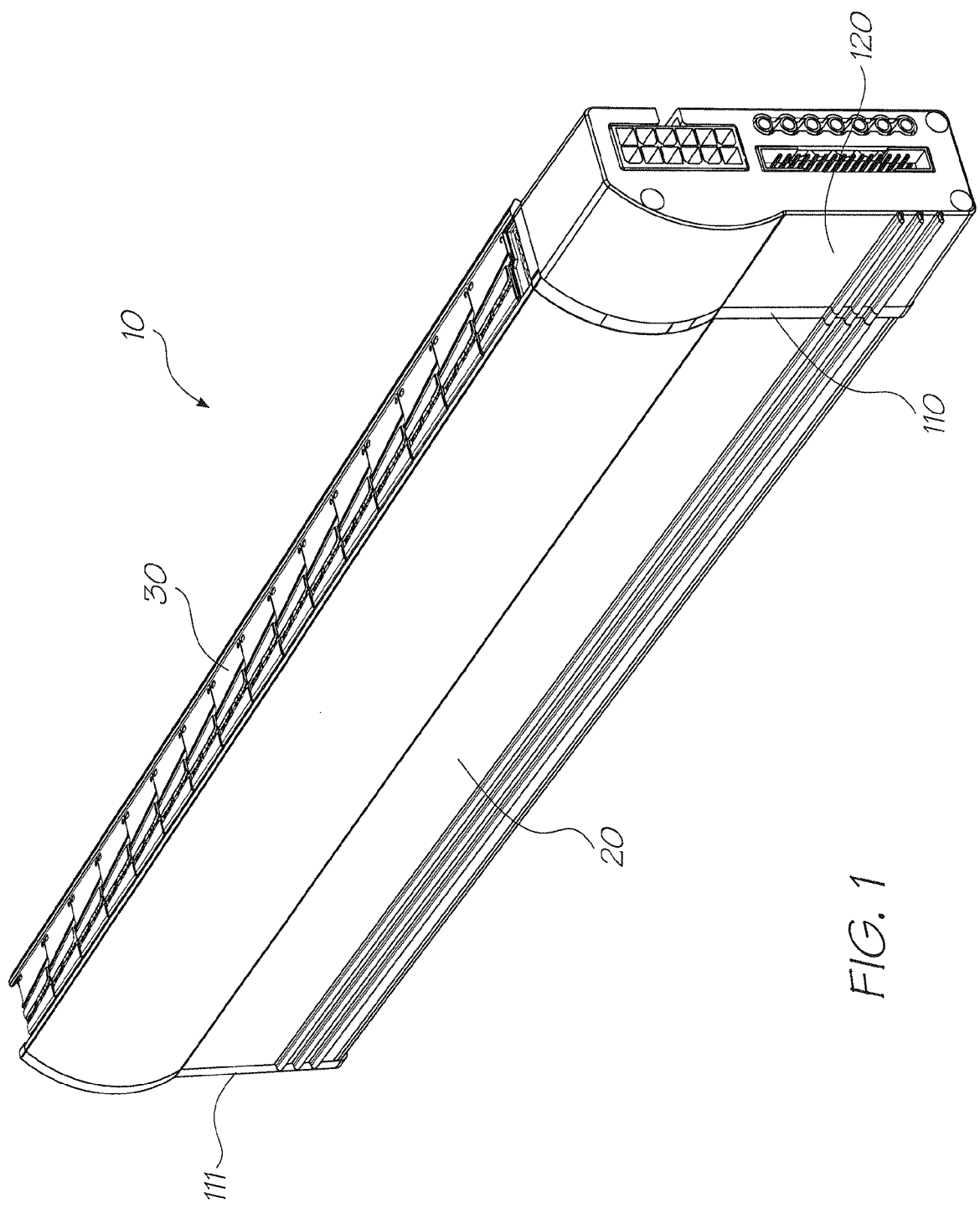
FIG. 1 shows a perspective view of a printhead assembly in accordance with an embodiment of the present invention.
Figure 2:
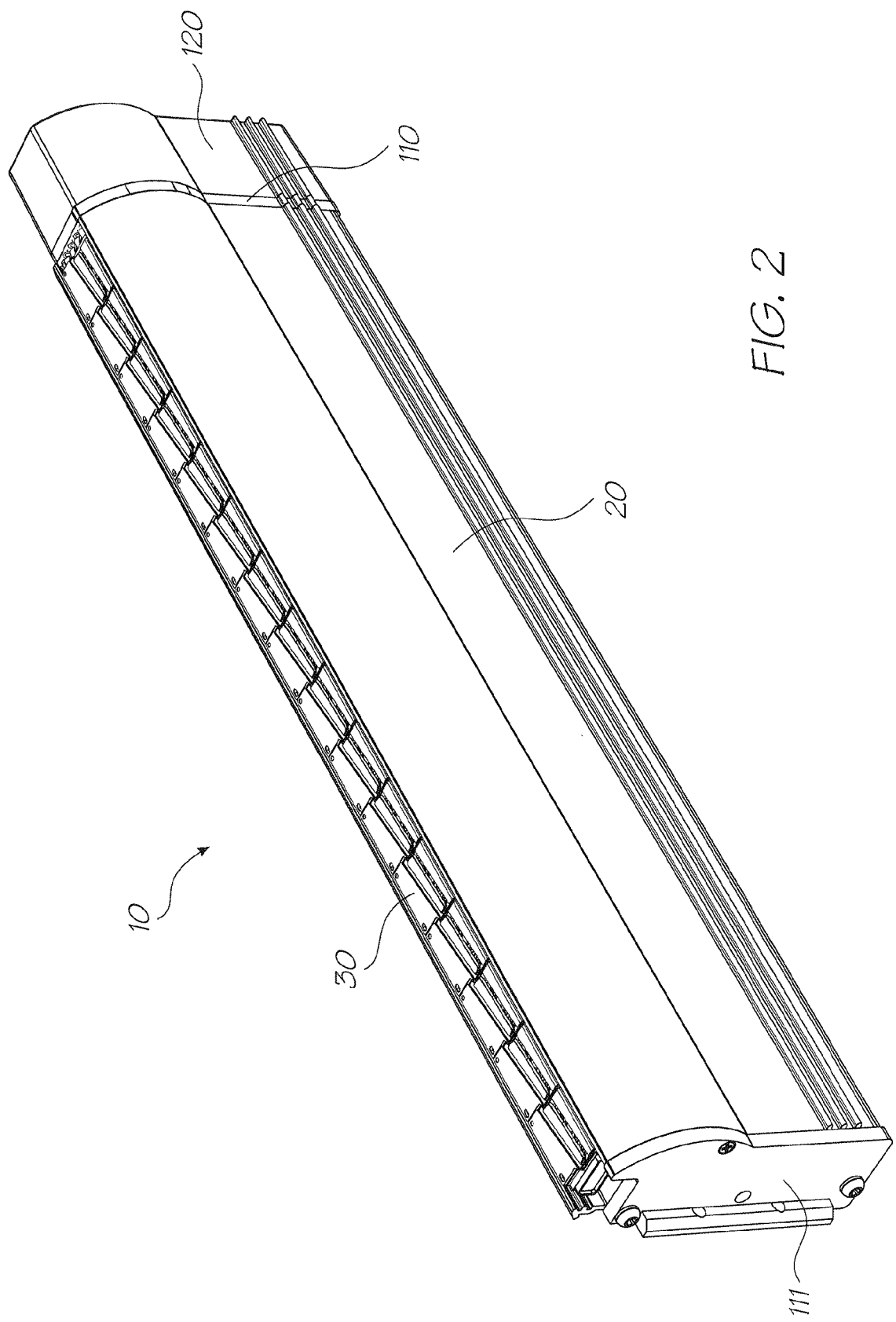
FIG. 2 shows the opposite side of the printhead assembly of FIG. 1.

The printhead assembly 10 as shown in FIGS. 1 and 2 is intended for use as a pagewidth printhead in a printing system. That is, a printhead which extends across the width or along the length of a page of print media, e.g., paper, for printing. During printing, the printhead assembly ejects ink onto the print media as it progresses past, thereby forming printed information thereon, with the printhead assembly being maintained in a stationary position as the print media is progressed past. That is, the printhead assembly is not scanned across the page in the manner of a conventional printhead.

As can be seen from FIGS. 1 and 2, the printhead assembly 10 includes a casing 20 and a printhead module 30. The casing 20 houses the dedicated (or drive) electronics for the printhead assembly together with power and data inputs, and provides a structure for mounting the printhead assembly to a printer unit. The printhead module 30, which is received within a channel 21 of the casing 20 so as to be removable therefrom, includes a fluid channel member 40 which carries printhead tiles 50 having printhead integrated circuits 51 incorporating printing nozzles thereon. The printhead assembly 10 further includes an end housing 120 and plate 110 assembly and an end plate 111 which are attached to longitudinal ends of the assembled casing 20 and printhead module 30.

The printhead module 30 and its associated components will now be described with reference to FIGS. 1 to 14B.

Figure 3:
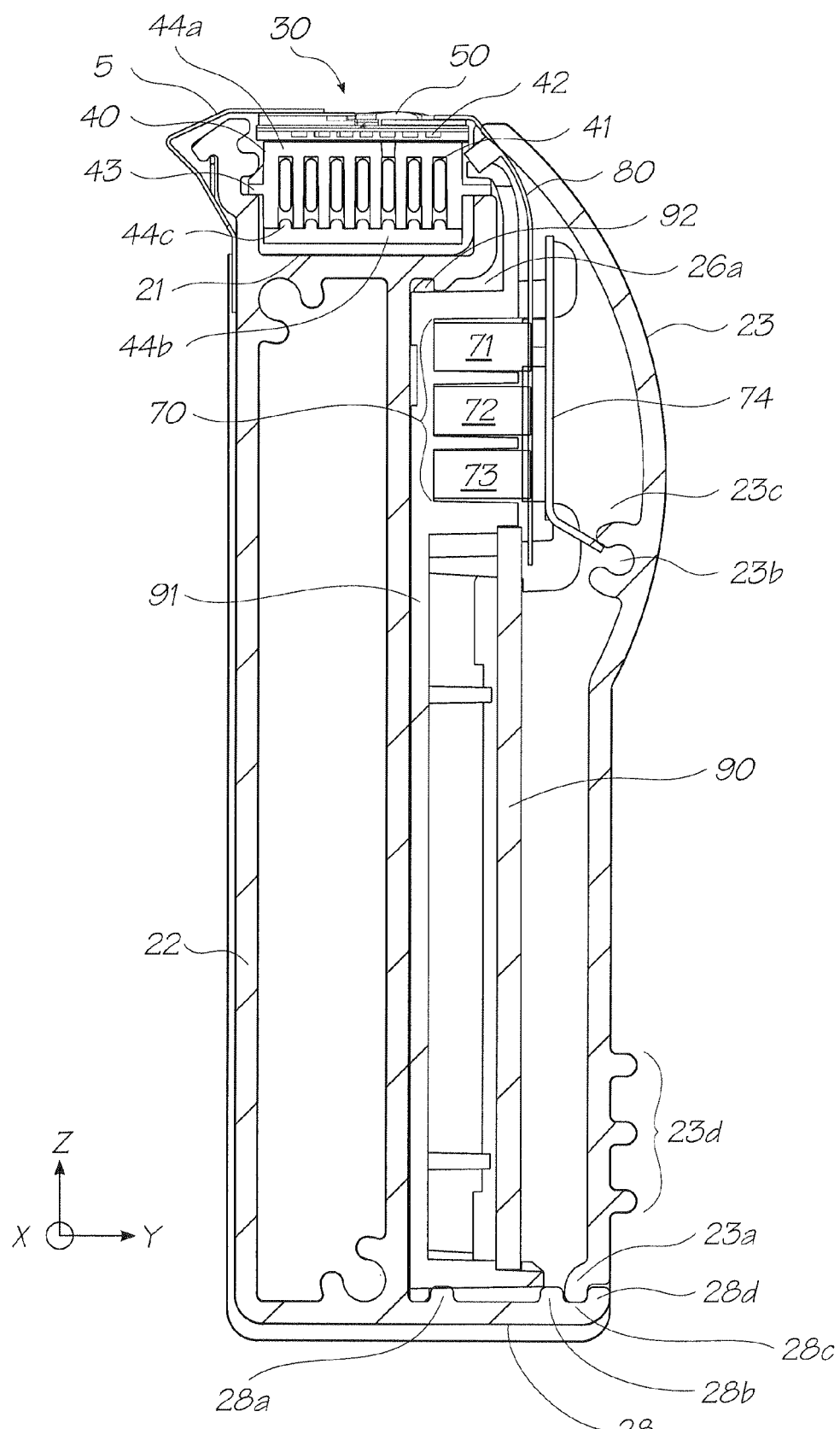
FIG. 3 shows a sectional view of the printhead assembly of FIG. 1.

As shown in FIG. 3, the printhead module 30 includes the fluid channel member 40 and the printhead tiles 50 mounted on the upper surface of the member 40.

As illustrated in FIGS. 1 and 2, sixteen printhead tiles 50 are provided in the printhead module 30. However, as will be understood from the following description, the number of printhead tiles and printhead integrated circuits mounted thereon may be varied to meet specific applications of the present invention.

As illustrated in FIGS. 1 and 2, each of the printhead tiles 50 has a stepped end region so that, when adjacent printhead tiles 50 are butted together end-to-end, the printhead integrated circuits 51 mounted thereon overlap in this region. Further, the printhead integrated circuits 51 extend at an angle relative to the longitudinal direction of the printhead tiles 50 to facilitate overlapping between the printhead integrated circuits 51. This overlapping of adjacent printhead integrated circuits 51 provides for a constant pitch between the printing nozzles (described later) incorporated in the printhead integrated circuits 51 and this arrangement obviated discontinuities in information printed across or along the print media (not shown) passing the printhead assembly 10. This overlapping arrangement of the printhead integrated circuits is described in the Applicant's issued U.S. Pat. No. 6,623,106, which is incorporated herein by reference.

Figure 4A:
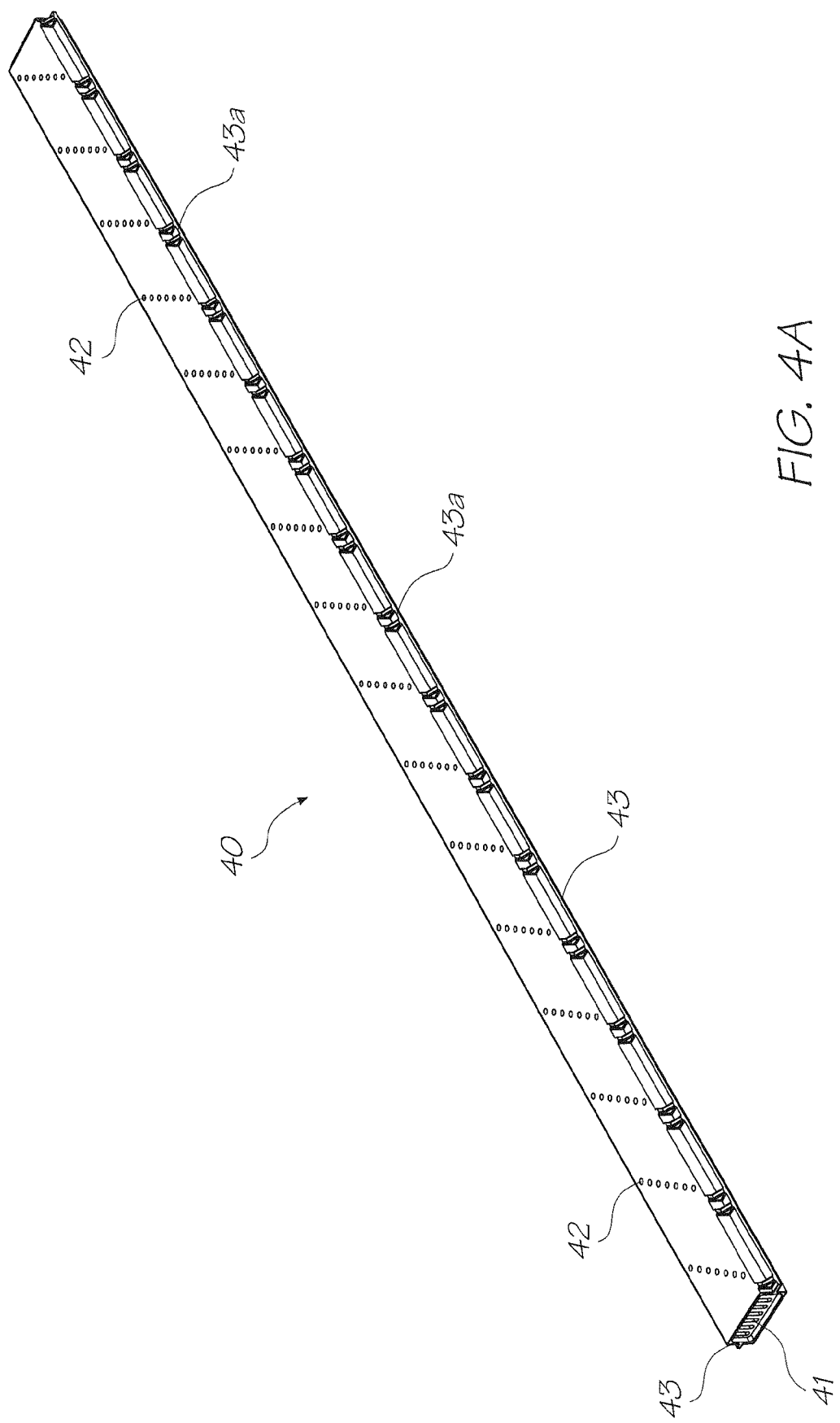
FIG. 4A illustrates a portion of a printhead module that is incorporated in the printhead assembly of FIG. 1.
Figure 4B:
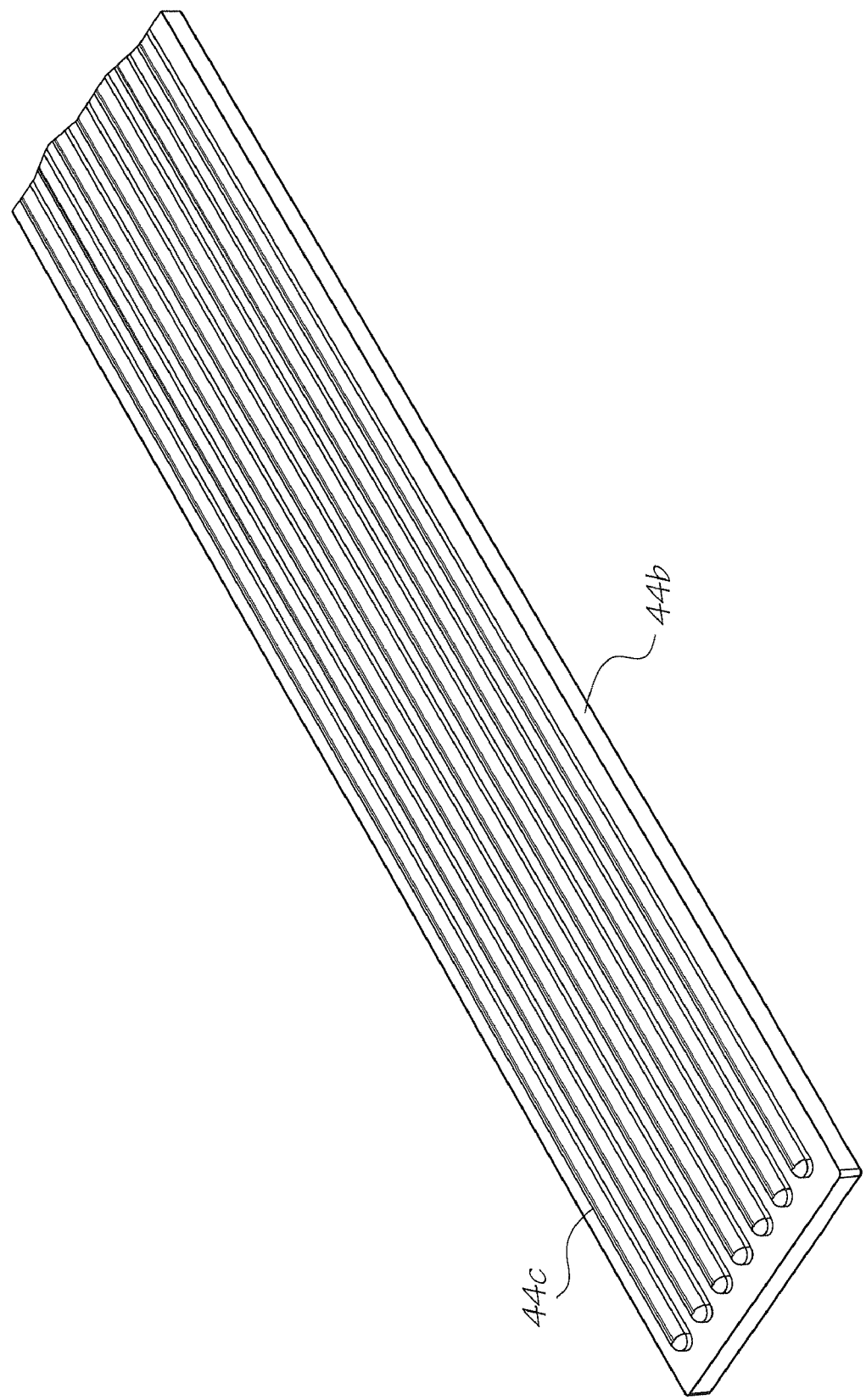
FIG. 4B illustrates a lid portion of the printhead module of FIG. 4A.

FIG. 4 shows the fluid channel member 40 of the printhead module 30 which serves as a support member for the printhead tiles 50. The fluid channel member 40 is configured so as to fit within the channel 21 of the casing 20 and is used to deliver printing ink and other fluids to the printhead tiles 50. To achieve this, the fluid channel member 40 includes channel-shaped ducts 41 which extend throughout its length from each end of the fluid channel member 40. The channel-shaped ducts 41 are used to transport printing ink and other fluids from a fluid supply unit (of a printing system to which the printhead assembly 10 is mounted) to the printhead tiles 50 via a plurality of outlet ports 42.

The fluid channel member 40 is formed by injection moulding a suitable material. Suitable materials are those which have a low coefficient of linear thermal expansion (CTE), so that the nozzles of the printhead integrated circuits are accurately maintained under operational condition (described in more detail later), and have chemical inertness to the inks and other fluids channeled through the fluid channel member 40. One example of a suitable material is a liquid crystal polymer (LCP). The injection moulding process is employed to form a body portion 44a having open channels or grooves therein and a lid portion 44b which is shaped with elongate ridge portions 44c to be received in the open channels. The body and lid portions 44a and 44b are then adhered together with an epoxy to form the channel-shaped ducts 41 as shown in FIGS. 3 and 4A. However, alternative moulding techniques may be employed to form the fluid channel member 40 in one piece with the channel-shaped ducts 41 therein.

The plurality of ducts 41, provided in communication with the corresponding outlet ports 42 for each printhead tile 50, are used to transport different coloured or types of inks and the other fluids. The different inks can have different colour pigments, for example, black, cyan, magenta and yellow, etc., and/or be selected for different printing applications, for example, as visually opaque inks, infrared opaque inks, etc. Further, the other fluids which can be used are, for example, air for maintaining the printhead integrated circuits 51 free from dust and other impurities and/or for preventing the print media from coming into direct contact with the printing nozzles provided on the printhead integrated circuits 51, and fixative for fixing the ink substantially immediately after being printed onto the print media, particularly in the case of high-speed printing applications.

In the assembly shown in FIG. 4, seven ducts 41 are shown for transporting black, cyan, magenta and yellow coloured ink, each in one duct, infrared ink in one duct, air in one duct and fixative in one duct. Even though seven ducts are shown, a greater or lesser number may be provided to meet specific applications. For example, additional ducts might be provided for transporting black ink due to the generally higher percentage of black and white or greyscale printing applications.

The fluid channel member 40 further includes a pair of longitudinally extending tabs 43 along the sides thereof for securing the printhead module 30 to the channel 21 of the casing 20 (described in more detail later). It is to be understood however that a series of individual tabs could alternatively be used for this purpose.

Figure 5A:
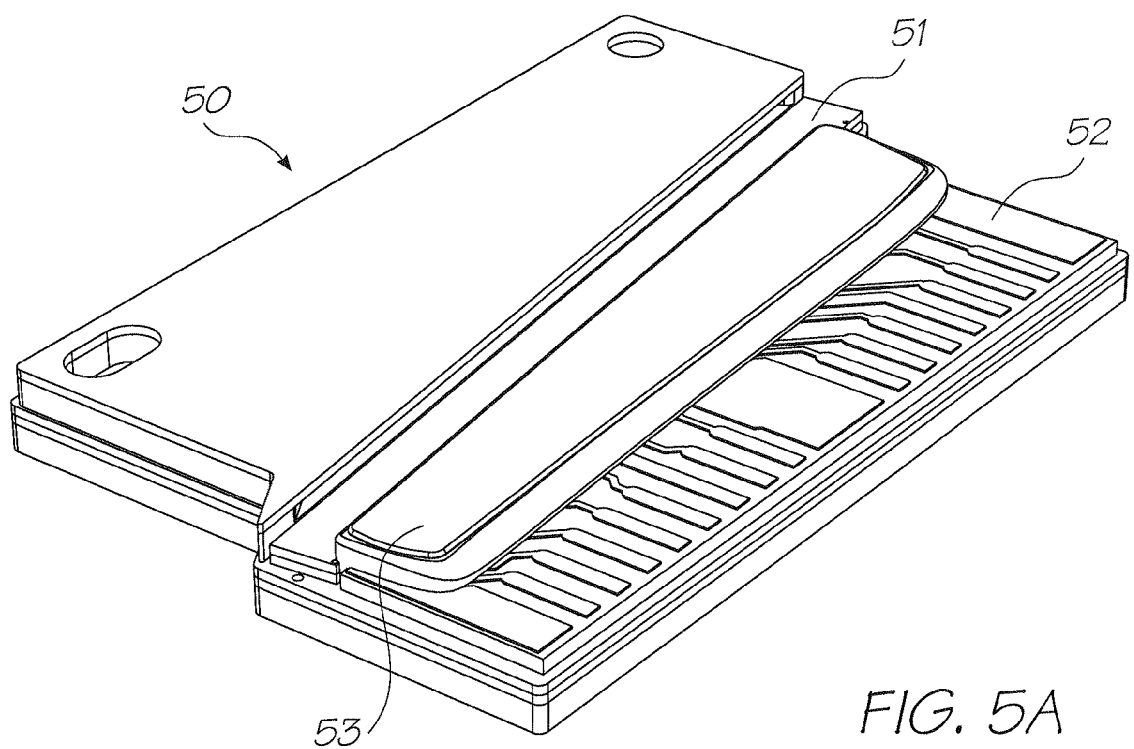
FIG. 5A shows a top view of a printhead tile that forms a portion of the printhead module of FIG. 4A.
Figure 6:
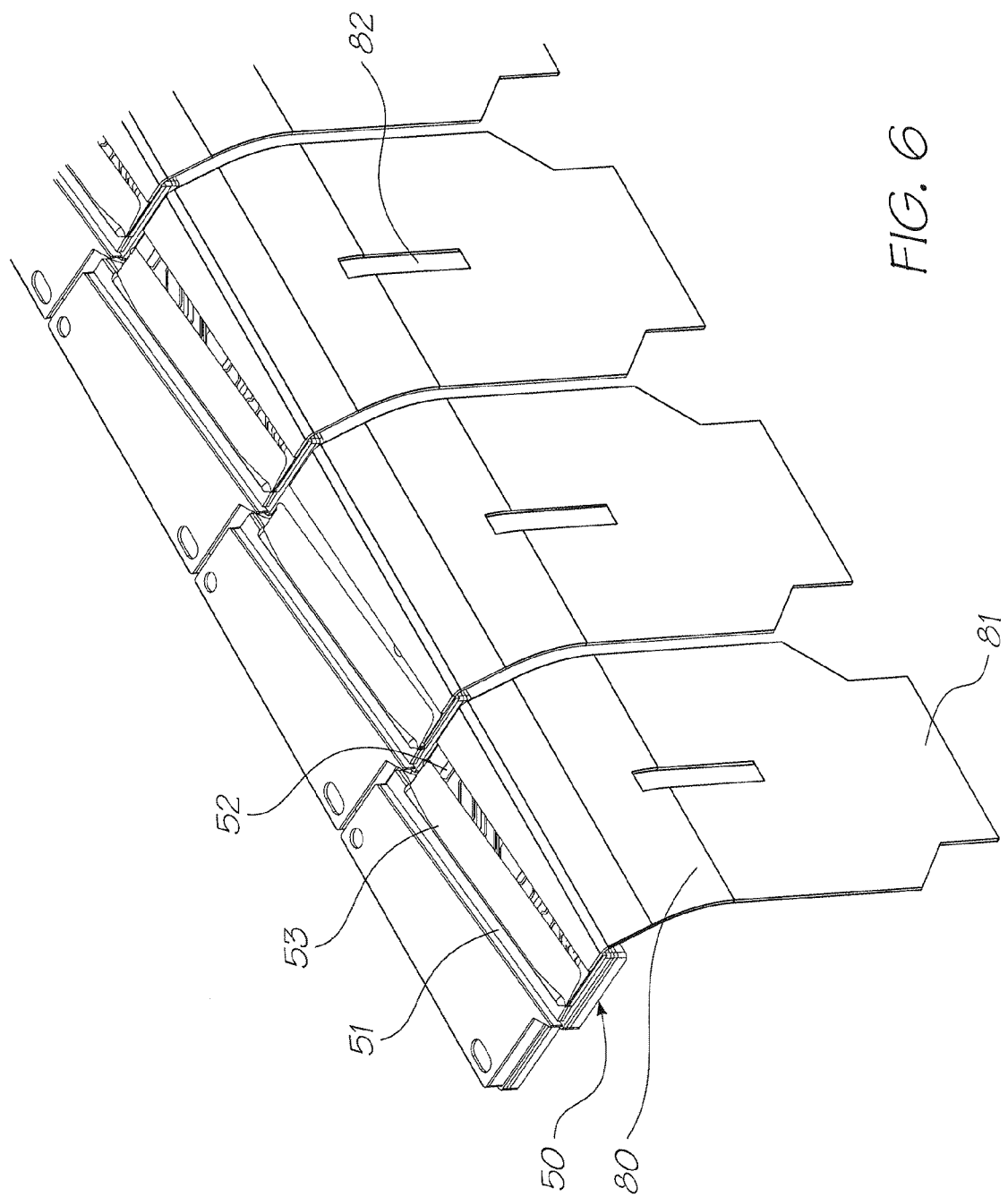
FIG. 6 illustrates electrical connectors for printhead integrated circuits that are mounted to the printhead tiles as shown in FIG. 5A.
Figure 7:
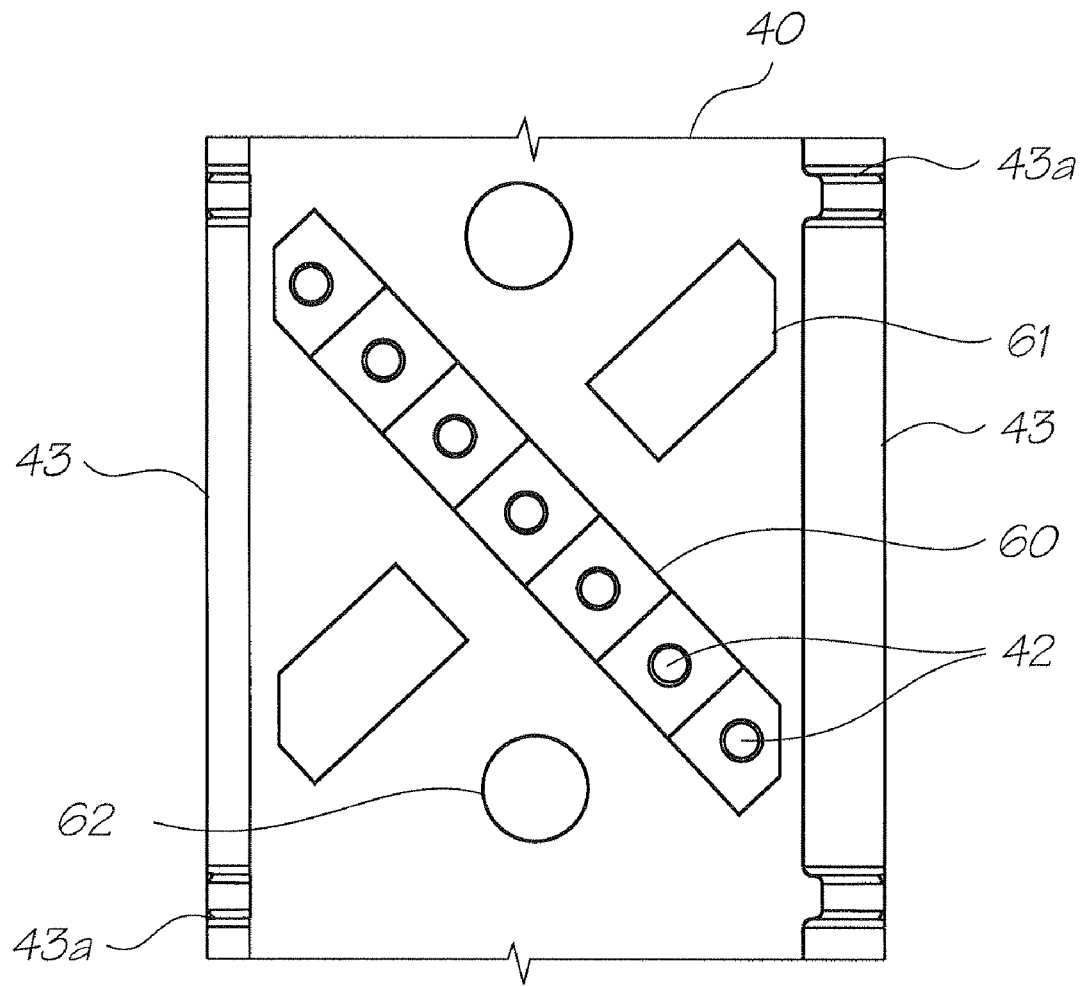
FIG. 7 illustrates a connection that is made between the printhead module of FIG. 4A and the underside of the printhead tile of FIGS. 5A and 5B.
Figure 18A:
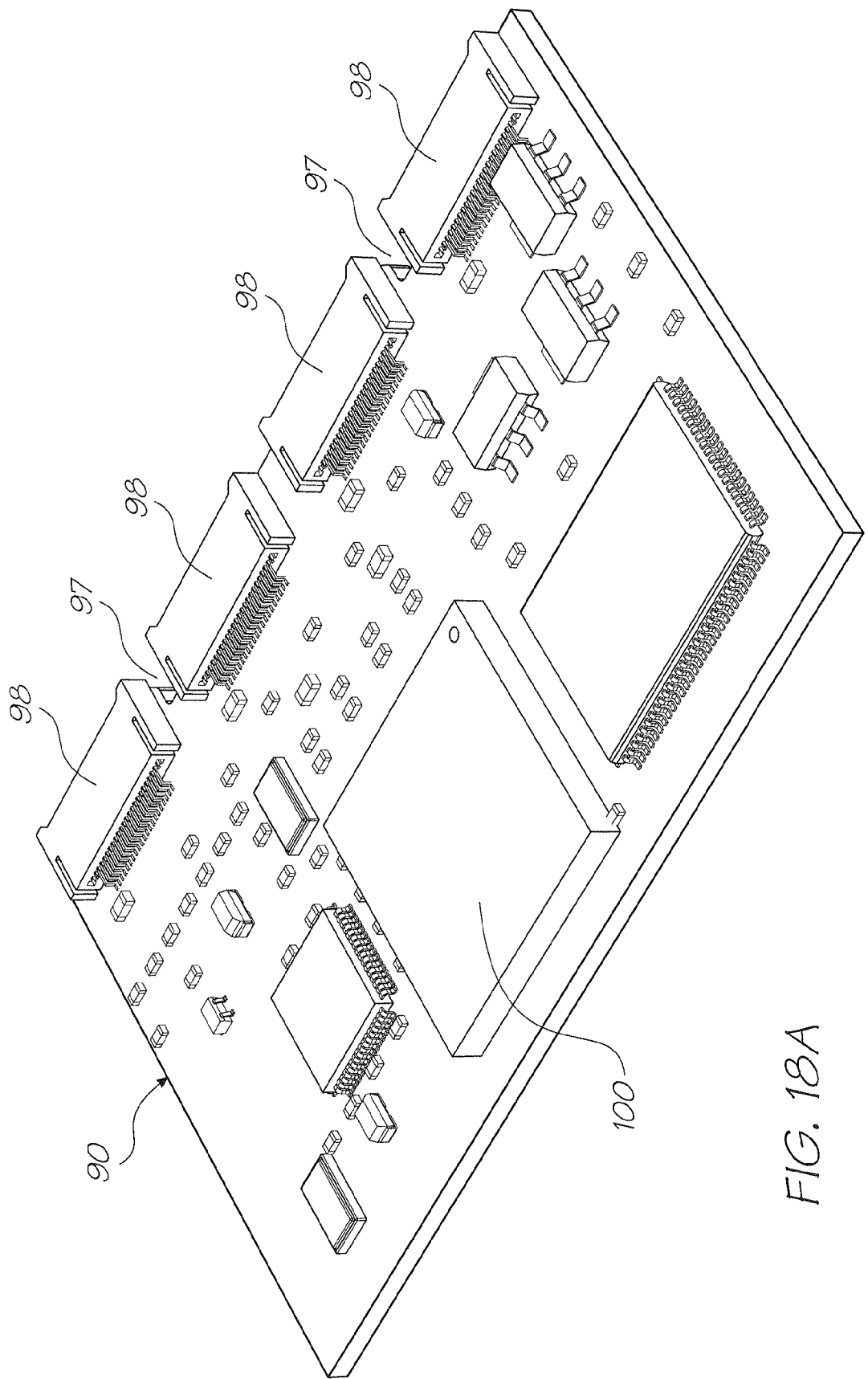
FIG. 18A illustrates circuit components carried by a PCB supported by the PCB support of FIG. 16.

As shown in FIG. 5A, each of the printhead tiles 50 of the printhead module 30 carries one of the printhead integrated circuits 51, the latter being electrically connected to a printed circuit board (PCB) 52 using appropriate contact methods such as wire bonding, with the connections being protectively encapsulated in an epoxy encapsulant 53. The PCB 52 extends to an edge of the printhead tile 50, in the direction away from where the printhead integrated circuits 51 are placed, where the PCB 52 is directly connected to a flexible printed circuit board (flex PCB) 80 for providing power and data to the printhead integrated circuit 51 (described in more detail later). This is shown in FIG. 6 with individual flex PCBs 80 extending or "hanging" from the edge of each of the printhead tiles 50. The flex PCBs 80 provide electrical connection between the printhead integrated circuits 51, a power supply 70 and a PCB 90 (see FIG. 3) with drive electronics 100 (see FIG. 18A) housed within the casing 20 (described in more detail later).

Figure 5B:
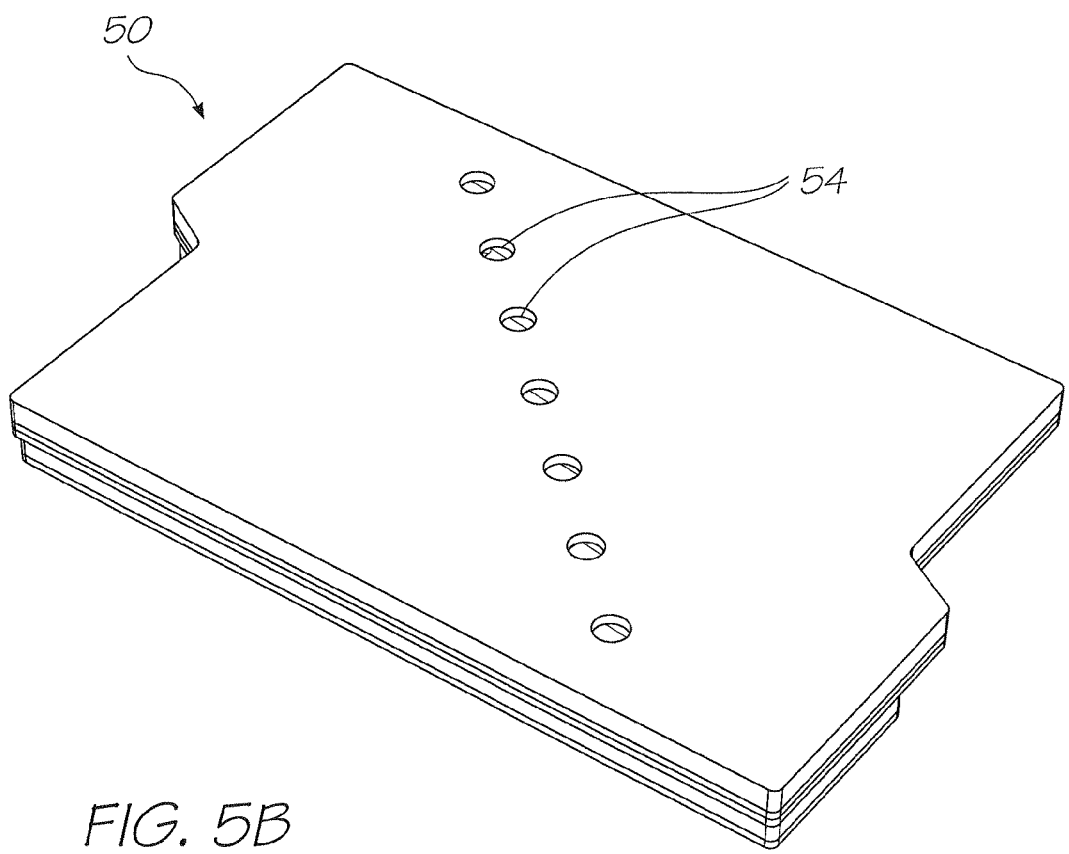
FIG. 5B shows a bottom view of the printhead tile of FIG. 5A.

FIG. 5B shows the underside of one of the printhead tiles 50. A plurality of inlet ports 54 is provided and the inlet ports 54 are arranged to communicate with corresponding ones of the plurality of outlet ports 42 of the ducts 41 of the fluid channel member 40 when the printhead tiles 50 are mounted thereon. That is, as illustrated, seven inlet ports 54 are provided for the outlet ports 42 of the seven ducts 41. Specifically, both the inlet and outlet ports are orientated in an inclined disposition with respect to the longitudinal direction of the printhead module so that the correct fluid, i.e., the fluid being channeled by a specific duct, is delivered to the correct nozzles (typically a group of nozzles is used for each type of ink or fluid) of the printhead integrated circuits.

On a typical printhead integrated circuit 51 as employed in realisation of the present invention, more than 7000 (e.g., 7680) individual printing nozzles may be provided, which are spaced so as to effect printing with a resolution of 1600 dots per inch (dpi). This is achieved by having a nozzle density of 391 nozzles/mm$^2$ across a print surface width of 20 mm (0.8 in), with each nozzle capable of delivering a drop volume of 1 pl.

Accordingly, the nozzles are micro-sized (i.e., of the order of $10^{-6}$ metres) and as such are not capable of receiving a macro-sized (i.e., millimetric) flows of ink and other fluid as presented by the inlet ports 54 on the underside of the printhead tile 50. Each printhead tile 50, therefore, is formed as a fluid distribution stack 500 (see FIG. 43), which includes a plurality of laminated layers, with the printhead integrated circuit 51, the PCB 52, and the epoxy 53 provided thereon.

The stack 500 carries the ink and other fluids from the ducts 41 of the fluid channel member 40 to the individual nozzles of the printhead integrated circuit 51 by reducing the macro-sized flow diameter at the inlet ports 54 to a micro-sized flow diameter at the nozzles of the printhead integrated circuits 51. An exemplary structure of the stack which provides this reduction is described in more detail later.

Nozzle systems which are applicable to the printhead assembly of the present invention may comprise any type of ink jet nozzle arrangement which can be integrated on a printhead integrated circuit. That is, systems such as a continuous ink system, an electrostatic system and a drop-on-demand system, including thermal and piezoelectric types, may be used.

There are various types of known thermal drop-on-demand system which may be employed which typically include ink reservoirs adjacent the nozzles and heater elements in thermal contact therewith. The heater elements heat the ink and create gas bubbles which generate pressures in the ink to cause droplets to be ejected through the nozzles onto the print media. The amount of ink ejected onto the print media and the timing of ejection by each nozzle are controlled by drive electronics. Such thermal systems impose limitations on the type of ink that can be used however, since the ink must be resistant to heat.

There are various types of known piezoelectric drop-on-demand system which may be employed which typically use piezo-crystals (located adjacent the ink reservoirs) which are caused to flex when an electric current flows therethrough. This flexing causes droplets of ink to be ejected from the nozzles in a similar manner to the thermal systems described above. In such piezoelectric systems the ink does not have to be heated and cooled between cycles, thus providing for a greater range of available ink types. Piezoelectric systems are difficult to integrate into drive integrated circuits and typically require a large number of connections between the drivers and the nozzle actuators.

As an alternative, a micro-electromechanical system (MEMS) of nozzles may be used, such a system including thermo-actuators which cause the nozzles to eject ink droplets. An exemplary MEMS nozzle system applicable to the printhead assembly of the present invention is described in more detail later.

Returning to the assembly of the fluid channel member 40 and printhead tiles 50, each printhead tile 50 is attached to the fluid channel member 40 such that the individual outlet ports 42 and their corresponding inlet ports 54 are aligned to allow effective transfer of fluid therebetween. An adhesive, such as a curable resin (e.g., an epoxy resin), is used for attaching the printhead tiles 50 to the fluid channel member 40 with the upper surface of the fluid channel member 40 being prepared in the manner shown in FIG. 7.

That is, a curable resin is provided around each of the outlet ports 42 to form a gasket member 60 upon curing. This gasket member 60 provides an adhesive seal between the fluid channel member 40 and printhead tile 50 whilst also providing a seal around each of the communicating outlet ports 42 and inlet ports 54. This sealing arrangement facilitates the flow and containment of fluid between the ports. Further, two curable resin deposits 61 are provided on either side of the gasket member 60 in a symmetrical manner.

The symmetrically placed deposits 61 act as locators for positioning the printhead tiles 50 on the fluid channel member 40 and for preventing twisting of the printhead tiles 50 in relation to the fluid channel member 40. In order to provide additional bonding strength, particularly prior to and during curing of the gasket members 60 and locators 61, adhesive drops 62 are provided in free areas of the upper surface of the fluid channel member 40. A fast acting adhesive, such as cyanoacrylate or the like, is deposited to form the locators 61 and prevents any movement of the printhead tiles 50 with respect to the fluid channel member 40 during curing of the curable resin.

With this arrangement, if a printhead tile is to be replaced, should one or a number of nozzles of the associated printhead integrated circuit fail, the individual printhead tiles may easily be removed. Thus, the surfaces of the fluid channel member and the printhead tiles are treated in a manner to ensure that the epoxy remains attached to the printhead tile, and not the fluid channel member surface, if a printhead tile is removed from the surface of the fluid channel member by levering. Consequently, a clean surface is left behind by the removed printhead tile, so that new epoxy can readily be provided on the fluid channel member surface for secure placement of a new printhead tile.

The above-described printhead module of the present invention is capable of being constructed in various lengths, accommodating varying numbers of printhead tiles attached to the fluid channel member, depending upon the specific application for which the printhead assembly is to be employed. For example, in order to provide a printhead assembly for A3-sized pagewidth printing in landscape orientation, the printhead assembly may require 16 individual printhead tiles. This may be achieved by providing, for example, four printhead modules each having four printhead tiles, or two printhead modules each having eight printhead tiles, or one printhead module having 16 printhead tiles (as in FIGS. 1 and 2) or any other suitable combination. Basically, a selected number of standard printhead modules may be combined in order to achieve the necessary width required for a specific printing application.

Figure 8:
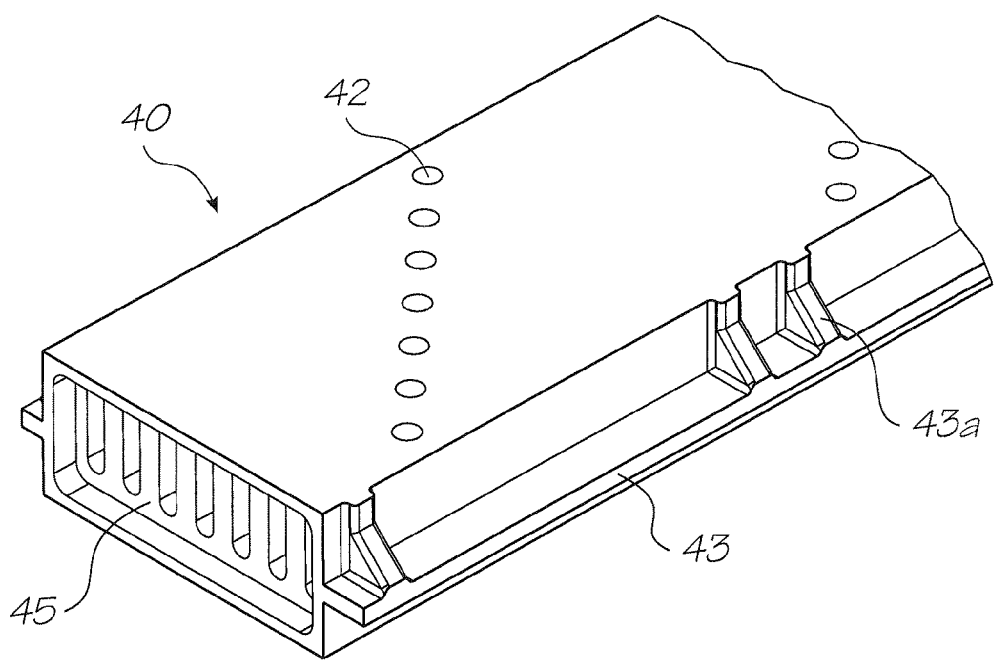
FIG. 8 illustrates a "female" end portion of the printhead module of FIG. 4A.
Figure 9:
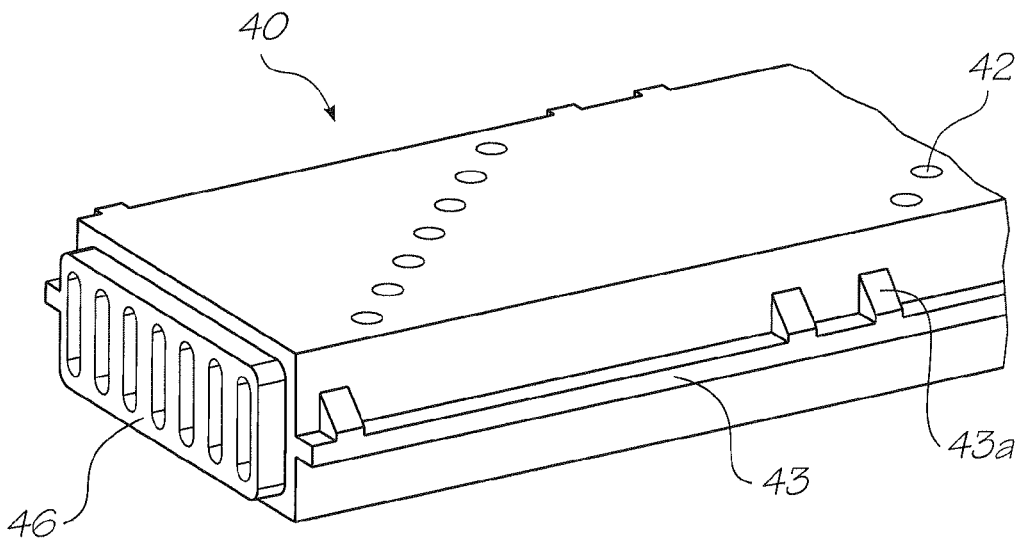
FIG. 9 illustrates a "male" end portion of the printhead module of FIG. 4A.

In order to provide this modularity in an easy and efficient manner, plural fluid channel members of each of the printhead modules are formed so as to be modular and are configured to permit the connection of a number of fluid channel members in an end-to-end manner. Advantageously, an easy and convenient means of connection can be provided by configuring each of the fluid channel members to have complementary end portions. In one embodiment of the present invention each fluid channel member 40 has a "female" end portion 45, as shown in FIG. 8, and a complementary "male" end portion 46, as shown in FIG. 9.

The end portions 45 and 46 are configured so that on bringing the male end portion 46 of one printhead module 30 into contact with the female end portion 45 of a second printhead module 30, the two printhead modules 30 are connected with the corresponding ducts 41 thereof in fluid communication. This allows fluid to flow between the connected printhead modules 30 without interruption, so that fluid such as ink, is correctly and effectively delivered to the printhead integrated circuits 51 of each of the printhead modules 30.

In order to ensure that the mating of the female and male end portions 45 and 46 provides an effective seal between the individual printhead modules 30 a sealing adhesive, such as epoxy, is applied between the mated end portions.

It is clear that, by providing such a configuration, any number of printhead modules can suitably be connected in such an end-to-end fashion to provide the desired scale-up of the total printhead length. Those skilled in the art can appreciate that other configurations and methods for connecting the printhead assembly modules together so as to be in fluid communication are within the scope of the present invention.

Figure 10:
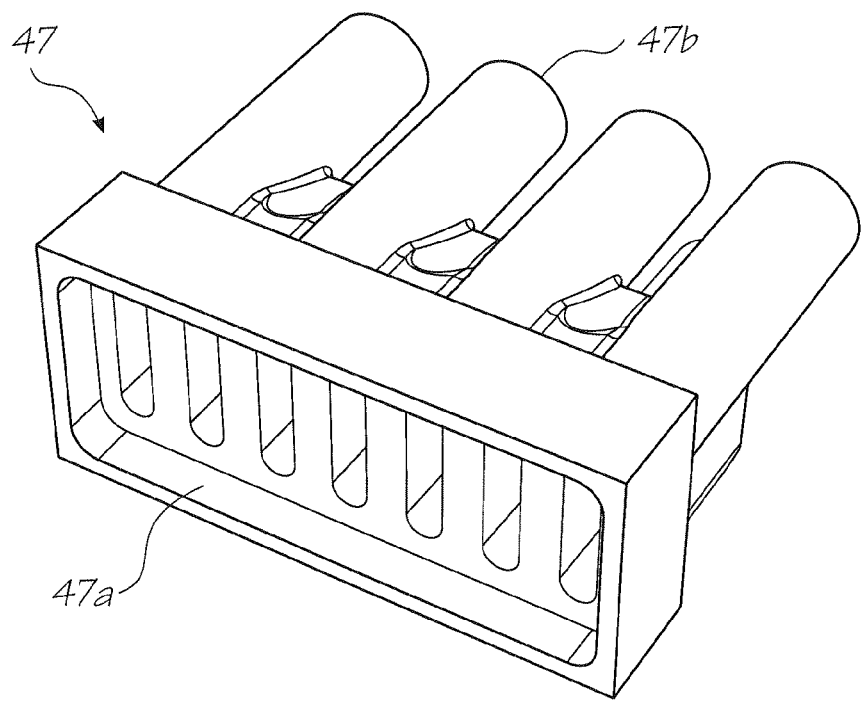
FIG. 10 illustrates a fluid delivery connector for the male end portion of FIG. 9.
Figure 11:
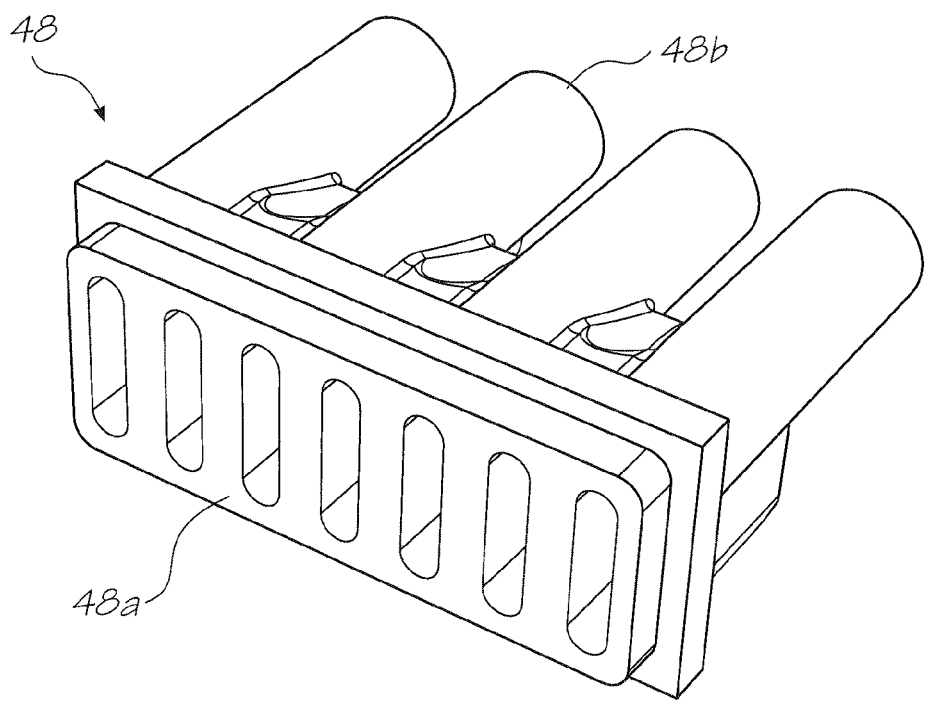
FIG. 11 illustrates a fluid delivery connector for the female end portion of FIG. 8.
Figure 12:
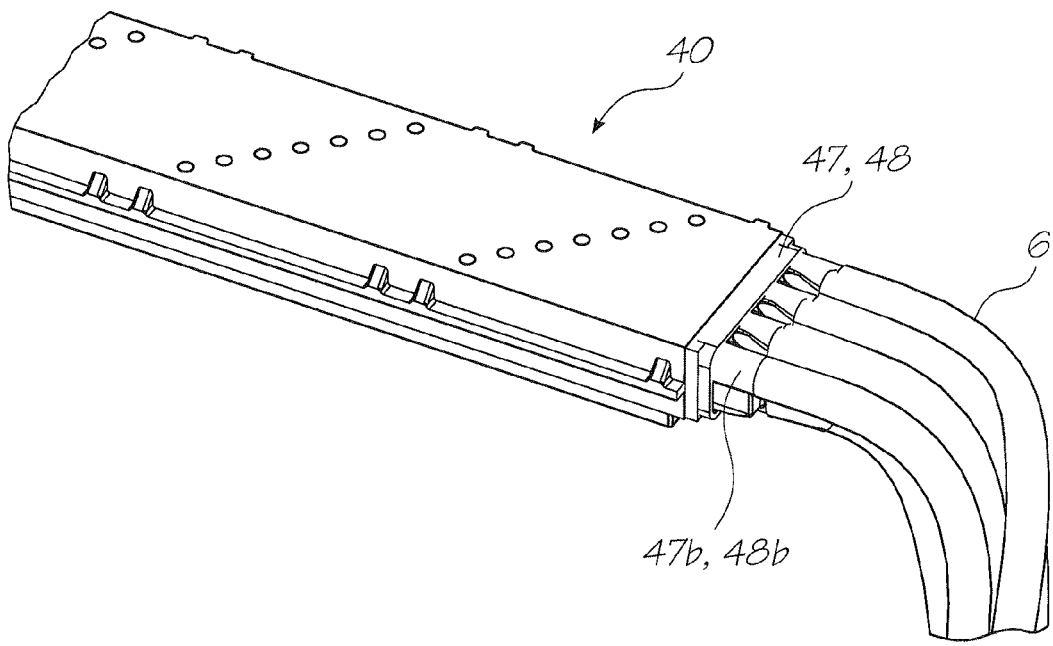
FIG. 12 illustrates the fluid delivery connector of FIG. 10 or 11 connected to fluid delivery tubes.
Figure 13:
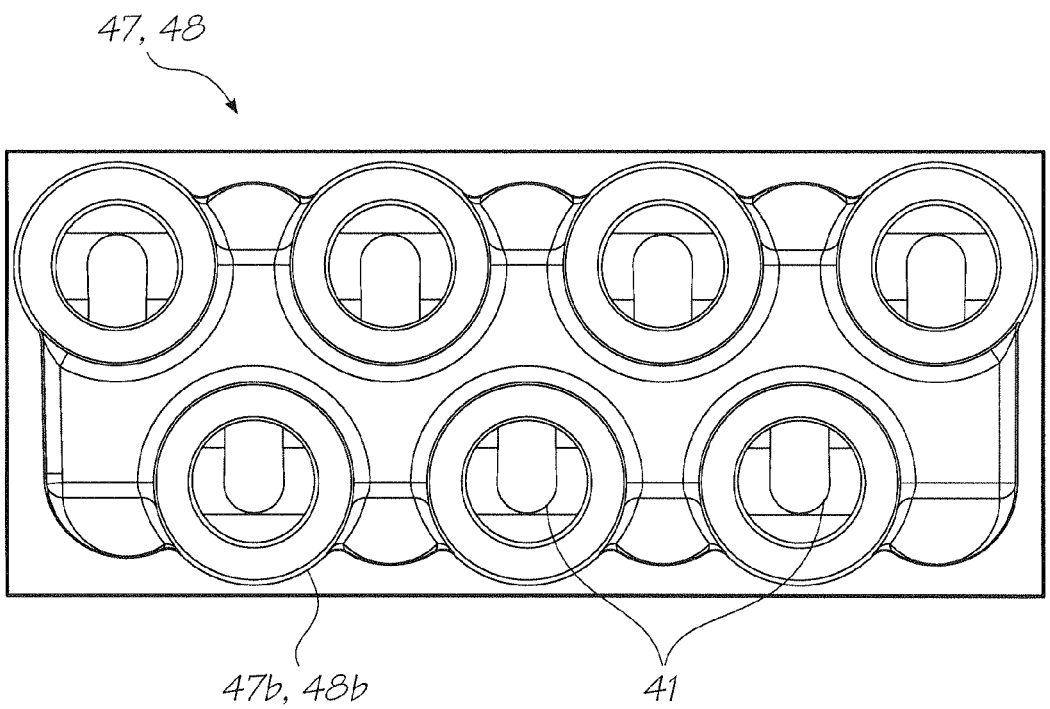
FIG. 13 illustrates a tubular portion arrangement of the fluid delivery connectors of FIGS. 10 and 11.

Further, this exemplary configuration of the end portions 45 and 46 of the fluid channel member 40 of the printhead modules 30 also enables easy connection to the fluid supply of the printing system to which the printhead assembly is mounted. That is, in one embodiment of the present invention, fluid delivery connectors 47 and 48 are provided, as shown in FIGS. 10 and 11, which act as an interface for fluid flow between the ducts 41 of the printhead modules 30 and (internal) fluid delivery tubes 6, as shown in FIG. 12. The fluid delivery tubes 6 are referred to as being internal since, as described in more detail later, these tubes 6 are housed in the printhead assembly 10 for connection to external fluid delivery tubes of the fluid supply of the printing system. However, such an arrangement is clearly only one of the possible ways in which the inks and other fluids can be supplied to the printhead assembly of the present invention.

As shown in FIG. 10, the fluid delivery connector 47 has a female connecting portion 47a which can mate with the male end portion 46 of the printhead module 30. Alternatively, or additionally, as shown in FIG. 11, the fluid delivery connector 48 has a male connecting portion 48a which can mate with the female end portion 45 of the printhead module 30. Further, the fluid delivery connectors 47 and 48 include tubular portions 47b and 48b, respectively, which can mate with the internal fluid delivery tubes 6. The particular manner in which the tubular portions 47b and 48b are configured so as to be in fluid communication with a corresponding duct 41 is shown in FIG. 12.

As shown in FIGS. 10 to 13, seven tubular portions 47b and 48b are provided to correspond to the seven ducts 41 provided in accordance with the above-described exemplary embodiment of the present invention. Accordingly, seven internal fluid delivery tubes 6 are used each for delivering one of the seven aforementioned fluids of black, cyan, magenta and yellow ink, IR ink, fixative and air. However, as previously stated, those skilled in the art clearly understand that more or less fluids may be used in different applications, and consequently more or less fluid delivery tubes, tubular portions of the fluid delivery connectors and ducts may be provided.

Figure 14A:
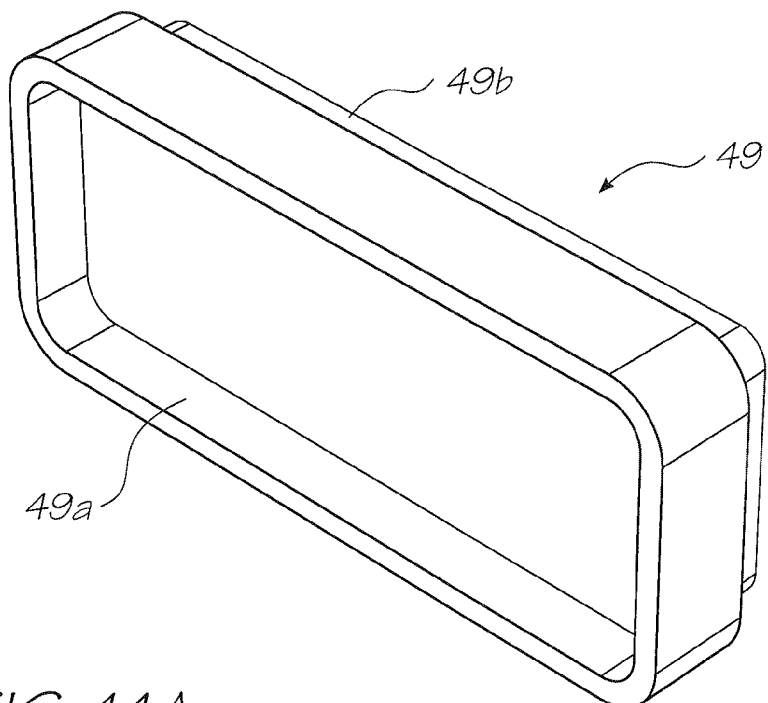
FIG. 14A illustrates a capping member for the female and male end portions of FIGS. 8 and 9.
Figure 14B:
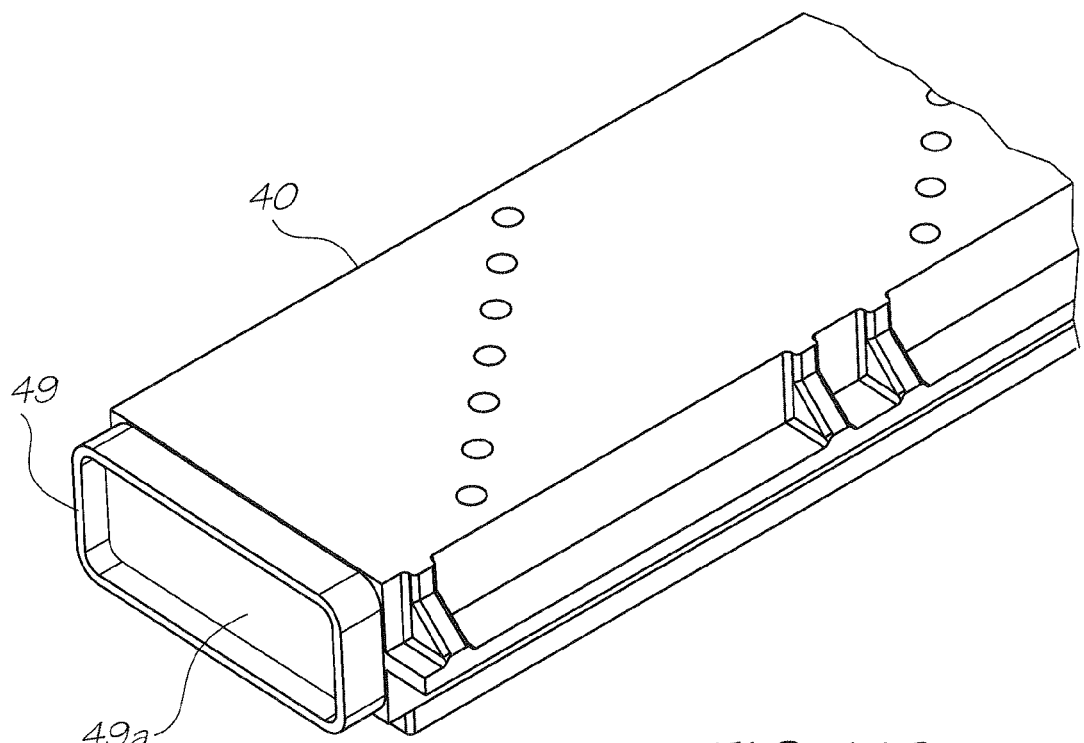
FIG. 14B illustrates the capping member of FIG. 14A applied to the printhead module of FIG. 4A.

Further, this exemplary configuration of the end portions of the fluid channel member 40 of the printhead modules 30 also enables easy sealing of the ducts 41. To this end, in one embodiment of the present invention, a sealing member 49 is provided as shown in FIG. 14A, which can seal or cap both of the end portions of the printhead module 30. That is, the sealing member 49 includes a female connecting section 49a and a male connecting section 49b which can respectively mate with the male end portion 46 and the female end portion 45 of the printhead modules 30. Thus, a single sealing member is advantageously provided despite the differently configured end portions of a printhead module. FIG. 14B illustrates an exemplary arrangement of the sealing member 49 sealing the ducts 41 of the fluid channel member 40. Sealing of the sealing member 49 and the fluid channel member 40 interface is further facilitated by applying a sealing adhesive, such as an epoxy, as described above.

In operation of a single printhead module 30 for an A4-sized pagewidth printing application, for example, a combination of one of the fluid delivery connectors 47 and 48 connected to one corresponding end portion 45 and 46 and a sealing member 49 connected to the other of the corresponding end portions 45 and 46 is used so as to deliver fluid to the printhead integrated circuits 51. On the other hand, in applications where the printhead assembly is particularly long, being comprised of a plurality of printhead modules 30 connected together (e.g., in wide format printing), it may be necessary to provide fluid from both ends of the printhead assembly. Accordingly, one each of the fluid delivery connectors 47 and 48 may be connected to the corresponding end portions 45 and 46 of the end printhead modules 30.

The above-described exemplary configuration of the end portions of the printhead module of the present invention provides, in part, for the modularity of the printhead modules. This modularity makes it possible to manufacture the fluid channel members of the printhead modules in a standard length relating to the minimum length application of the printhead assembly. The printhead assembly length can then be scaled-up by combining a number of printhead modules to form a printhead assembly of a desired length. For example, a standard length printhead module could be manufactured to contain eight printhead tiles, which may be the minimum requirement for A4-sized printing applications. Thus, for a printing application requiring a wider printhead having a length equivalent to 32 printhead tiles, four of these standard length printhead modules could be used. On the other hand, a number of different standard length printhead modules might be manufactured, which can be used in combination for applications requiring variable length printheads.

However, these are merely examples of how the modularity of the printhead assembly of the present invention functions, and other combinations and standard lengths could be employed and fall within the scope of the present invention.

The casing 20 and its associated components will now be described with reference to FIGS. 1 to 3 and 15A to 28.

In one embodiment of the present invention, the casing 20 is formed as a two-piece outer housing which houses the various components of the printhead assembly and provides structure for the printhead assembly which enables the entire unit to be readily mounted in a printing system. As shown in FIG. 3, the outer housing is composed of a support frame 22 and a cover portion 23. Each of these portions 22 and 23 are made from a suitable material which is lightweight and durable, and which can easily be extruded to form various lengths. Accordingly, in one embodiment of the present invention, the portions 22 and 23 are formed from a metal such as aluminium.

Figure 15A:
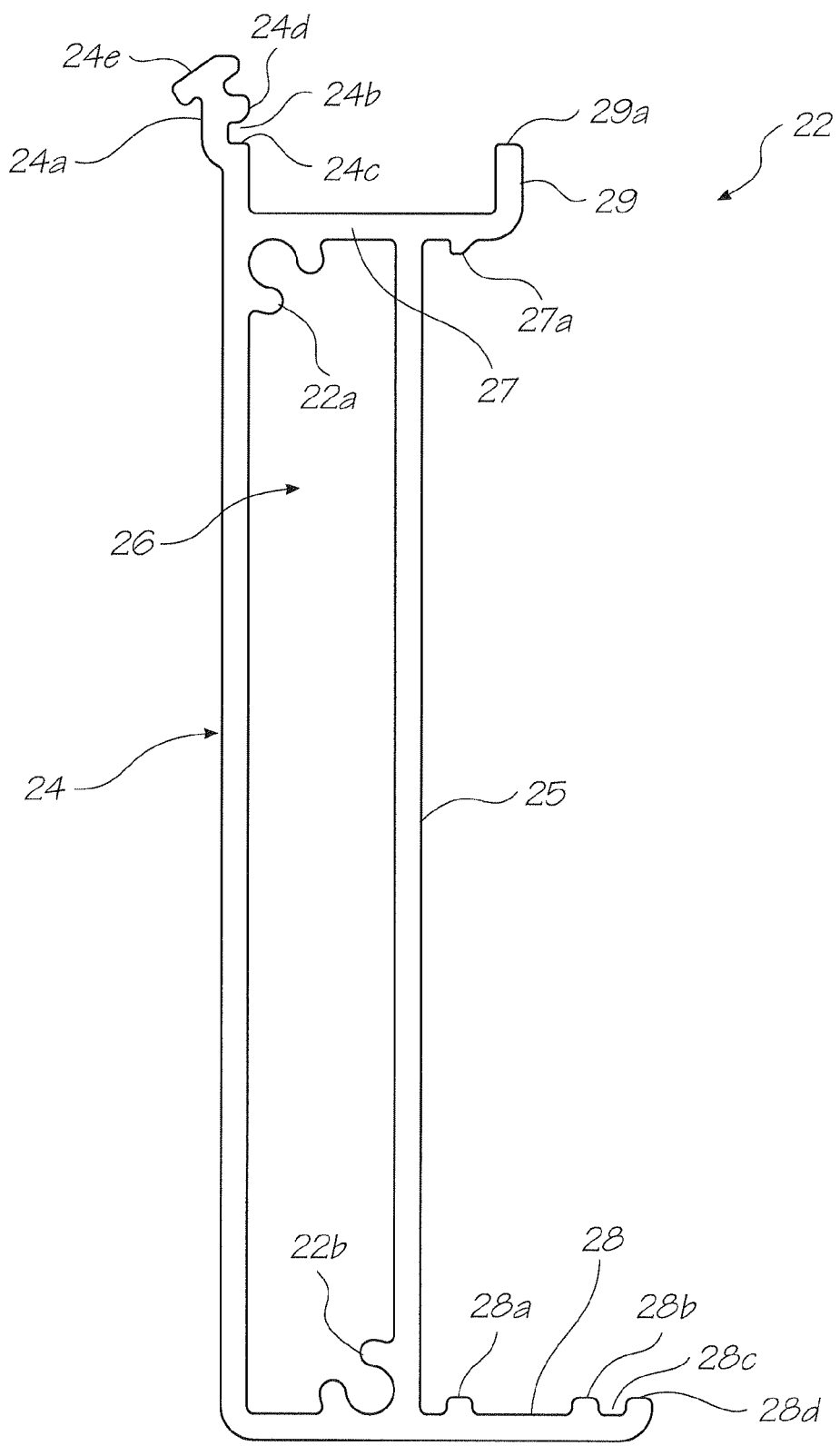
FIG. 15A shows a sectional (skeletal) view of a support frame of a casing of the printhead assembly of FIG. 1.
Figure 15B:
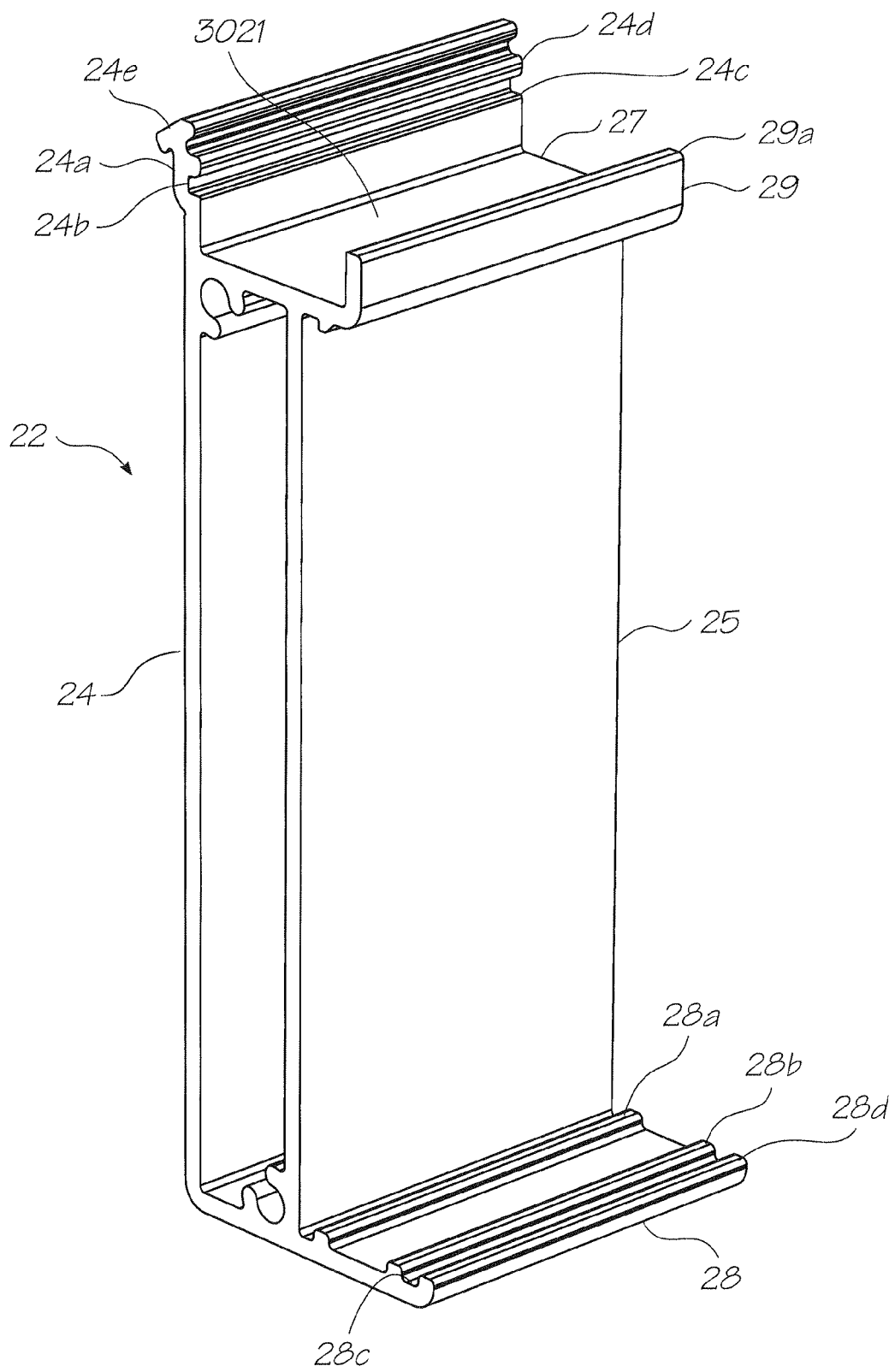
FIGS. 15B and 15C show perspective views of the support frame of FIG. 15A in upward and downward orientations, respectively.
Figure 15C:
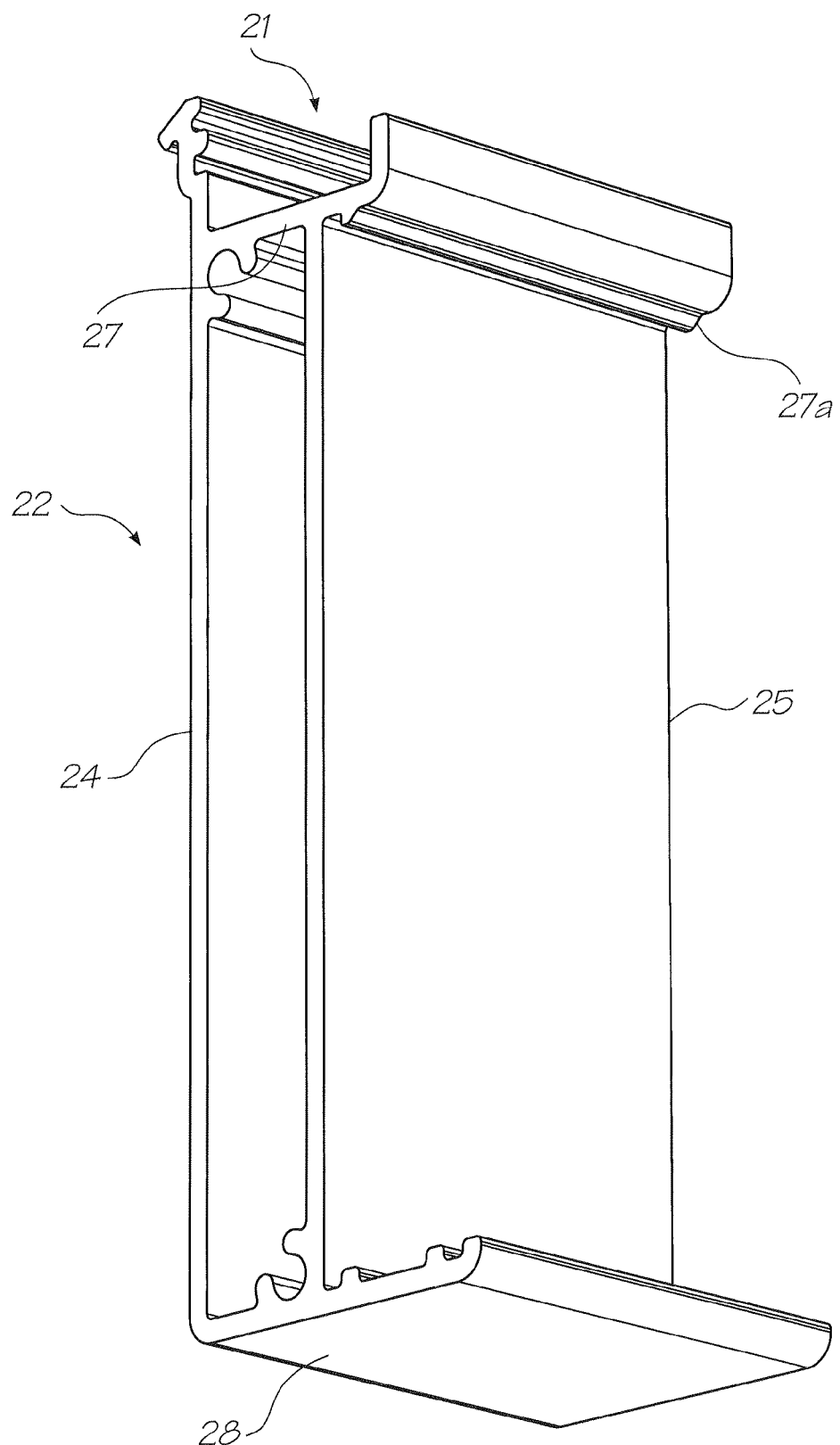

As shown in FIGS. 15A to 15C, the support frame 22 of the casing 20 has an outer frame wall 24 and an inner frame wall 25 (with respect to the outward and inward directions of the printhead assembly 10), with these two walls being separated by an internal cavity 26. The channel 21 (also see FIG. 3) is formed as an extension of an upper wall 27 of the support frame 22 and an arm portion 28 is formed on a lower region of the support frame 22, extending from the inner frame wall 25 in a direction away from the outer frame wall 24. The channel 21 extends along the length of the support frame 22 and is configured to receive the printhead module 30. The printhead module 30 is received in the channel 21 with the printhead integrated circuits 51 facing in an upward direction, as shown in FIGS. 1 to 3, and this upper printhead integrated circuit surface defines the printing surface of the printhead assembly 10.

As depicted in FIG. 15A, the channel 21 is formed by the upper wall 27 and two, generally parallel side walls 24a and 29 of the support frame 22, which are arranged as outer and inner side walls (with respect to the outward and inward directions of the printhead assembly 10) extending along the length of the support frame 22. The two side walls 24a and 29 have different heights with the taller, outer side wall 24a being defined as the upper portion of the outer frame wall 24 which extends above the upper wall 27 of the support frame 22, and the shorter, inner side wall 29 being provided as an upward extension of the upper wall 27 substantially parallel to the inner frame wall 25. The outer side wall 24a includes a recess (groove) 24b formed along the length thereof. A bottom surface 24c of the recess 24b is positioned so as to be at the same height as a top surface 29a of the inner side wall 29 with respect to the upper wall 27 of the channel 21. The recess 24b further has an upper surface 24d which is formed as a ridge which runs along the length of the outer side wall 24a (see FIG. 15B).

In this arrangement, one of the longitudinally extending tabs 43 of the fluid channel member 40 of the printhead module 30 is received within the recess 24b of the outer side wall 24a so as to be held between the lower and upper surfaces 24c and 24d thereof. Further, the other longitudinally extending tab 43 provided on the opposite side of the fluid channel member 40, is positioned on the top surface 29a of the inner side wall 29. In this manner, the assembled printhead module 30 may be secured in place on the casing 20, as will be described in more detail later.

Further, the outer side wall 24a also includes a slanted portion 24e along the top margin thereof, the slanted portion 24e being provided for fixing a print media guide 5 to the printhead assembly 10, as shown in FIG. 3. This print media guide is fixed following assembly of the printhead assembly and is configured to assist in guiding print media, such as paper, across the printhead integrated circuits for printing without making direct contact with the nozzles of the printhead integrated circuits.

As shown in FIG. 15A, the upper wall 27 of the support frame 22 and the arm portion 28 include lugs 27a and 28a, respectively, which extend along the length of the support frame 22 (see FIGS. 15B and 15C). The lugs 27a and 28a are positioned substantially to oppose each other with respect to the inner frame wall 25 of the support frame 22 and are used to secure a PCB support 91 (described below) to the support frame 22.

FIGS. 15B and 15C illustrate the manner in which the outer and inner frame walls 24 and 25 extend for the length of the casing 20, as do the channel 21, the upper wall 27, and its lug 27a, the outer and inner side walls 24a and 29, the recess 24b and its bottom and upper surfaces 24c and 24d, the slanted portion 24e, the top surface 29a of the inner side wall 29, and the arm portion 28, and its lugs 28a and 28b and recessed and curved end portions 28c and 28d (described in more detail later).

The PCB support 91 will now be described with reference to FIGS. 3 and 16 to 22E. In FIG. 3, the support 91 is shown in its secured position extending along the inner frame wall 25 of the support frame 22 from the upper wall 27 to the arm portion 28. The support 91 is used to carry the PCB 90 which mounts the drive electronics 100 (as described in more detail later).

Figure 17A:
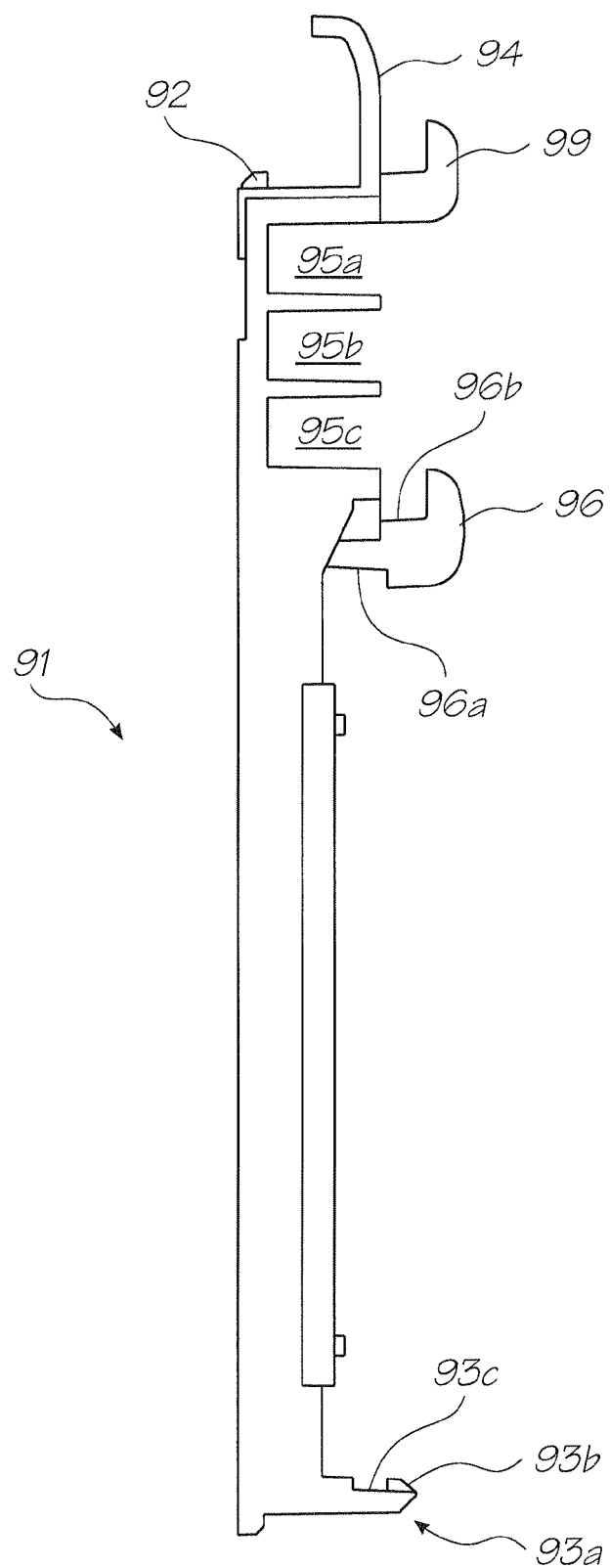
FIGS. 17A and 17B show side and rear perspective views of the PCB support of FIG. 16.
Figure 17B:
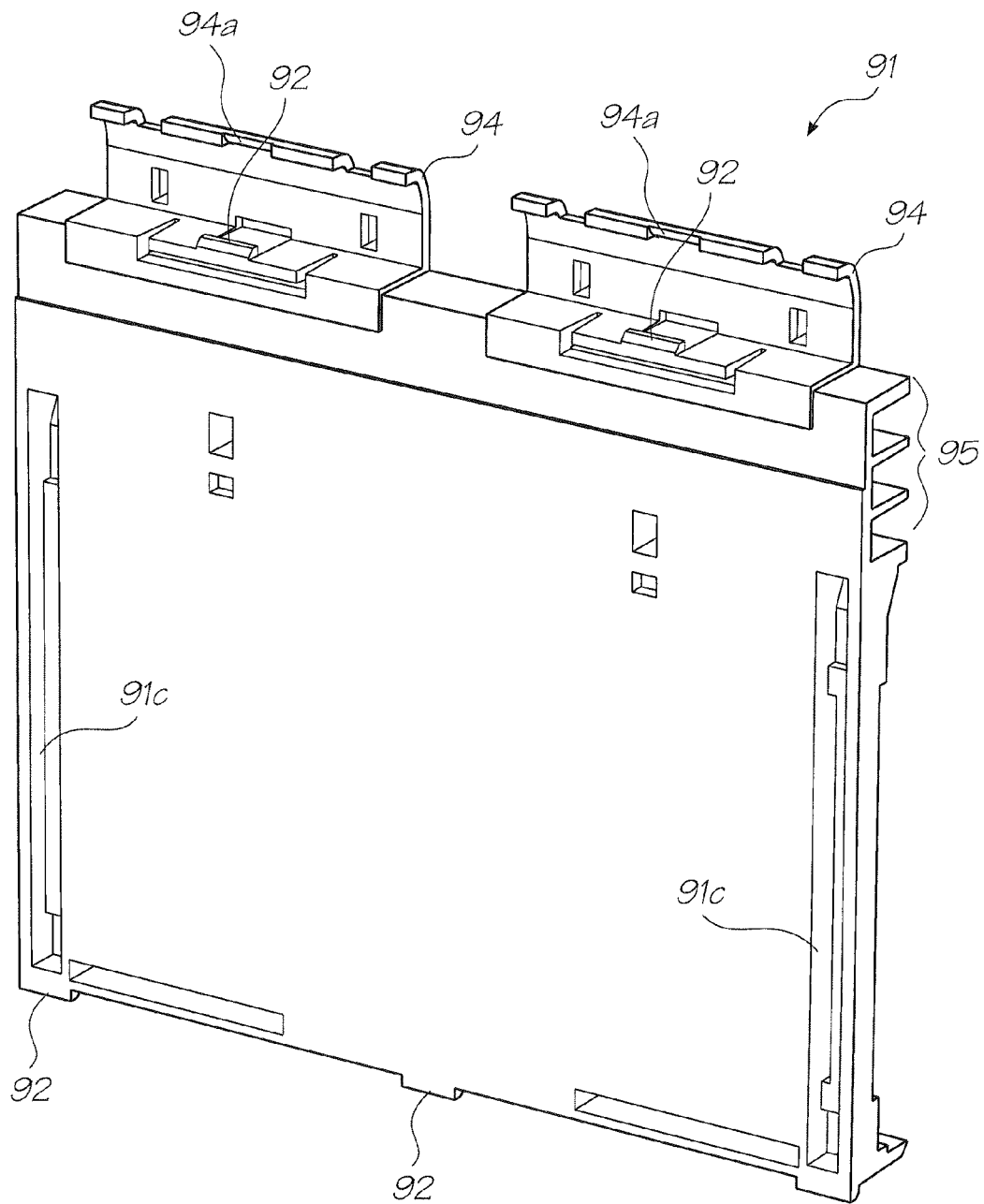

As can be seen particularly in FIGS. 17A and 17B, the support 91 includes lugs 92 on upper and lower surfaces thereof which communicate with the lugs 27a and 28a for securing the support 91 against the inner frame wall 25 of the support frame 22. A base portion 93 of the support 91, is arranged to extend along the arm portion 28 of the support frame 22, and is seated on the top surfaces of the lugs 28a and 28b of the arm portion 28 (see FIG. 15B) when mounted on the support frame 22.

The support 91 is formed so as to locate within the casing 20 and against the inner frame wall 25 of the support frame 22. This can be achieved by moulding the support 91 from a plastics material having inherent resilient properties to engage with the inner frame wall 25. This also provides the support 91 with the necessary insulating properties for carrying the PCB 90. For example, polybutylene terephthalate (PBT) or polycarbonate may be used for the support 91.

The base portion 93 further includes recessed portions 93a and corresponding locating lugs 93b, which are used to secure the PCB 90 to the support 91 (as described in more detail later). Further, the upper portion of the support 91 includes upwardly extending arm portions 94, which are arranged and shaped so as to fit over the inner side wall 29 of the channel 21 and the longitudinally extending tab 43 of the printhead module 30 (which is positioned on the top surface 29a of the inner side wall 29) once the fluid channel member 40 of the printhead module 30 has been inserted into the channel 21. This arrangement provides for securement of the printhead module 30 within the channel 21 of the casing 20, as is shown more clearly in FIG. 3.

In one embodiment of the present invention, the extending arm portions 94 of the support 91 are configured so as to perform a "clipping" or "clamping" action over and along one edge of the printhead module 30, which aids in preventing the printhead module 30 from being dislodged or displaced from the fully assembled printhead assembly 10. This is because the clipping action acts upon the fluid channel member 40 of the printhead module 30 in a manner which substantially constrains the printhead module 30 from moving upwards from the printhead assembly 10 (i.e., in the z-axis direction as depicted in FIG. 3) due to both longitudinally extending tabs 43 of the fluid channel member 40 being held firmly in place (in a manner which will be described in more detail below), and from moving across the longitudinal direction of the printhead module 30 (i.e., in the y-axis direction as depicted in FIG. 3), which will be also described in more detail below.

In this regard, the fluid channel member 40 of the printhead module 30 is exposed to a force exerted by the support 91 directed along the y-axis in a direction from the inner side wall 29 to the outer side wall 24a. This force causes the longitudinally extending tab 43 of the fluid channel member 40 on the outer side wall 24a side of the support frame 22 to be held between the lower and upper surfaces 24c and 24d of the recess 24b. This force, in combination with the other longitudinally extending tab 43 of the fluid channel member 40 being held between the top surface 29a of the inner side wall 29 and the extending arm portions 94 of the support 91, acts to inhibit movement of the printhead module 30 in the z-axis direction (as described in more detail later).

However, the printhead module 30 is still able to accommodate movement in the x-axis direction (i.e., along the longitudinal direction of the printhead module 30), which is desirable in the event that the casing 20 undergoes thermal expansion and contraction, during operation of the printing system. As the casing is typically made from an extruded metal, such as aluminium, it may undergo dimensional changes due to such materials being susceptible to thermal expansion and contraction in a thermally variable environment, such as is present in a printing unit.

That is, in order to ensure the integrity and reliability of the printhead assembly, the fluid channel member 40 of the printhead module 30 is firstly formed of material (such as LCP or the like) which will not experience substantial dimensional changes due to environmental changes thereby retaining the positional relationship between the individual printhead tiles, and the printhead module 30 is arranged to be substantially independent positionally with respect to the casing 20 (i.e., the printhead module "floats" in the longitudinal direction of the channel 21 of the casing 20) in which the printhead module 30 is removably mounted.

Therefore, as the printhead module is not constrained in the x-axis direction, any thermal expansion forces from the casing in this direction will not be transferred to the printhead module. Further, as the constraint in the z-axis and y-axis directions is resilient, there is some tolerance for movement in these directions. Consequently, the delicate printhead integrated circuits of the printhead modules are protected from these forces and the reliability of the printhead assembly is maintained.

Furthermore, the clipping arrangement also allows for easy assembly and disassembly of the printhead assembly by the mere "unclipping" of the PCB support(s) from the casing. In the exemplary embodiment shown in FIG. 16, a pair of extending arm portions 94 is provided; however those skilled in the art will understand that a greater or lesser number is within the scope of the present invention.

Referring again to FIGS. 16 to 17B, the support 91 further includes a channel portion 95 in the upper portion thereof. In the exemplary embodiment illustrated, the channel portion 95 includes three channeled recesses 95a, 95b and 95c. The channeled recesses 95a, 95b and 95c are provided so as to accommodate three longitudinally extending electrical conductors or busbars 71, 72 and 73 (see FIG. 2) which form the power supply 70 (see FIG. 3) and which extend along the length of the printhead assembly 10. The busbars 71, 72 and 73 are conductors which carry the power required to operate the printhead integrated circuits 51 and the drive electronics 100 located on the PCB 90 (shown in FIG. 18A and described in more detail later), and may be formed of copper with gold plating, for example.

In one embodiment of the present invention, three busbars are used in order to provide for voltages of Vcc (e.g., via the busbar 71), ground (Gnd) (e.g., via the busbar 72) and V+ (e.g., via the busbar 73). Specifically, the voltages of Vcc and Gnd are applied to the drive electronics 100 and associated circuitry of the PCB 90, and the voltages of Vcc, Gnd and V+ are applied to the printhead integrated circuits 51 of the printhead tiles 50. It will be understood by those skilled in the art that a greater or lesser number of busbars, and therefore channeled recesses in the PCB support can be used depending on the power requirements of the specific printing applications.

The support 91 of the present invention further includes (lower) retaining clips 96 positioned below the channel portion 95. In the exemplary embodiment illustrated in FIG. 16, a pair of the retaining clips 96 is provided. The retaining clips 96 include a notch portion 96a on a bottom surface thereof which serves to assist in securely mounting the PCB 90 on the support 91. To this end, as shown in the exemplary embodiment of FIG. 18A, the PCB 90 includes a pair of slots 97 in a topmost side thereof (with respect to the mounting direction of the PCB 90), which align with the notch portions 96a when mounted so as to facilitate engagement with the retaining clips 96.

As shown in FIG. 3, the PCB 90 is snugly mounted between the notch portions 96a of the retaining clips 96 and the afore-mentioned recessed portions 93a and locating lugs 93b of the base portion 93 of the support 91. This arrangement securely holds the PCB 90 in position so as to enable reliable connection between the drive electronics 100 of the PCB 90 and the printhead integrated circuits 51 of the printhead module 30.

Referring again to FIG. 18A, an exemplary circuit arrangement of the PCB 90 will now be described. The circuitry includes the drive electronics 100 in the form of a print engine controller (PEC) integrated circuit. The PEC integrated circuit 100 is used to drive the printhead integrated circuits 51 of the printhead module 30 in order to print information on the print media passing the printhead assembly 10 when mounted to a printing unit. The functions and structure of the PEC integrated circuit 100 are discussed in more detail later.

The exemplary circuitry of the PCB 90 also includes four connectors 98 in the upper portion thereof (see FIG. 18B) which receive lower connecting portions 81 of the flex PCBs 80 that extend from each of the printhead tiles 50 (see FIG. 6). Specifically, the corresponding ends of four of the flex PCBs 80 are connected between the PCBs 52 of four printhead tiles 50 and the four connectors 98 of the PCB 90. In turn, the connectors 98 are connected to the PEC integrated circuit 100 so that data communication can take place between the PEC integrated circuit 100 and the printhead integrated circuits 51 of the four printhead tiles 50.

In the above-described embodiment, one PEC integrated circuit is chosen to control four printhead tiles in order to satisfy the necessary printing speed requirements of the printhead assembly. In this manner, for a printhead assembly having 16 printhead tiles, as described above with respect to FIGS. 1 and 2, four PEC integrated circuits are required and therefore four PCB supports 91 are used. However, it will be understood by those skilled in the art that the number of PEC integrated circuits used to control a number of printhead tiles may be varied, and as such many different combinations of the number of printhead tiles, PEC integrated circuits, PCBs and PCB supports that may be employed depending on the specific application of the printhead assembly of the present invention. Further, a single PEC integrated circuit 100 could be provided to drive a single printhead integrated circuit 51. Furthermore, more than one PEC integrated circuit 100 may be placed on a PCB 90, such that differently configured PCBs 90 and supports 91 may be used.

It is to be noted that the modular approach of employing a number of PCBs holding separate PEC integrated circuits for controlling separate areas of the printhead advantageously assists in the easy determination, removal and replacement of defective circuitry in the printhead assembly.

The above-mentioned power supply to the circuitry of the PCB 90 and the printhead integrated circuits 51 mounted to the printhead tiles 50 is provided by the flex PCBs 80. Specifically, the flex PCBs 80 are used for the two functions of providing data connection between the PEC integrated circuit(s) 100 and the printhead integrated circuits 51 and providing power connection between the busbars 71, 72 and 73 and the PCB 90 and the printhead integrated circuits 51. In order to provide the necessary electrical connections, the flex PCBs 80 are arranged to extend from the printhead tiles 50 to the PCB 90. This may be achieved by employing the arrangement shown in FIG. 3, in which a resilient pressure plate 74 is provided to urge the flex PCBs 80 against the busbars 71, 72 and 73. In this arrangement, suitably arranged electrical connections are provided on the flex PCBs 80 which route power from the busbars 71 and 72 (i.e., Vcc and Gnd) to the connectors 98 of the PCB 90 and power from all of the busbars 71, 72 and 73 (i.e., Vcc, Gnd and V+) to the PCB 52 of the printhead tiles 50.

The pressure plate 74 is shown in more detail in FIGS. 19A to 21. The pressure plate 74 includes a raised portion (pressure elastomer) 75 which is positioned on a rear surface of the pressure plate 74 (with respect to the mounting direction on the support 91), as shown in FIG. 19B, so as to be aligned with the busbars 71, 72 and 73, with the flex PCBs 80 lying therebetween when the pressure plate 74 is mounted on the support 91. The pressure plate 74 is mounted to the support 91 by engaging holes 74a with corresponding ones of (upper) retaining clips 99 of the support 91 which project from the extending arm portions 94 (see FIG. 15A) and holes 74b with the corresponding ones of the (lower) retaining clips 96, via tab portions 74c thereof (see FIG. 20). The pressure plate 74 is formed so as to have a spring-like resilience which urges the flex PCBs 80 into electrical contact with the busbars 71, 72 and 73 with the raised portion 75 providing insulation between the pressure plate 74 and the flex PCBs 80.

Figure 21:
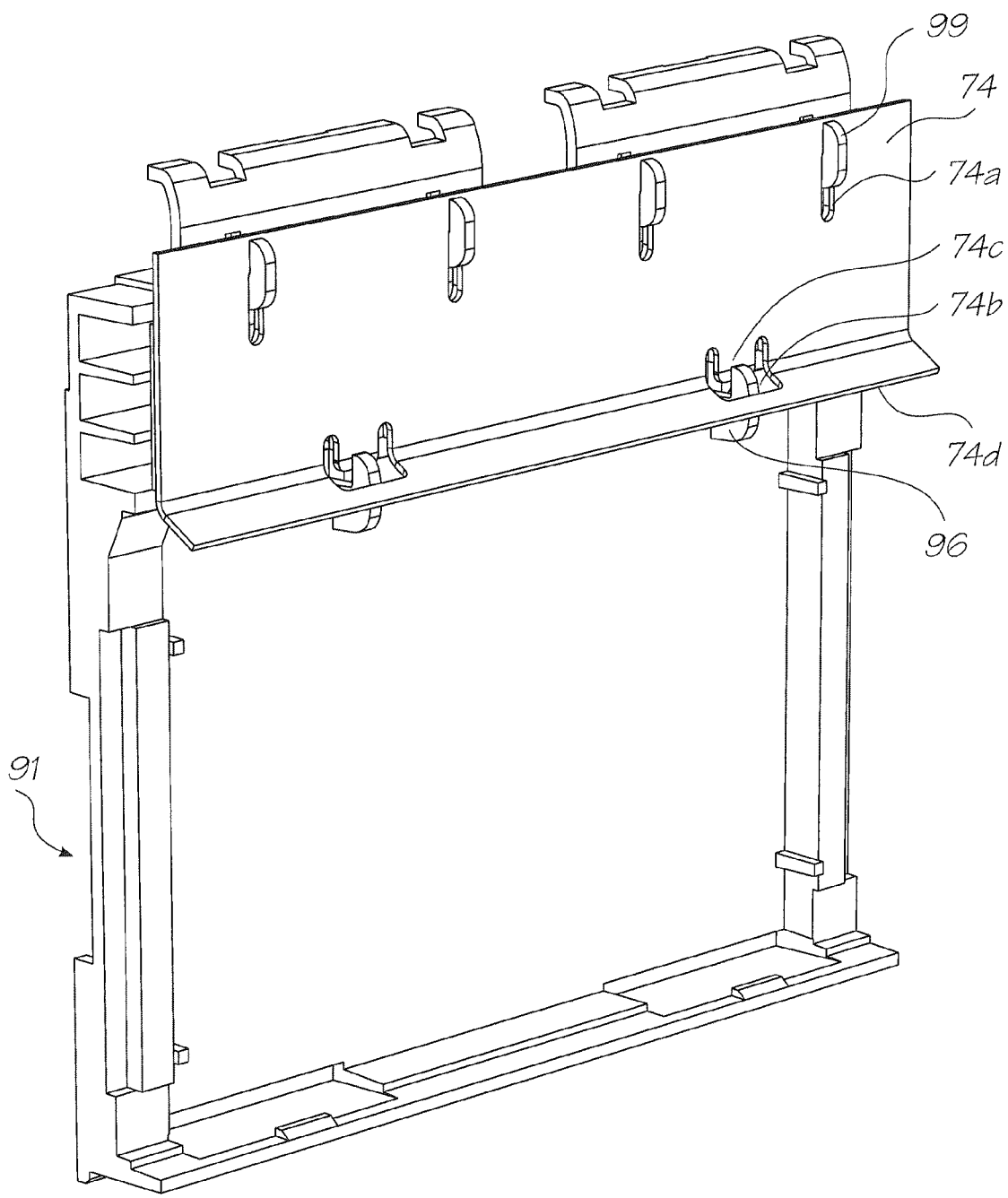
FIG. 21 shows a perspective view illustrating the further components of FIG. 19.

As shown most clearly in FIG. 21, the pressure plate 74 further includes a curved lower portion 74d which serves as a means of assisting the demounting of the pressure plate 74 from the support 91.

The specific manner in which the pressure plate 74 is retained on the support 91 so as to urge the flex PCBs 80 against the busbars 71, 72 and 73, and the manner in which the extending arm portions 94 of the support 91 enable the above-mentioned clipping action will now be fully described with reference to FIGS. 22 and 22A to 22E.

Figure 22:
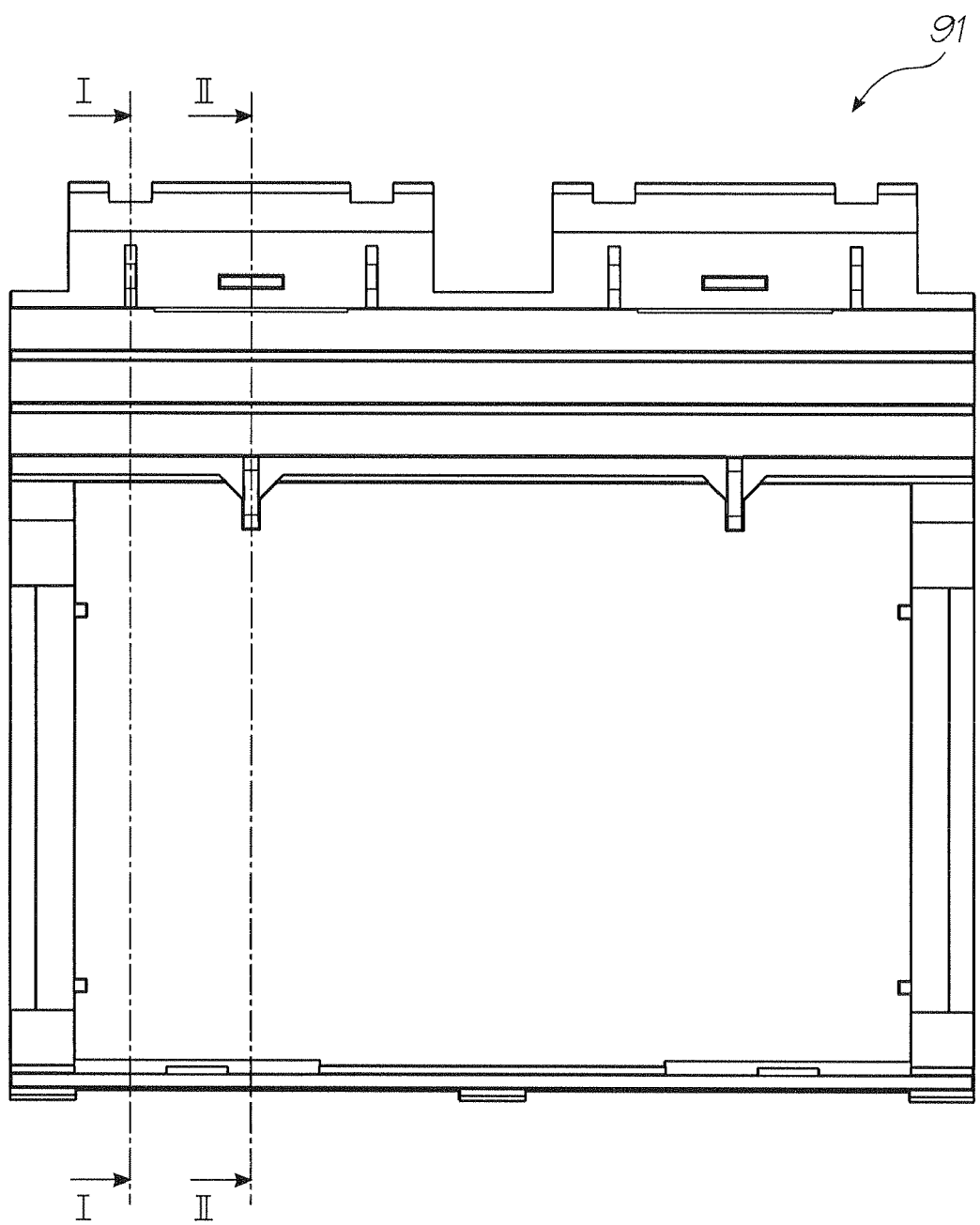
FIG. 22 shows a front view of the PCB support of FIG. 16.
Figures 22A, 22B:
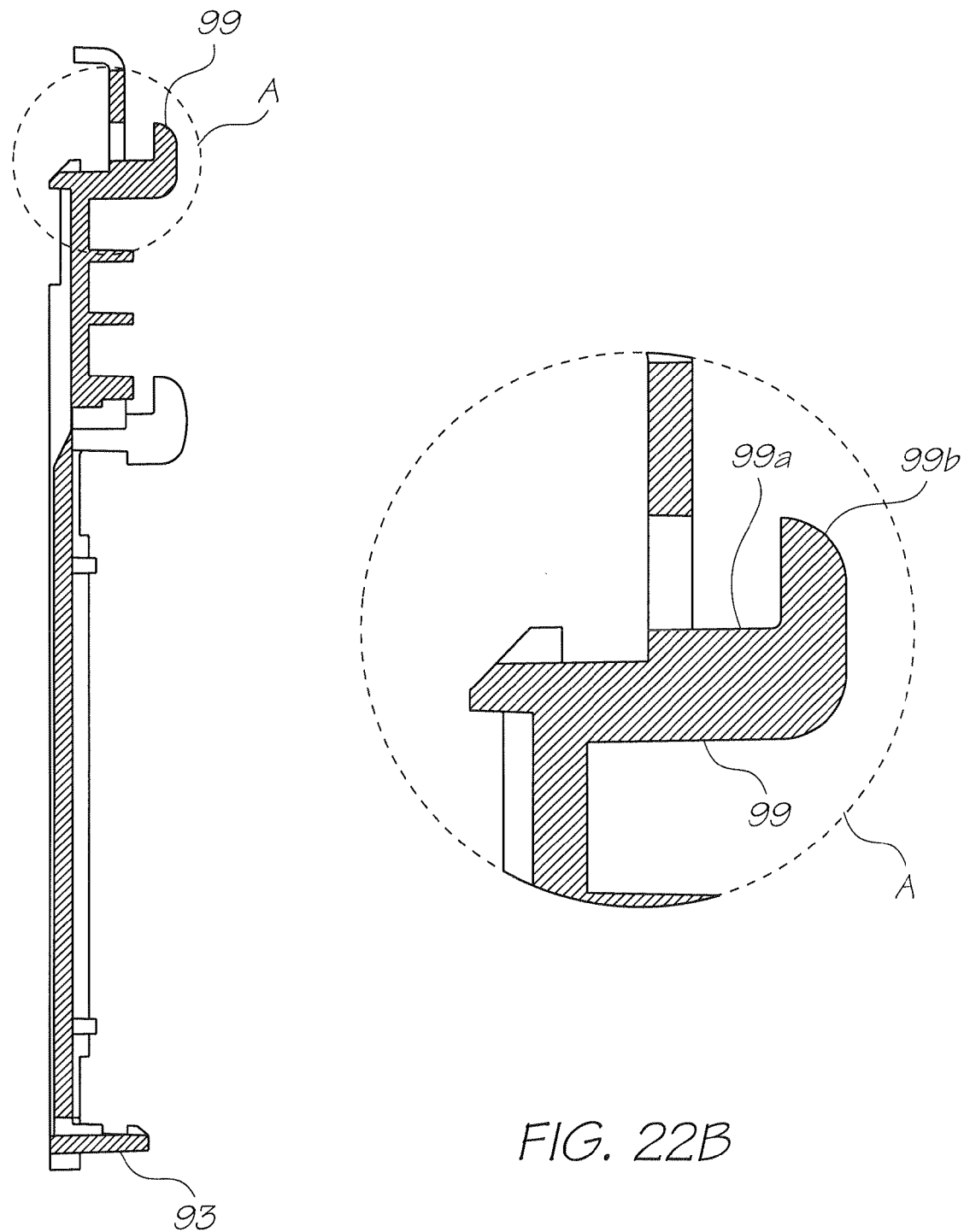
FIG. 22A shows a side sectional view taken along the line I-I in FIG. 22.
FIG. 22B shows an enlarged view of the section A of FIG. 22A.

FIG. 22 illustrates a front schematic view of the support 91 in accordance with a exemplary embodiment of the present invention. FIG. 22A is a side sectional view taken along the line I-I in FIG. 22 with the hatched sections illustrating the components of the support 91 situated on the line I-I.

FIG. 22A particularly shows one of the upper retaining clips 99. An enlarged view of this retaining clip 99 is shown in FIG. 22B. The retaining clip 99 is configured so that an upper surface of one of the holes 74a of the pressure plate 74 can be retained against an upper surface 99a and a retaining portion 99b of the retaining clip 99 (see FIG. 21). Due to the spring-like resilience of the pressure plate 74, the upper surface 99a exerts a slight upwardly and outwardly directed force on the pressure plate 74 when the pressure plate 74 is mounted thereon so as to cause the upper part of the pressure plate 74 to abut against the retaining portion 99b.

Figures 22C, 22D:
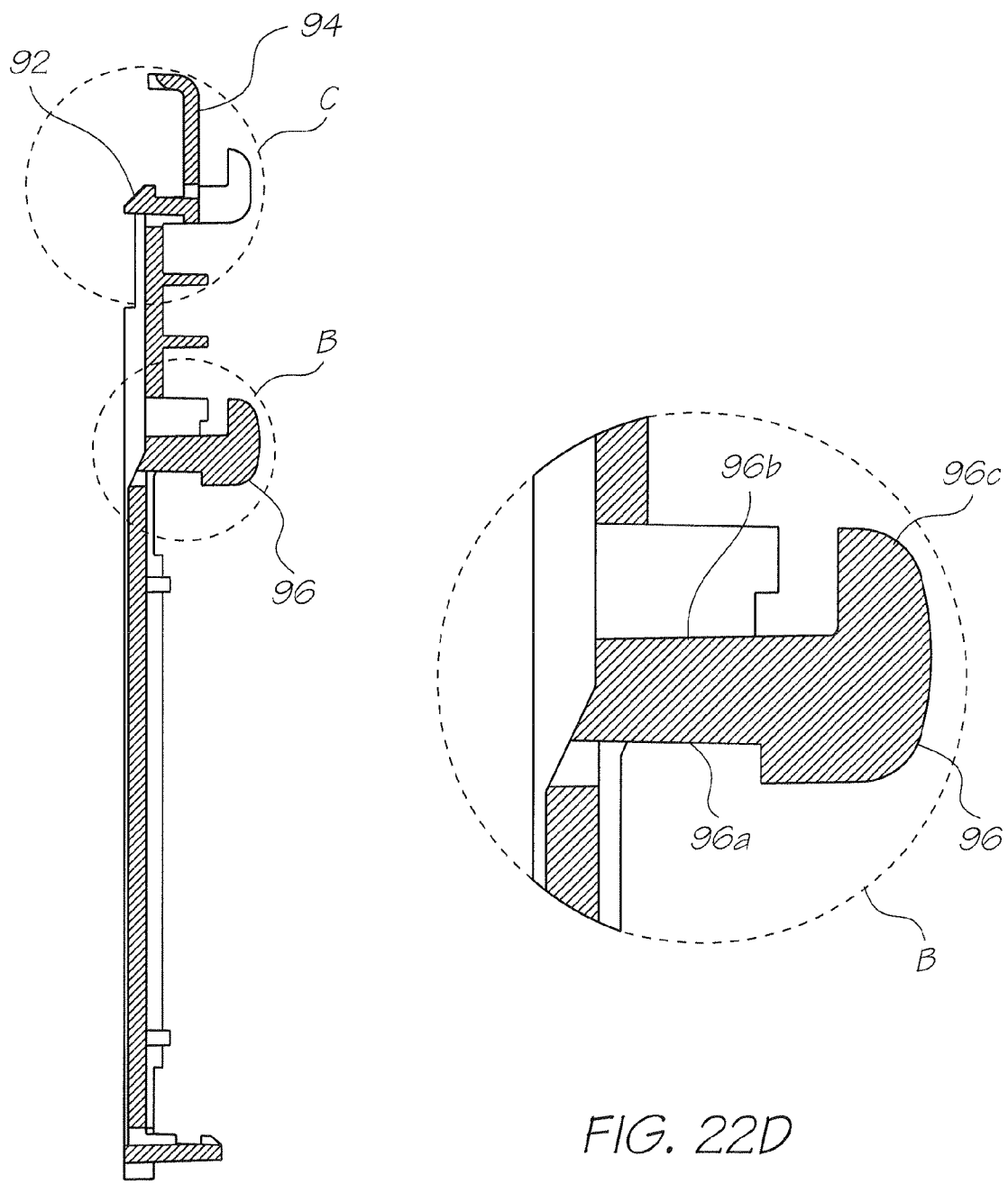
FIG. 22C shows a side sectional view taken along the line II-II in FIG. 22.
FIG. 22D shows an enlarged view of the section B of FIG. 22C.

Referring now to FIG. 22C, which is a side sectional view taken along the line II-II in FIG. 22, one of the lower retaining clips 96 is illustrated. An enlarged view of this retaining clip 96 is shown in FIG. 22D. The retaining clip 96 is configured so that a tab portion 74c of one of the holes 74b of the pressure plate 74 can be retained against an inner surface 96c of the retaining clip 96 (see FIG. 20). Accordingly, due to the above-described slight force exerted by the retaining clip 99 on the upper part of the pressure plate 74 in a direction away from the support 91, the lower part of the pressure plate 74 is loaded towards the opposite direction, e.g., in an inward direction with respect to the support frame 22. Consequently, the pressure plate 74 is urged towards the busbars 71, 72 and 73, which in turn serves to urge the flex PCBs 80 in the same direction via the raised portion 75, so as to effect reliable contact with the busbars 71, 72 and 73.

Figure 22E:
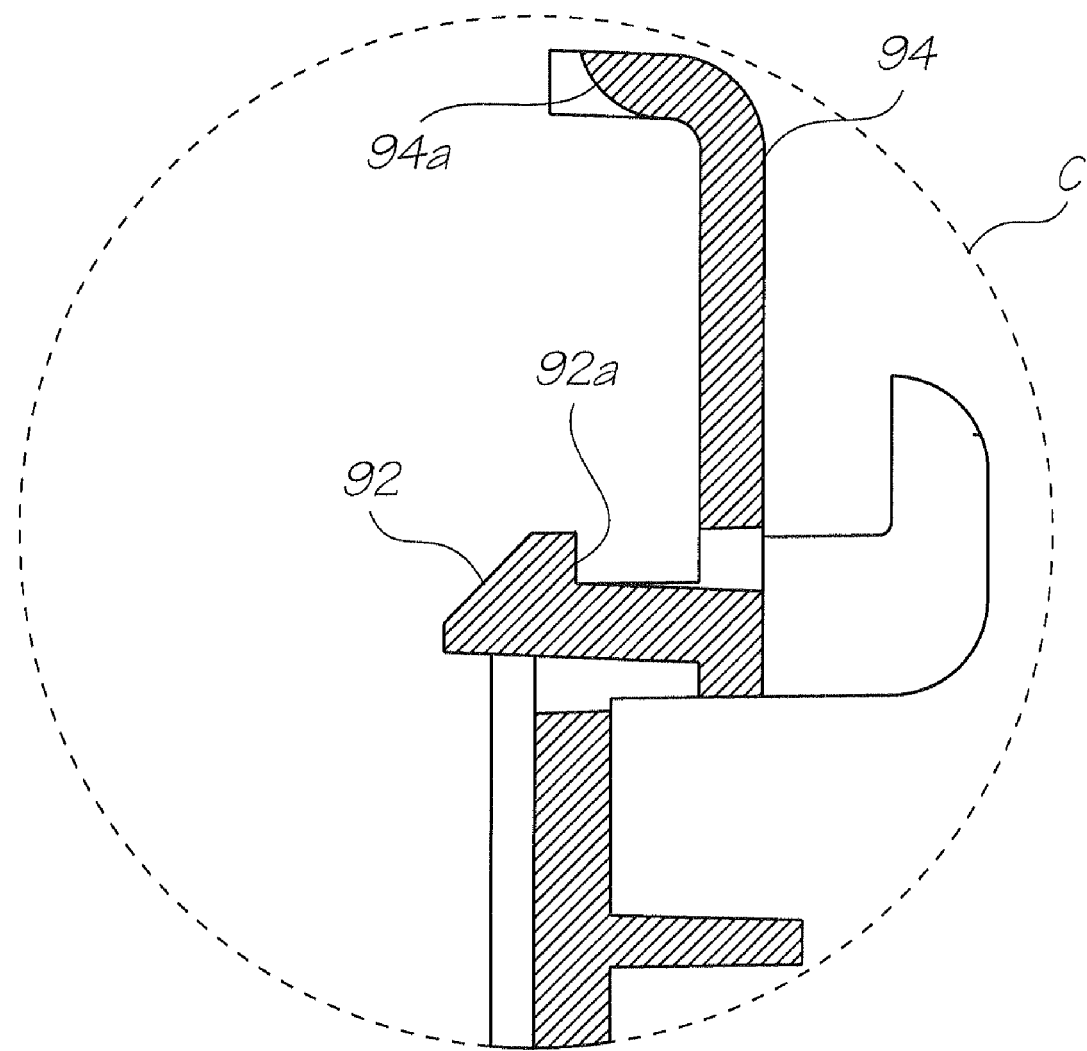
FIG. 22E shows an enlarged view of the section C of FIG. 22C.

Returning to FIG. 22C, in which one of the extending arm portions 94 is illustrated. An enlarged view of this extending arm portion 94 is shown in FIG. 22E. The extending arm portion 94 is configured so as to be substantially L-shaped, with the foot section of the L-shape located so as to fit over the inner side wall 29 of the channel 21 and the longitudinally extending tab 43 of the fluid channel member 40 of the printhead module 30 arranged thereon. As shown in FIG. 22E, the end of the foot section of the L-shape has an arced surface. This surface corresponds to the edge of a recessed portion 94a provided in each the extending arm portions 94, the centre of which is positioned substantially at the line II-II in FIG. 22 (see FIGS. 16 and 17B). The recessed portions 94a are arranged so as to engage with angular lugs 43a regularly spaced along the length of the longitudinally extending tabs 43 of the fluid channel member 40 (FIG. 4A), so as to correspond with the placement of the printhead tiles 50, when the extending arm portions 94 are clipped over the fluid channel member 40.

In this position, the arced edge of the recessed portion 94a is contacted with the angled surface of the angular lugs 43a (see FIG. 4A), with this being the only point of contact of the extending arm portion 94 with the longitudinally extending tab 43. Although not shown in FIG. 4A, the longitudinally extending tab 43 on the other side of the fluid channel member 40 has similarly angled lugs 43a, where the angled surface comes into contact with the upper surface 24d of the recess 24b on the support frame 22.

As alluded to previously, due to this specific arrangement, at these contact points a downwardly and inwardly directed force is exerted on the fluid channel member 40 by the extending arm portion 94. The downwardly directed force assists to constrain the printhead module 30 in the channel 21 in the z-axis direction as described earlier. The inwardly directed force also assists in constraining the printhead module 30 in the channel 21 by urging the angular lugs 43a on the opposing longitudinally extending tab 43 of the fluid channel member 40 into the recess 24b of the support frame 20, where the upper surface 24d of the recess 24b also applies an opposing downwardly and inwardly directed force on the fluid channel member. In this regard the opposing forces act to constrain the range of movement of the fluid channel member 40 in the y-axis direction. It is to be understood that the two angular lugs 43a shown in FIG. 4A for each of the recessed portions 94a are merely an exemplary arrangement of the angular lugs 43a.

Figure 18B:
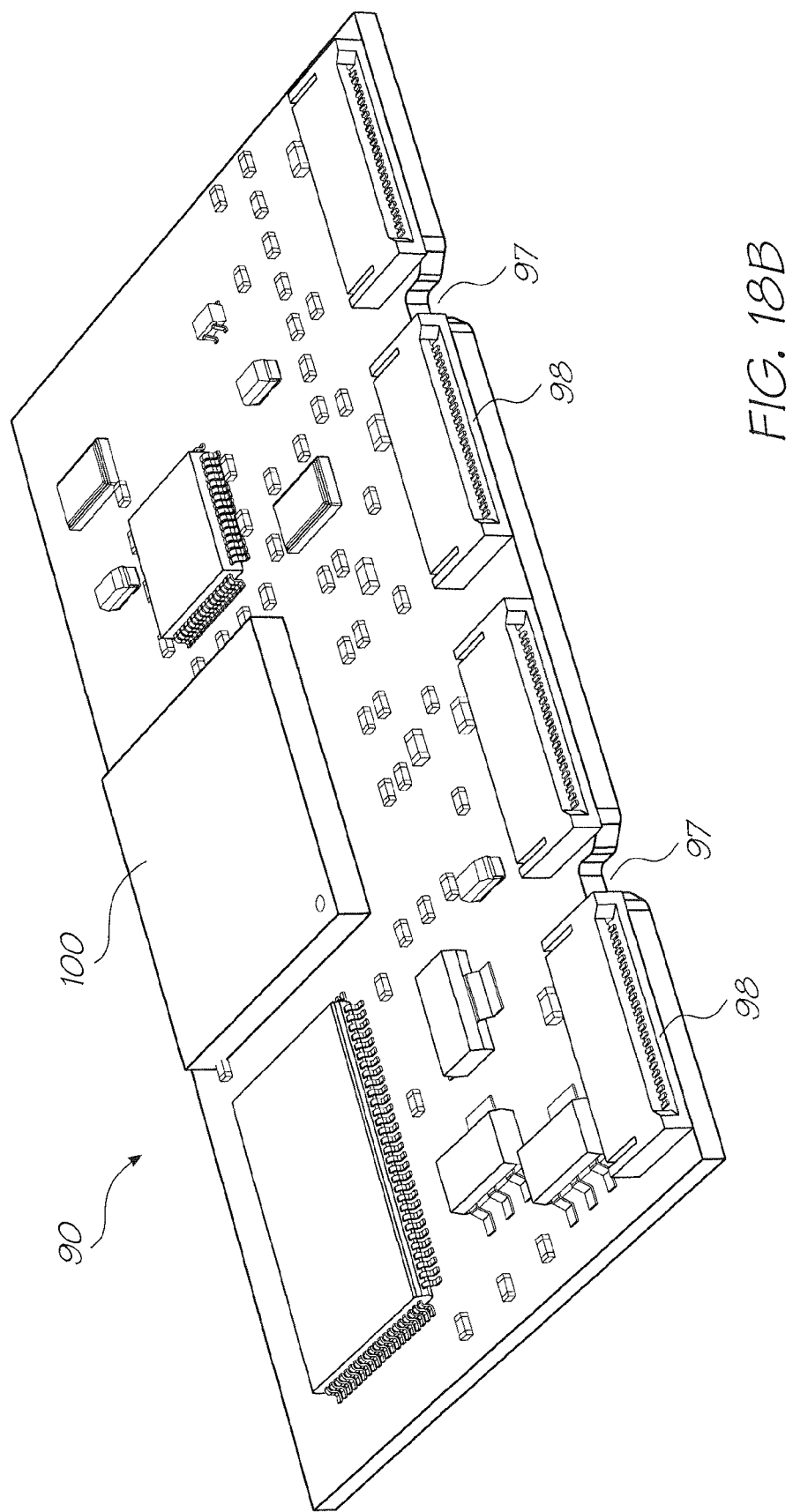
FIG. 18B shows an opposite side perspective view of the PCB and the circuit components of FIG. 18A.
Figure 19A:
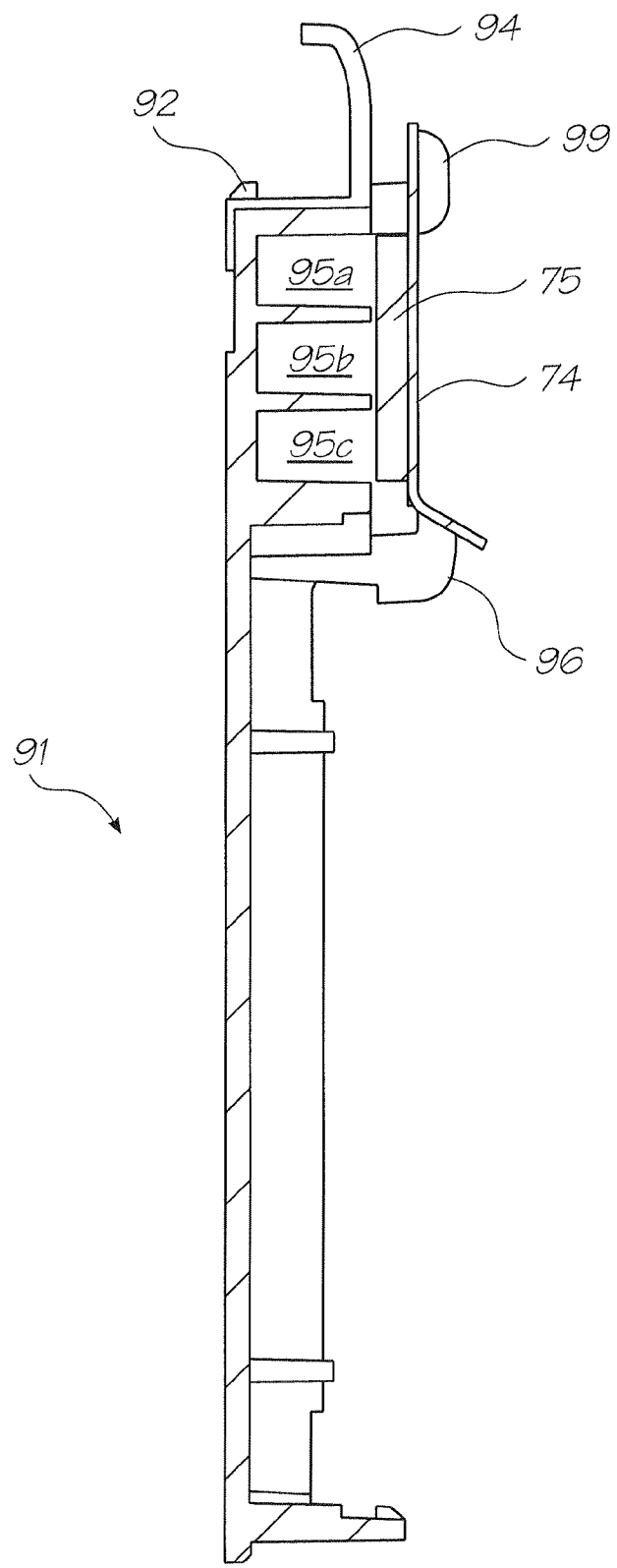
FIG. 19A shows a side view illustrating further components attached to the PCB support of FIG. 16.
Figure 19B:
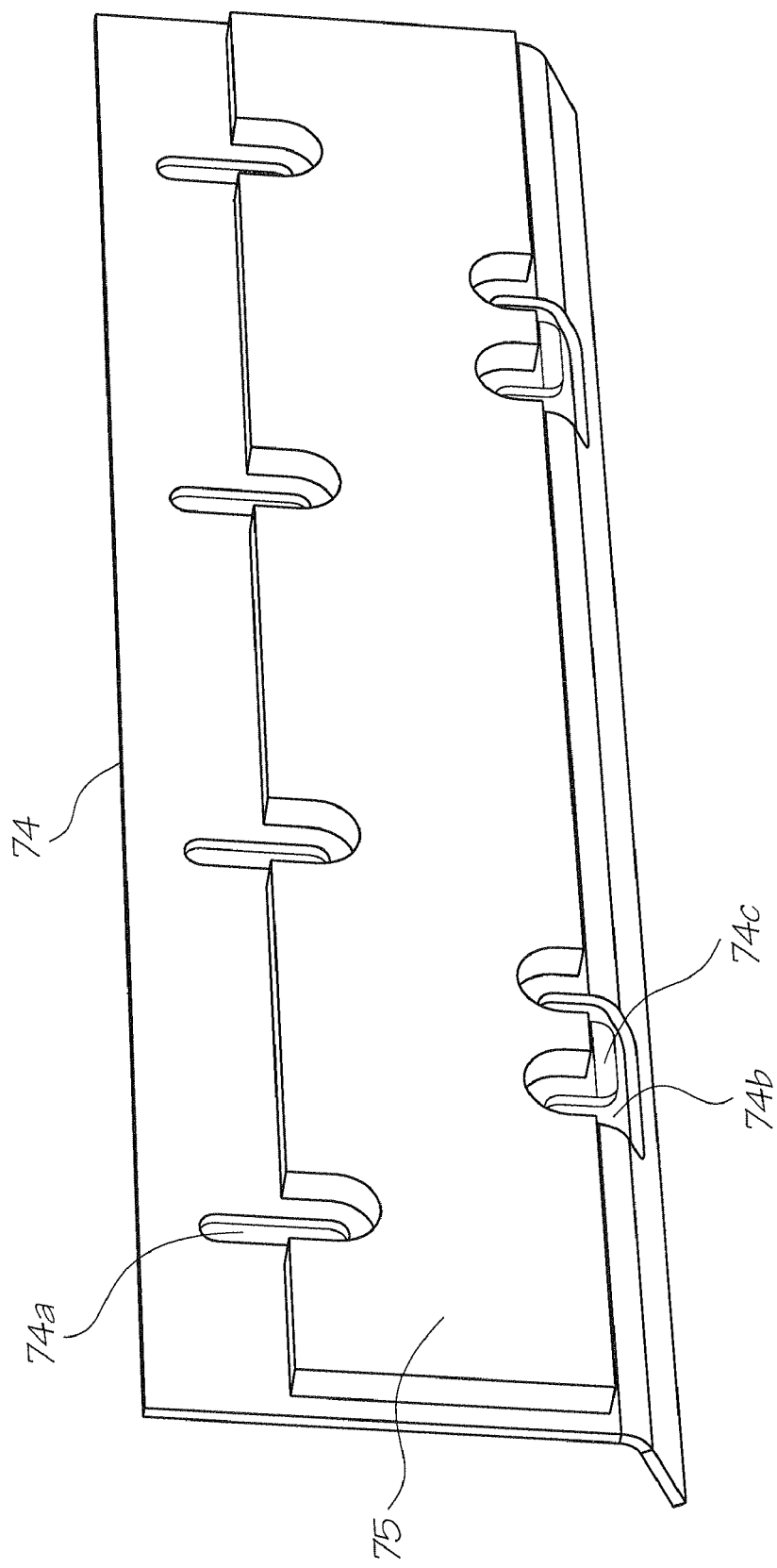
FIG. 19B shows a rear side view of a pressure plate that forms a portion of the printhead assembly of FIG. 1.
Figure 20:
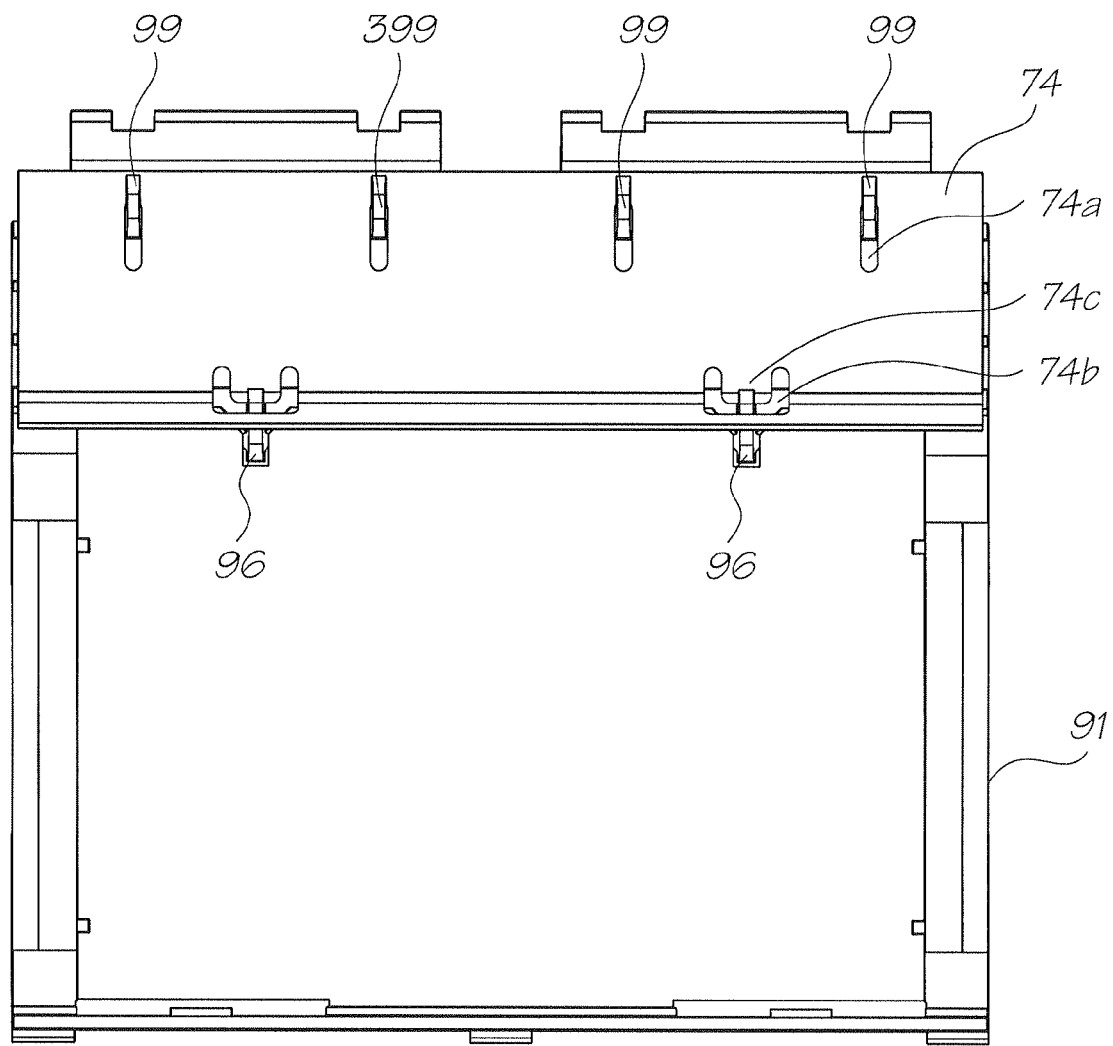
FIG. 20 shows a front view illustrating the further components of FIG. 19.

Further, the angular lugs 43a are positioned so as to correspond to the placement of the printhead tiles 50 on the upper surface of the fluid channel member 40 so that, when mounted, the lower connecting portions 81 of each of the flex PCBs 80 are aligned with the corresponding connectors 98 of the PCBs 90 (see FIGS. 6 and 18B). This is facilitated by the flex PCBs 80 having a hole 82 therein (FIG. 6) which is received by the lower retaining clip 96 of the support 91. Consequently, the flex PCBs 80 are correctly positioned under the pressure plate 74 retained by the retaining clip 96 as described above.

Further still, as also shown in FIGS. 22C and 22E, the (upper) lug 92 of the support 91 has an inner surface 92a which is also slightly angled from the normal of the plane of the support 91 in a direction away from the support 91. As shown in FIGS. 17B, the upper lugs 92 are formed as resilient members which are able to hinge with respect to the support 91 with a spring-like action. Consequently, when mounted to the casing 20, a slight force is exerted against the lug 27a of the uppermost face 27 of the support frame 22 which assists in securing the support 91 to the support frame 22 of the casing 20 by biasing the (lower) lug 92 into the recess formed between the lower part of the inner surface 25 and the lug 28a of the arm portion 28 of the support frame 22.

The manner in which the structure of the casing 20 is completed in accordance with an exemplary embodiment of the present invention will now be described with reference to FIGS. 1, 2, 15A and 23.

Figure 23:
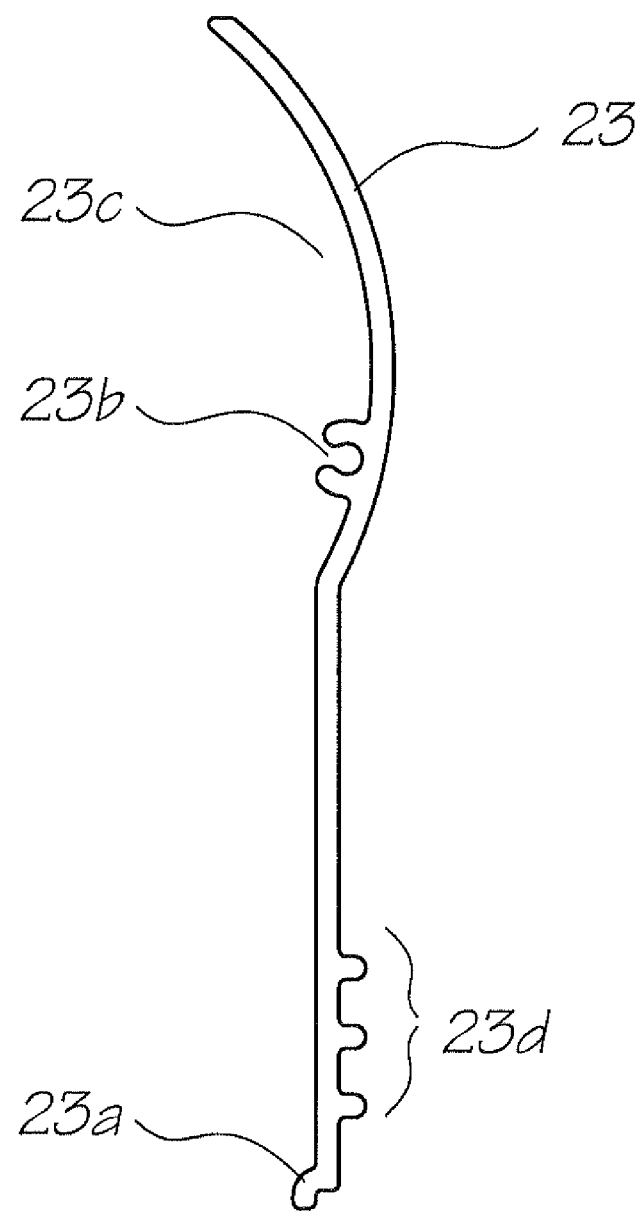
FIG. 23 shows a side view of a cover portion of the casing of the printhead assembly of FIG. 1.

As shown in FIGS. 1 and 2, the casing 20 includes the aforementioned cover portion 23 which is positioned adjacent the support frame 22. Thus, together the support frame 22 and the cover portion 23 define the two-piece outer housing of the printhead assembly 10. The profile of the cover portion 23 is as shown in FIG. 23.

The cover portion 23 is configured so as to be placed over the exposed PCB 90 mounted to the PCB support 91 which in turn is mounted to the support frame 22 of the casing 20, with the channel 21 thereof holding the printhead module 30. As a result, the cover portion 23 encloses the printhead module 30 within the casing 20.

The cover portion 23 includes a longitudinally extending tab 23a on a bottom surface thereof (with respect to the orientation of the printhead assembly 10) which is received in the recessed portion 28c formed between the lug 28b and the curved end portion 28d of the arm portion 28 of the support frame 22 (see FIG. 15A). This arrangement locates and holds the cover portion 23 in the casing 20 with respect to the support frame 22. The cover portion 23 is further held in place by affixing the end plate 111 or the end housing 120 via the end plate 110 on the longitudinal side thereof using screws through threaded portions 23b (see FIGS. 23, 29 and 39). The end plates 110 and/or 111 are also affixed to the support frame 22 on either longitudinal side thereof using screws through threaded portions 22a and 22b provided in the internal cavity 26 (see FIGS. 15A, 29 and 39). Further, the cover portion 23 has the profile as shown in FIG. 23, in which a cavity portion 23c is arranged at the inner surface of the cover portion 23 (with respect to the inward direction on the printhead assembly 10) for accommodating the pressure plate(s) 74 mounted to the PCB support(s) 91.

Further, the cover portion may also include fin portions 23d (see also FIG. 3) which are provided for dissipating heat generated by the PEC integrated circuits 100 during operation thereof. To facilitate this the inner surface of the cover portion 23 may also be provided with a heat coupling material portion (not shown) which physically contacts the PEC integrated circuits 100 when the cover portion 23 is attached to the support frame 22. Further still, the cover portion 23 may also function to inhibit electromagnetic interference (EMI) which can interfere with the operation of the dedicated electronics of the printhead assembly 10.

The manner in which a plurality of the PCB supports 91 are assembled in the support frame 22 to provide a sufficient number of PEC integrated circuits 100 per printhead module 30 in accordance with one embodiment of the present invention will now be described with reference to FIGS. 16 and 24 to 27.

Figure 24:
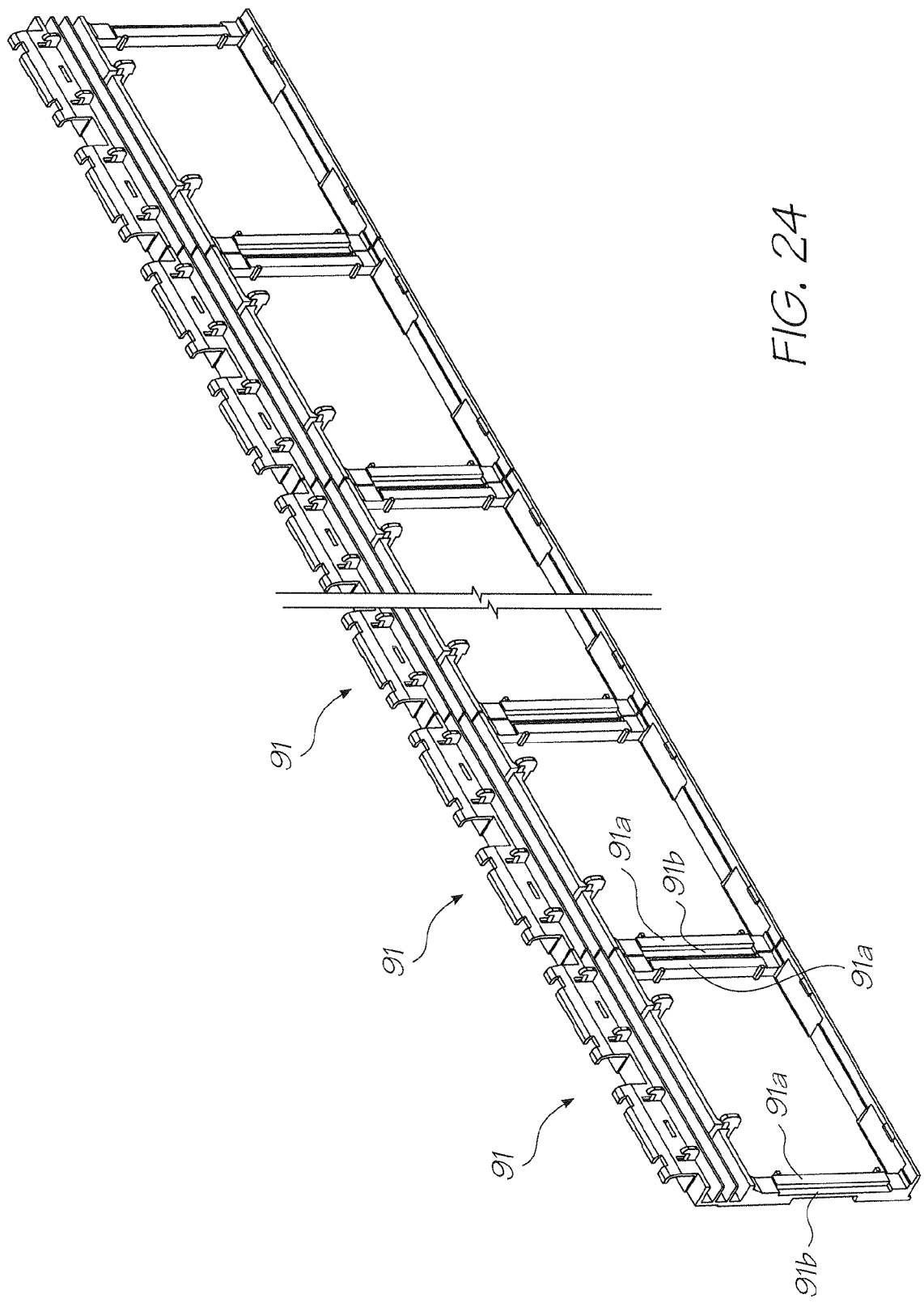
FIG. 24 illustrates a plurality of the PCB supports of FIG. 16 in a modular assembly.

As described earlier, in one embodiment of the present invention, each of the supports 91 is arranged to hold one of the PEC integrated circuits 100 which in turn drives four printhead integrated circuits 51. Accordingly, in a printhead module 30 having 16 printhead tiles, for example, four PEC integrated circuits 100, and therefore four supports 91 are required. For this purpose, the supports 91 are assembled in an end-to-end manner, as shown in FIG. 24, so as to extend the length of the casing 20, with each of the supports 91 being mounted and clipped to the support frame 22 and printhead module 30 as previously described. In such a way, the single printhead module 30 of sixteen printhead tiles 50 is securely held to the casing 20 along the length thereof.

Figure 16:
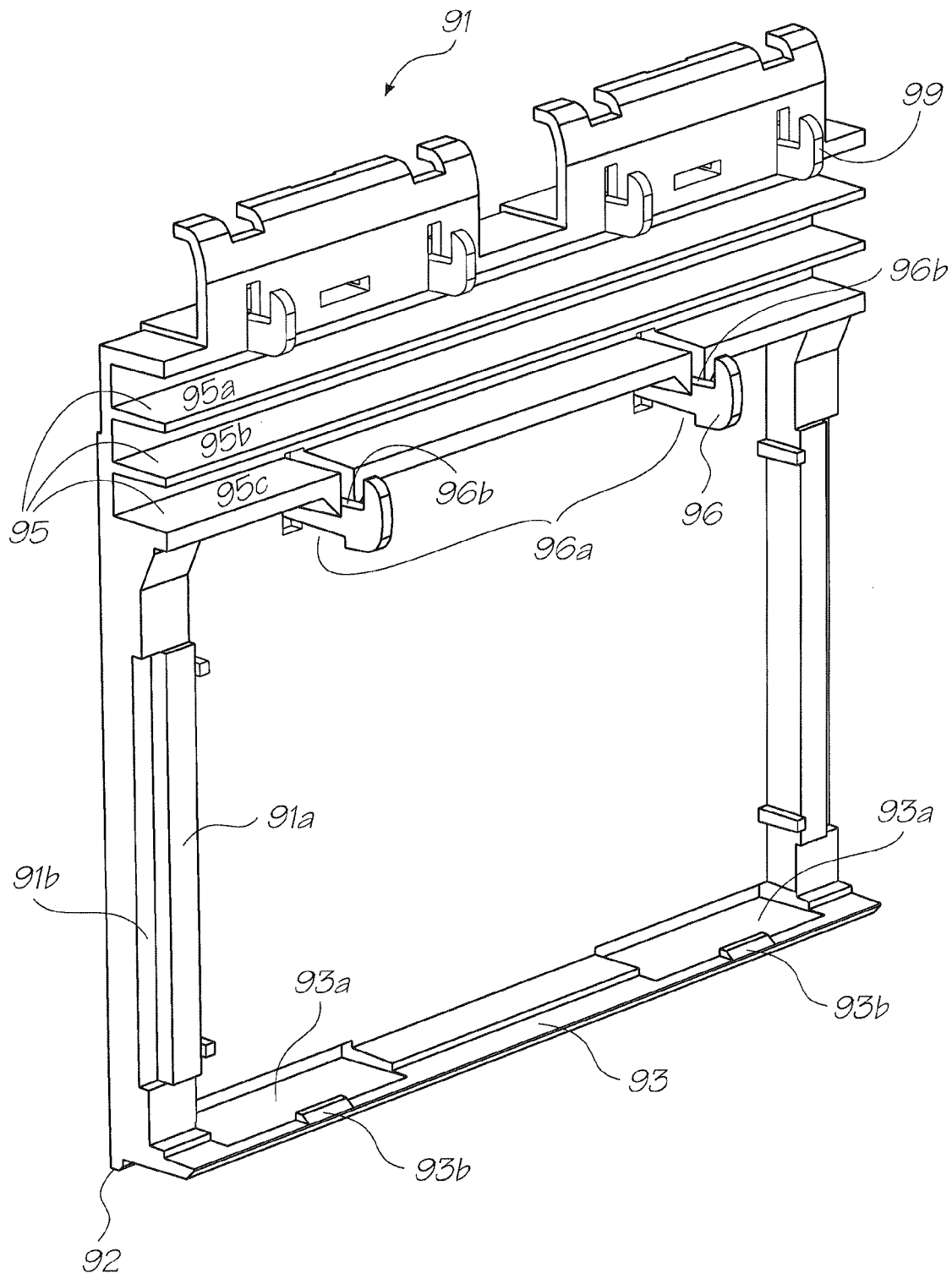
FIG. 16 illustrates a printed circuit board (PCB) support that forms a portion of the printhead assembly of FIG. 1.

As shown more clearly in FIG. 16, the supports 91 further include raised portions 91a and recessed portions 91b at each end thereof. That is, each edge region of the end walls of the supports 91 include a raised portion 91a with a recessed portion 91b formed along the outer edge thereof. This configuration produces the abutting arrangement between the adjacent supports 91 shown in FIG. 24.

Figure 25:
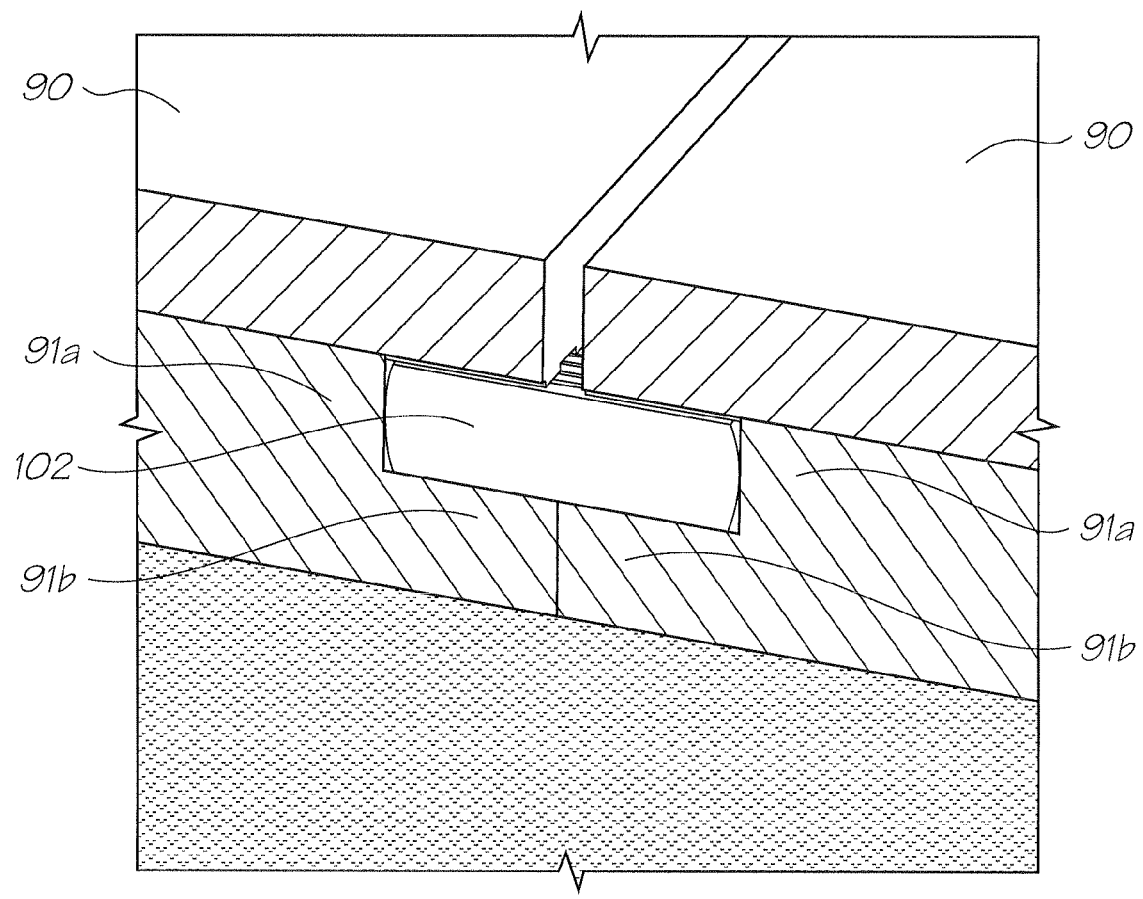
FIG. 25 illustrates a connecting member that is carried by two adjacent PCB supports of FIG. 24 and which is used for interconnecting PCBs that are carried by the PCB supports.

This arrangement of two abutting recessed portions 91b with one raised portion 91a at either side thereof forms a cavity which is able to receive a suitable electrical connecting member 102 therein, as shown in cross-section in FIG. 25. Such an arrangement enables adjacent PCBs 90, carried on the supports 91 to be electrically connected together so that data signals which are input from either or both ends of the plurality of assembled supports 91, i.e., via data connectors (described later) provided at the ends of the casing 20, are routed to the desired PEC integrated circuits 100, and therefore to the desired printhead integrated circuits 51.

Figure 26:
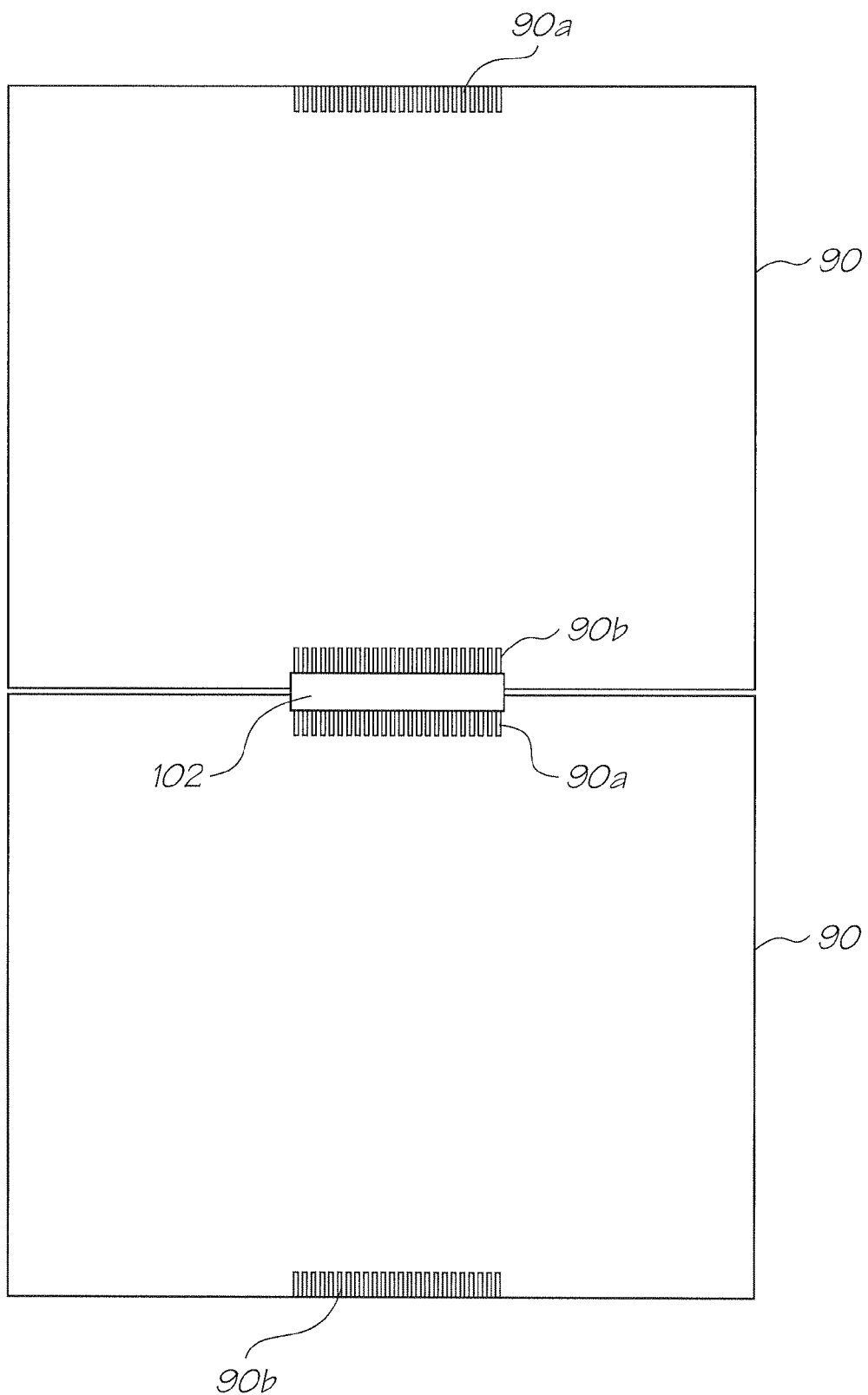
FIG. 26 illustrates the connecting member of FIG. 25 interconnecting two PCBs.

To this end, the connecting members 102 provide electrical connection between a plurality of pads provided at edge contacting regions on the underside of each of the PCBs 90 (with respect to the mounting direction on the supports 91). Each of these pads is connected to different regions of the circuitry of the PCB 90. FIG. 26 illustrates the pads of the PCBs as positioned over the connecting member 102. Specifically, as shown in FIG. 26, the plurality of pads are provided as a series of connection strips 90a and 90b in a substantially central region of each edge of the underside of the PCBs 90.

As mentioned above, the connecting members 102 are placed in the cavity formed by the abutting recessed portions 91b of adjacent supports 91 (see FIG. 25), such that when the PCBs 90 are mounted on the supports 91, the connection strips 90a of one PCB 90 and the connection strips 90b of the adjacent PCB 90 come into contact with the same connecting member 102 so as to provide electrical connection therebetween.

Figure 27:
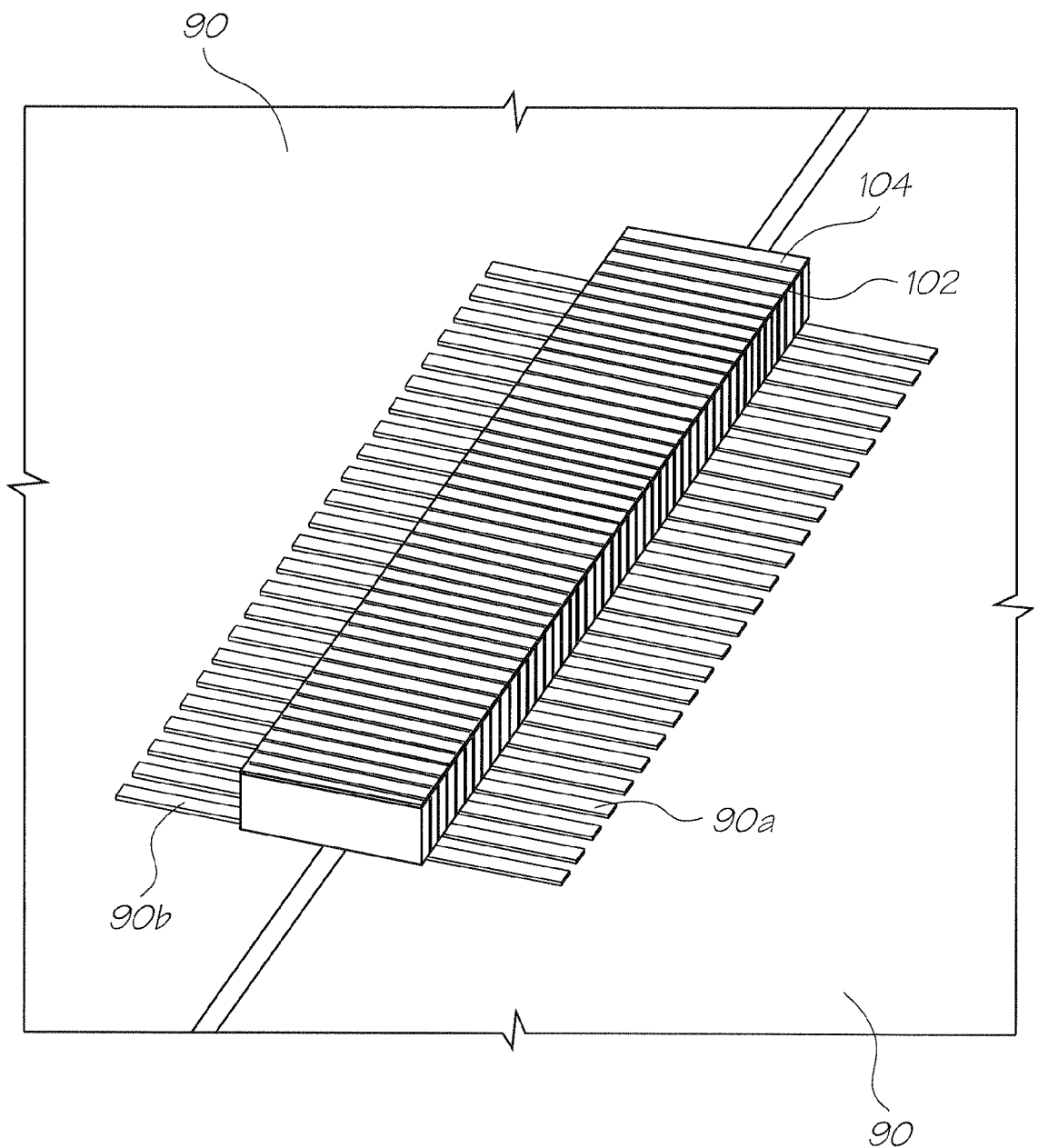
FIG. 27 illustrates the interconnection between two PCBs by the connecting member of FIG. 25.

To achieve this, the connecting members 102 may each be formed as shown in FIG. 27 to be a rectangular block having a series of conducting strips 104 provided on each surface thereof. Alternatively, the conducting strips 104 may be formed on only one surface of the connecting members 102 as depicted in FIGS. 25 and 26. Such a connecting member may typically be formed of a strip of silicone rubber printed to provide sequentially spaced conductive and non-conductive material strips. A shown in FIG. 27, these conducting strips 104 are provided in a 2:1 relationship with the connecting strips 90a and 90b of the PCBs 90. That is, twice as many of the conducting strips 104 are provided than the connecting strips 90a and 90b, with the width of the conducting strips 104 being less than half the width of the connecting strips 90a and 90b. Accordingly, any one connecting strip 90a or 90b may come into contact with one or both of two corresponding conducting strips 104, thus minimising alignment requirements between the connecting members 104 and the contacting regions of the PCBs 90.

In one embodiment of the present invention, the connecting strips 90a and 90b are about 0.4 mm wide with a 0.4 mm spacing therebetween, so that two thinner conducting strips 104 can reliably make contact with only one each of the connecting strips 90a and 90b whilst having a sufficient space therebetween to prevent short circuiting. The connecting strips 90a and 90b and the conducting strips 104 may be gold plated so as to provide reliable contact. However, those skilled in the art will understand that use of the connecting members and suitably configured PCB supports is only one exemplary way of connecting the PCBs 90, and other types of connections are within the scope of the present invention.

Additionally, the circuitry of the PCBs 90 is arranged so that a PEC integrated circuit 100 of one of the PCB 90 of an assembled support 91 can be used to drive not only the printhead integrated circuits 51 connected directly to that PCB 90, but also those of the adjacent PCB(s) 90, and further of any non-adjacent PCB(s) 90. Such an arrangement advantageously provides the printhead assembly 10 with the capability of continuous operation despite one of the PEC integrated circuits 100 and/or PCBs 90 becoming defective, albeit at a reduced printing speed.

In accordance with the above-described scalability of the printhead assembly 10 of the present invention, the end-to-end assembly of the PCB supports 91 can be extended up to the required length of the printhead assembly 10 due to the modularity of the supports 91. For this purpose, the busbars 71, 72 and 73 need to be extended for the combined length of the plurality of PCB supports 91, which may result in insufficient power being delivered to each of the PCBs 90 when a relatively long printhead assembly 10 is desired, such as in wide format printing applications.

In order to minimise power loss, two power supplies can be used, one at each end of the printhead assembly 10, and a group of busbars 70 from each end may be employed. The connection of these two busbar groups, e.g., substantially in the centre of the printhead assembly 10, is facilitated by providing the exemplary connecting regions 71a, 72a and 73a shown in FIG. 28.

Figure 28:
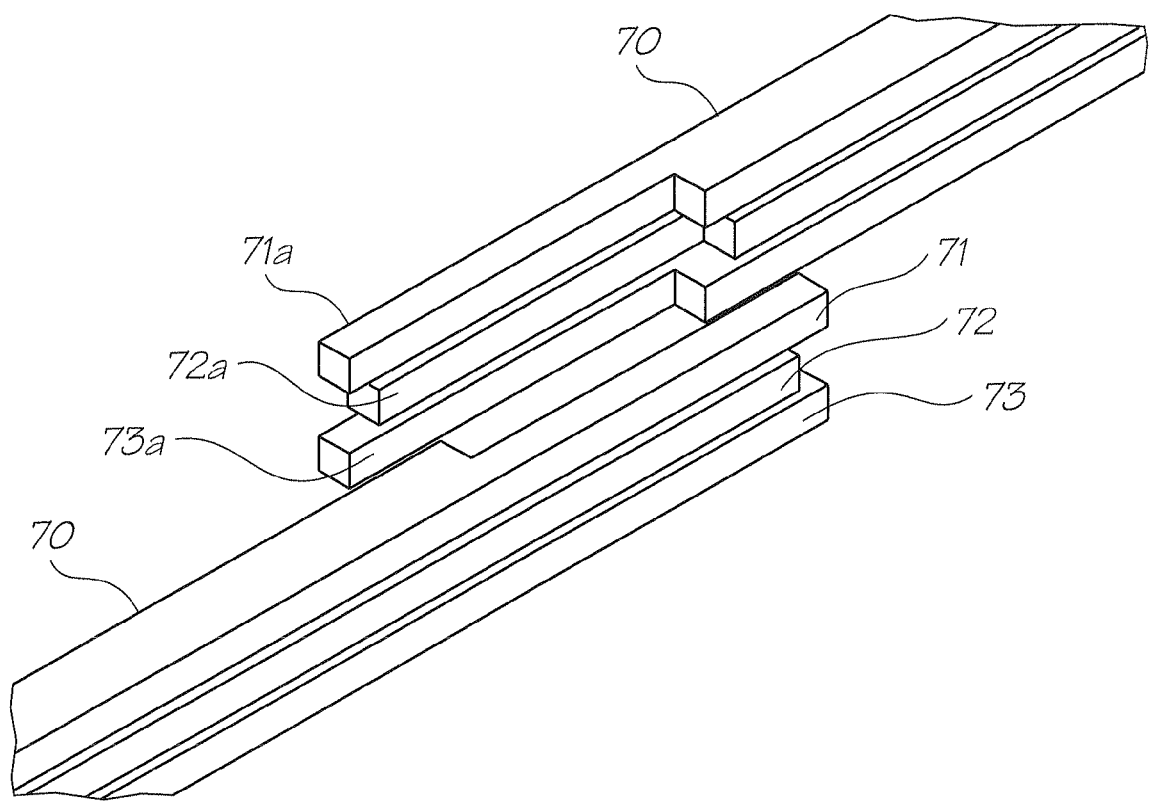
FIG. 28 illustrates a connecting region of busbars that are located in the printhead assembly of FIG. 1.

Specifically, the busbars 71, 72 and 73 are provided in a staggered arrangement relative to each other and the end regions thereof are configured with the rebated portions shown in FIG. 28 as connecting regions 71a, 72a and 73a. Accordingly, the connecting regions 71a, 72a and 73a of the first group of busbars 70 overlap and are engaged with the connecting regions 71a, 72a and 73a of the corresponding ones of the busbars 71, 72 and 73 of the second group of busbars 70.

The manner in which the busbars are connected to the power supply and the arrangements of the end plates 110 and 111 and the end housing(s) 120 which house these connections will now be described with reference to FIGS. 1, 2 and 29 to 39.

Figure 29:
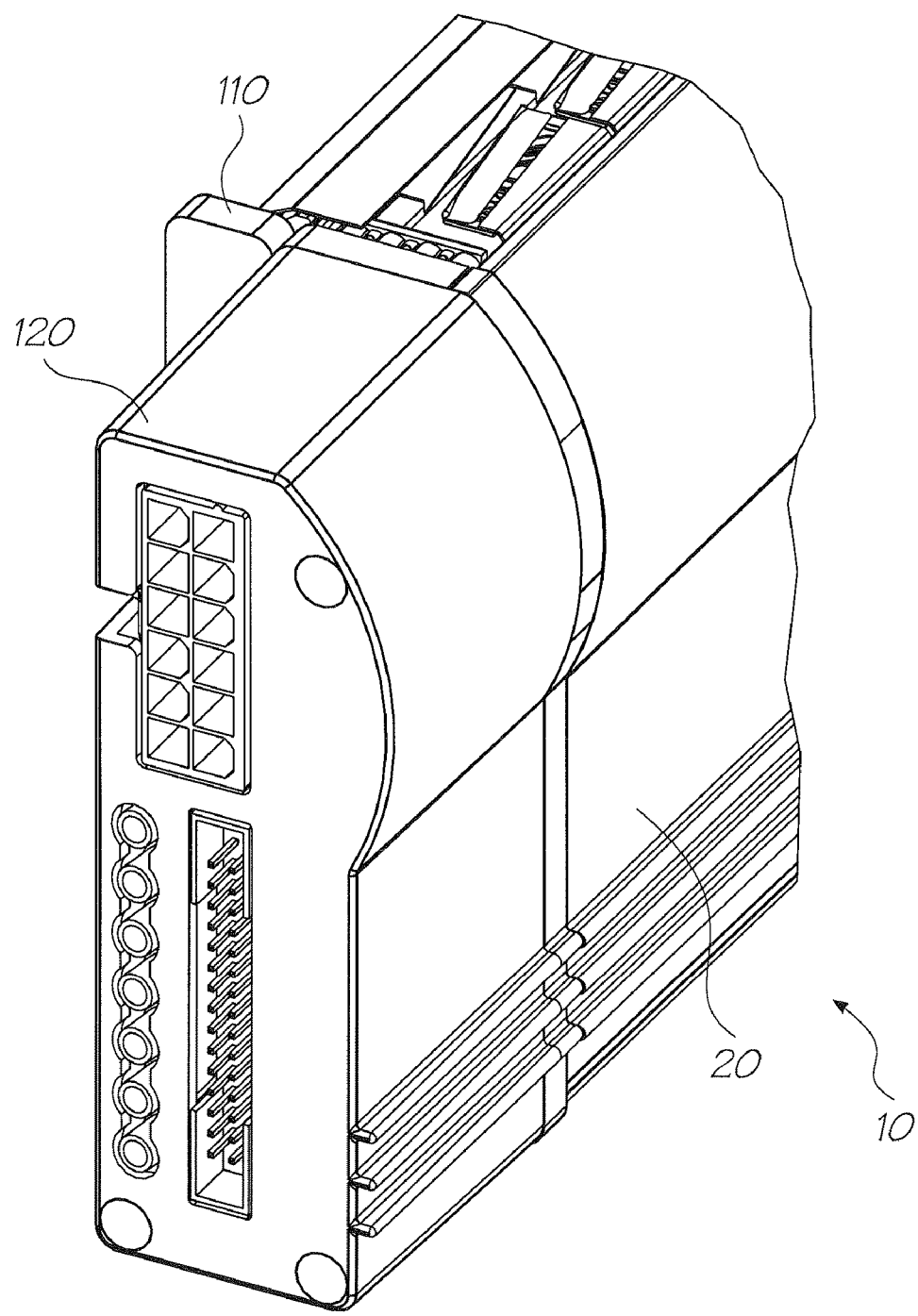
FIG. 29 shows a perspective view of an end portion of a printhead assembly in accordance with an embodiment of the present invention.

FIG. 29 illustrates an end portion of an exemplary printhead assembly according to one embodiment of the present invention similar to that shown in FIG. 1. At this end portion, the end housing 120 is attached to the casing 20 of the printhead assembly 10 via the end plate 110.

The end housing and plate assembly houses connection electronics for the supply of power to the busbars 71, 72 and 73 and the supply of data to the PCBs 90. The end housing and plate assembly also houses connections for the internal fluid delivery tubes 6 to external fluid delivery tubes (not shown) of the fluid supply of the printing system to which the printhead assembly 10 is being applied.

Figure 30:
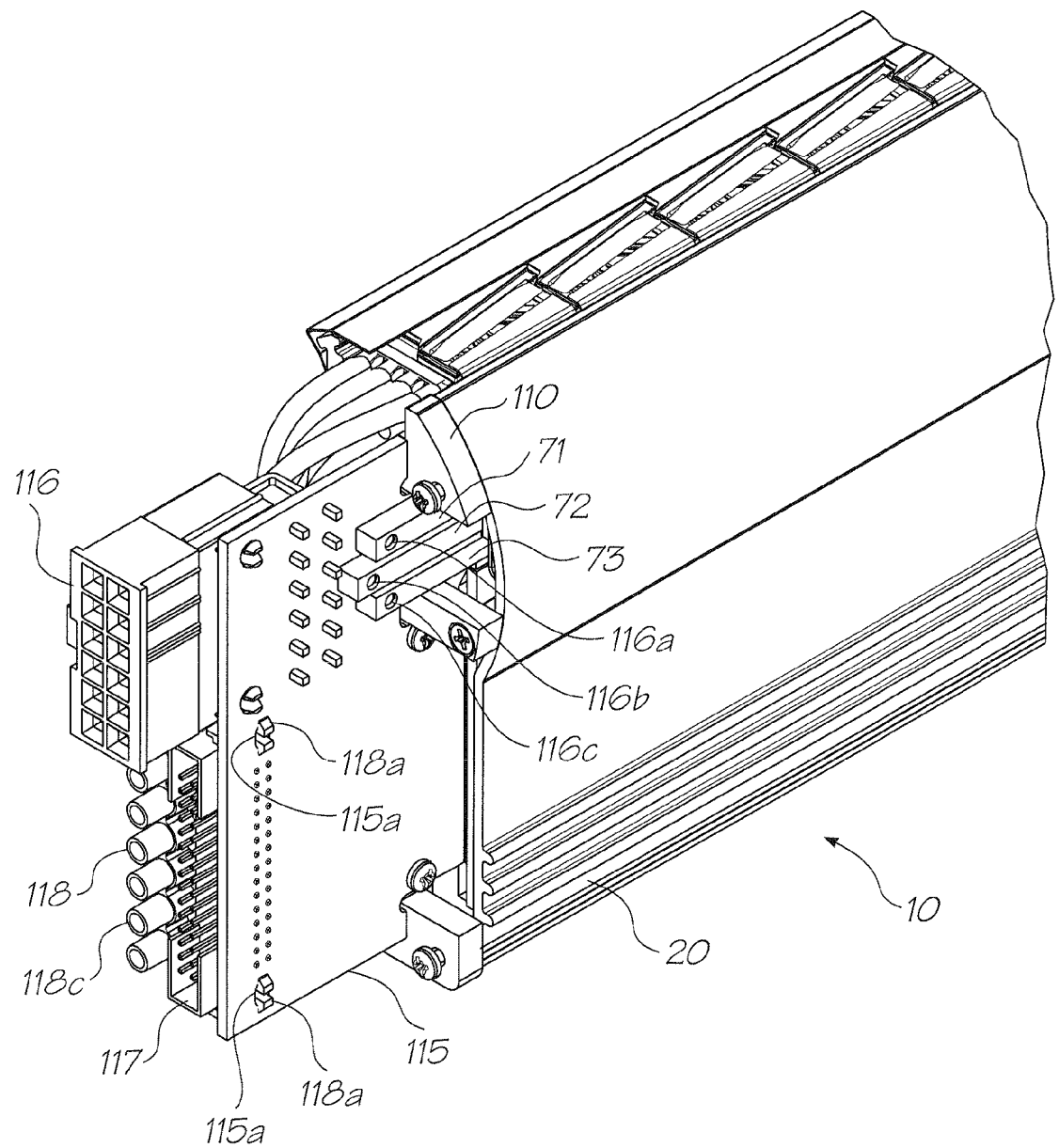
FIG. 30 illustrates a connector arrangement that is located in the end portion of the printhead assembly as shown in FIG. 29.
Figure 31:
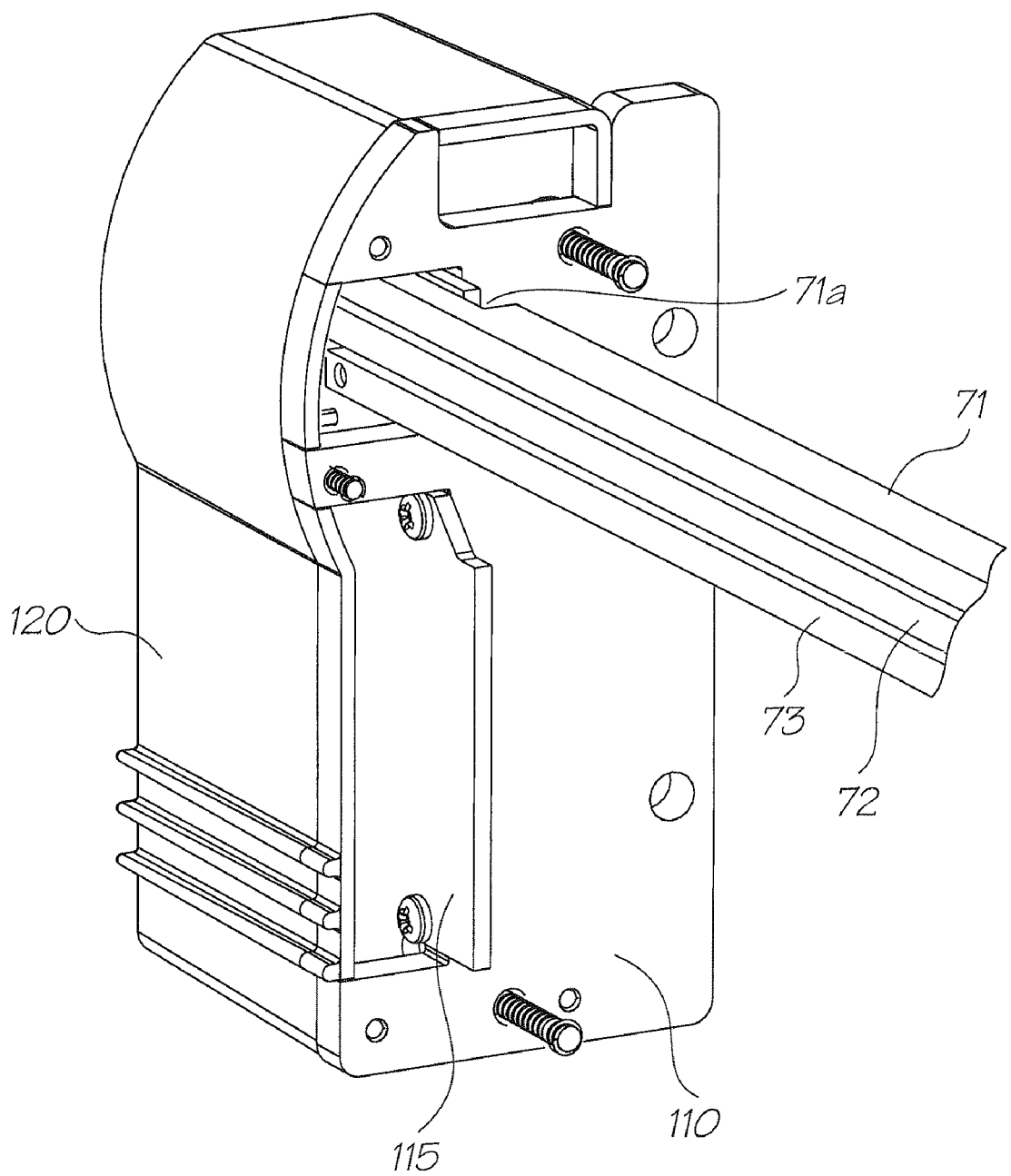
FIG. 31 illustrates the connector arrangement of FIG. 30 housed in an end housing and plate assembly which forms a portion of the printhead assembly.

These connections are provided on a connector arrangement 115 as shown in FIG. 30. FIG. 30 illustrates the connector arrangement 115 fitted to the end plate 110 which is attached, via screws as described earlier, to an end of the casing 20 of the printhead assembly 10 according to one embodiment of the present invention. As shown, the connector arrangement 115 includes a power supply connection portion 116, a data connection portion 117 and a fluid delivery connection portion 118. Terminals of the power supply connection portion 116 are connected to corresponding ones of three contact screws 116a, 116b, 116c provided so as to each connect with a corresponding one of the busbars 71, 72 and 73. To this end, each of the busbars 71, 72 and 73 is provided with threaded holes in suitable locations for engagement with the contact screws 116a, 116b, 116c. Further, the connection regions 71a, 72a and 73a (see FIG. 28) may also be provided at the ends of the busbars 71, 72 and 73 which are to be in contact with the contact screws 116a, 116b, 116c so as to facilitate the engagement of the busbars 71, 72 and 73 with the connector arrangement 115, as shown in FIG. 31.

Figure 32A:
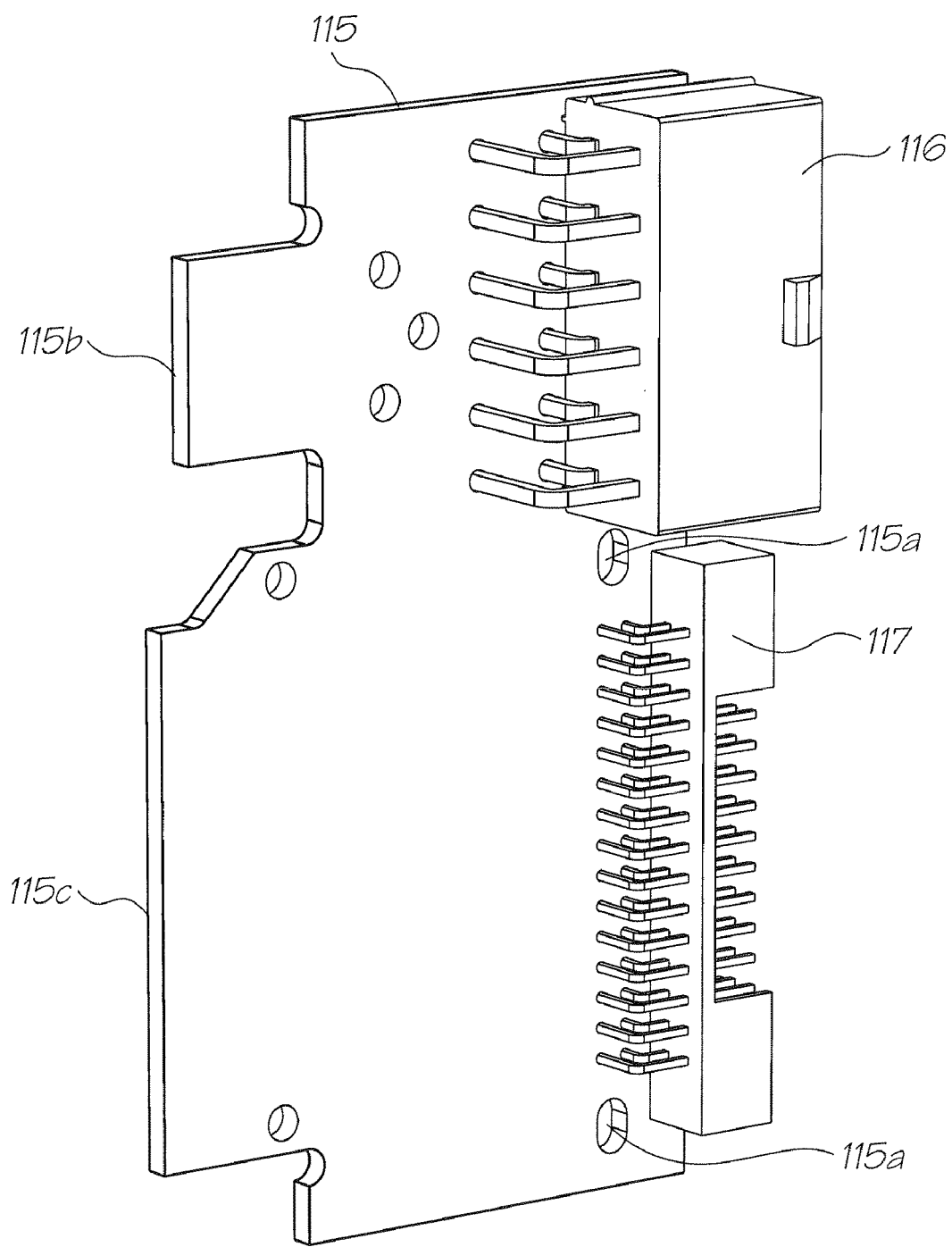
FIGS. 32A and 32B show opposite side views of the connector arrangement of FIG. 30.
Figure 32B:
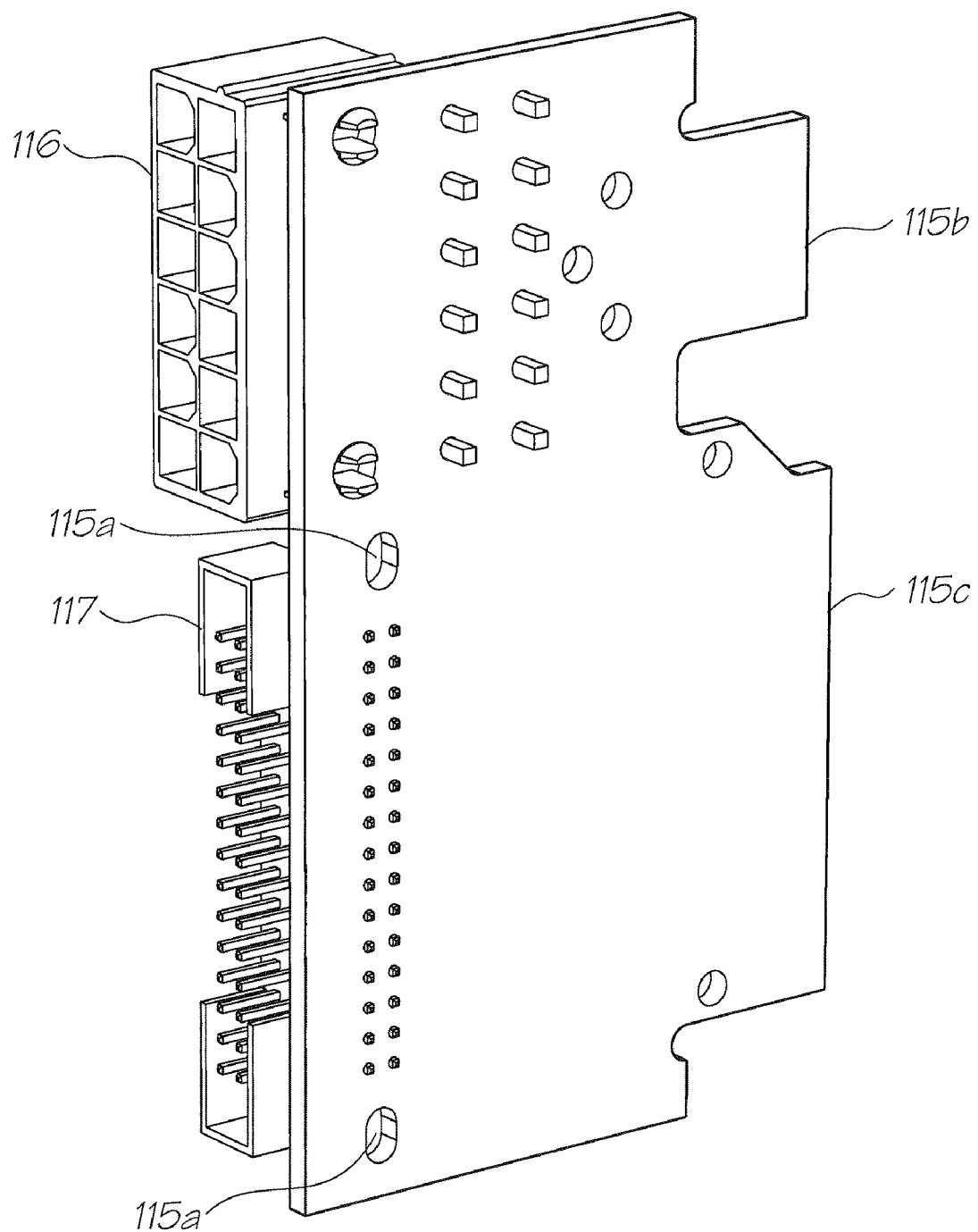

In FIGS. 30, 32A and 32B, only three contact screws or places for three contact screws are shown, one for each of the busbars. However, the use of a different number of contact screws is within the scope of the present invention. That is, depending on the amount of power being routed to the busbars, in order to provide sufficient power contact it may be necessary to provide two or more contact screws for each busbar (see, for example, FIGS. 33B and 33C). Further, as mentioned earlier a greater or lesser number of busbars may be used, and therefore a corresponding greater of lesser number of contact screws. Further still, those skilled in the art will understand that other means of contacting the busbars to the power supply via the connector arrangements as are typical in the art, such as soldering, are within the scope of the present invention.

The manner in which the power supply connection portion 116 and the data connection portion 117 are attached to the connector arrangement 115 is shown in FIGS. 32A and 32B. Further, connection tabs 118a of the fluid delivery connection portion 118 are attached at holes 115a of the connector arrangement 115 so as that the fluid delivery connection portion 118 overlies the data connection portion 117 with respect to the connector arrangement 115 (see FIGS. 30 and 32C).

Figure 32C:
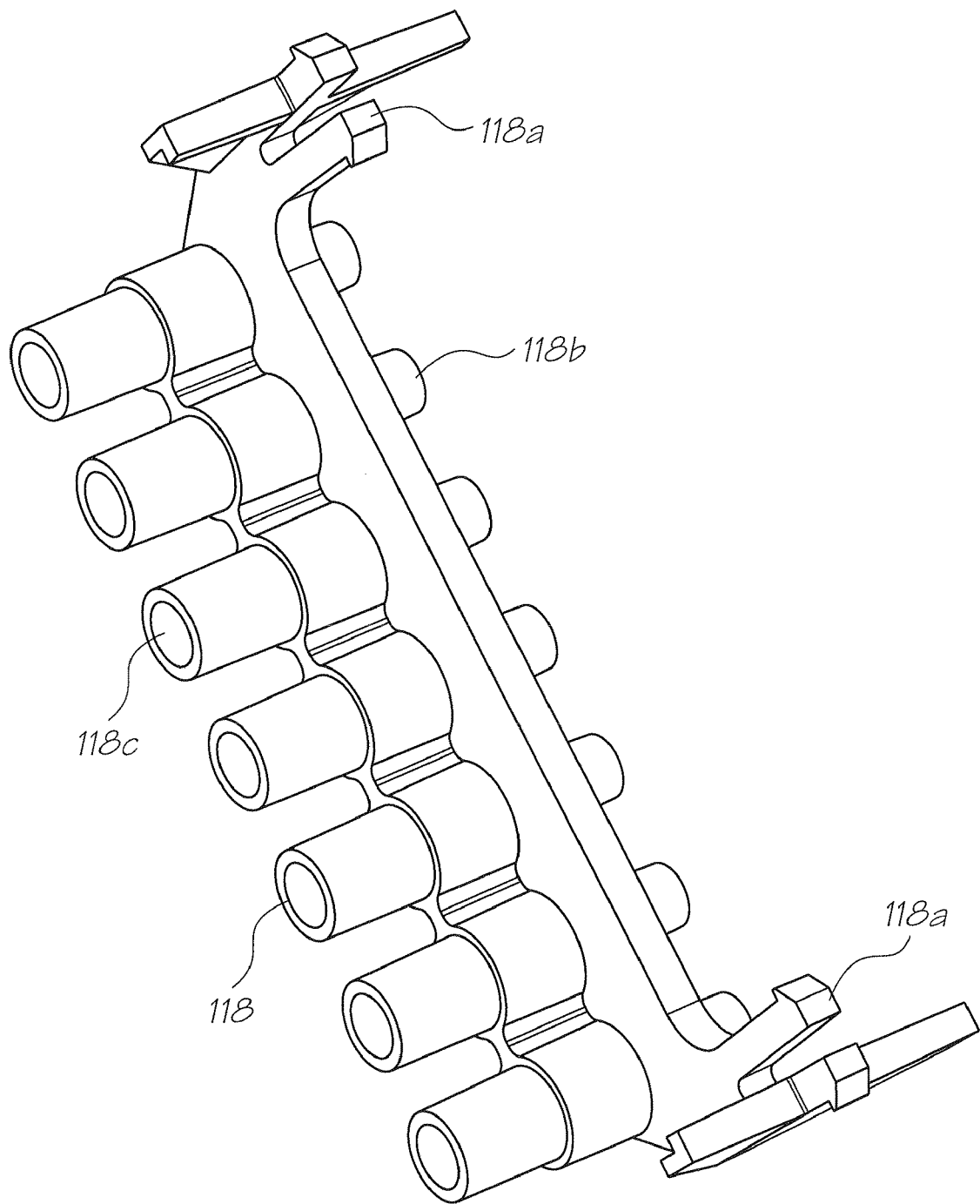
FIG. 32C illustrates a fluid delivery connection portion of the connector arrangement of FIG. 30.
Figure 34:
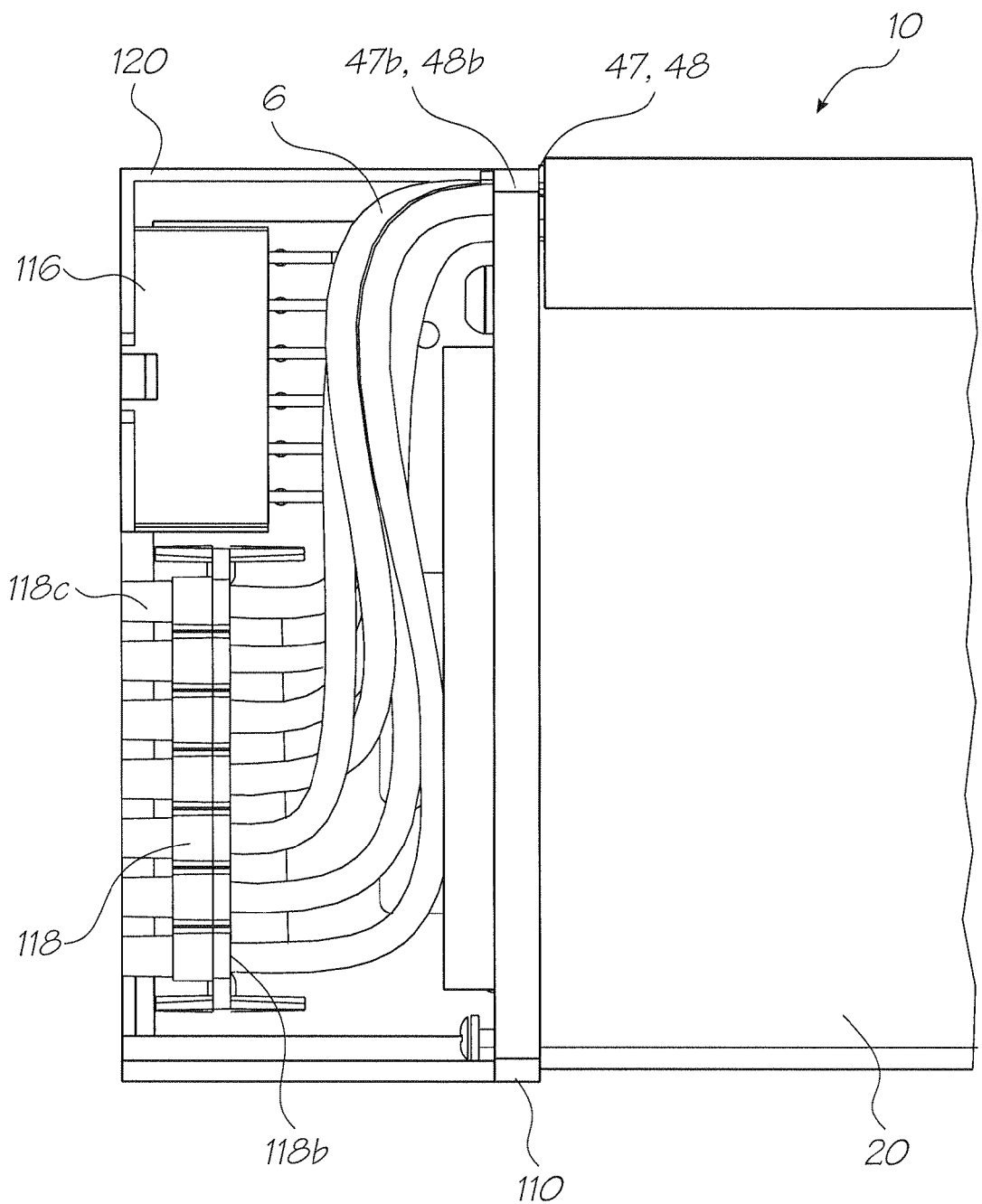
FIG. 34 illustrates the connector arrangement of FIG. 30 housed in the end housing and plate assembly of FIG. 31 attached to the casing of the printhead assembly.

As seen in FIGS. 30 and 32C, seven internal and external tube connectors 118b and 118c are provided in the fluid delivery connection portion 118 in accordance with the seven internal fluid delivery tubes 6. That is, as shown in FIG. 34, the fluid delivery tubes 6 connect between the internal tube connectors 118b of the fluid delivery connection portion 118 and the seven tubular portions 47b or 48b of the fluid delivery connector 47 or 48. As stated earlier, those skilled in the art clearly understand that the present invention is not limited to this number of fluid delivery tubes, etc.

Returning to FIGS. 32A and 32B, the connector arrangement 115 is shaped with regions 115b and 115c so as to be received by the casing 20 in a manner which facilitates connection of the busbars 71, 72 and 73 to the contact screws 116a, 116b and 116c of the power supply connection portion 116 via region 115b and connection of the end PCB 90 of the plurality of PCBs 90 arranged on the casing 20 to the data connection portion 117 via region 115c.

The region 115c of the connector arrangement 115 is advantageously provided with connection regions (not shown) of the data connection portion 117 which correspond to the connection strips 90a or 90b provided at the edge contacting region on the underside of the end PCB 90, so that one of the connecting members 102 can be used to connect the data connections of the data connection portion 117 to the end PCB 90, and thus all of the plurality of PCBs 90 via the connecting members 102 provided therebetween.

Figure 33A:
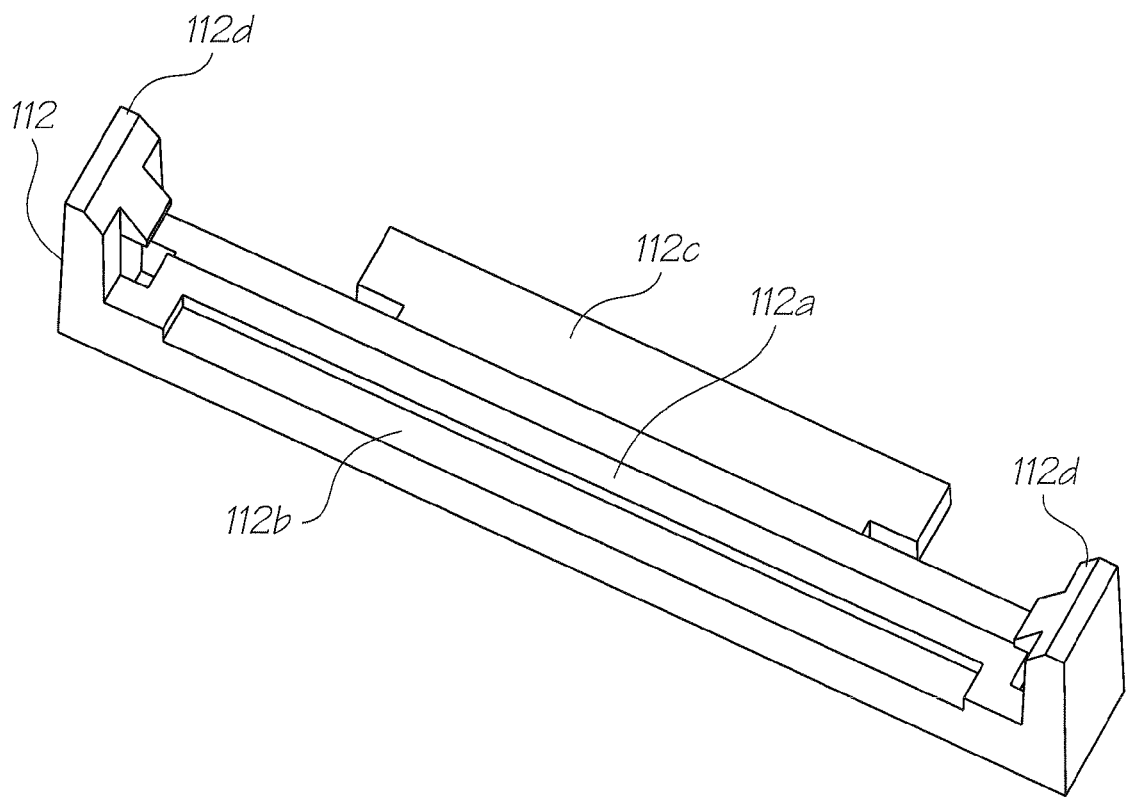
FIG. 33A illustrates a support member that is located in a printhead assembly in accordance with an embodiment of the present invention.

This is facilitated by using a support member 112 as shown in FIG. 33A, which has a raised portion 112a and a recessed portion 112b at one edge thereof which is arranged to align with the raised and recessed portions 91a and 91b, respectively, of the end PCB support 91 (see FIG. 24). The support member 112 is attached to the rear surface of the end PCB support 91 by engaging a tab 112c with a slot region 91c on the rear surface of the end PCB support 91 (see FIG. 17B), and the region 115c of the connector arrangement 115 is retained at upper and lower side surfaces thereof by clip portions 112d of the support member 112 so as that the connection regions of the region 115c are in substantially the same plane as the edge contacting regions on the underside of the end PCB 90.

Figure 33B:
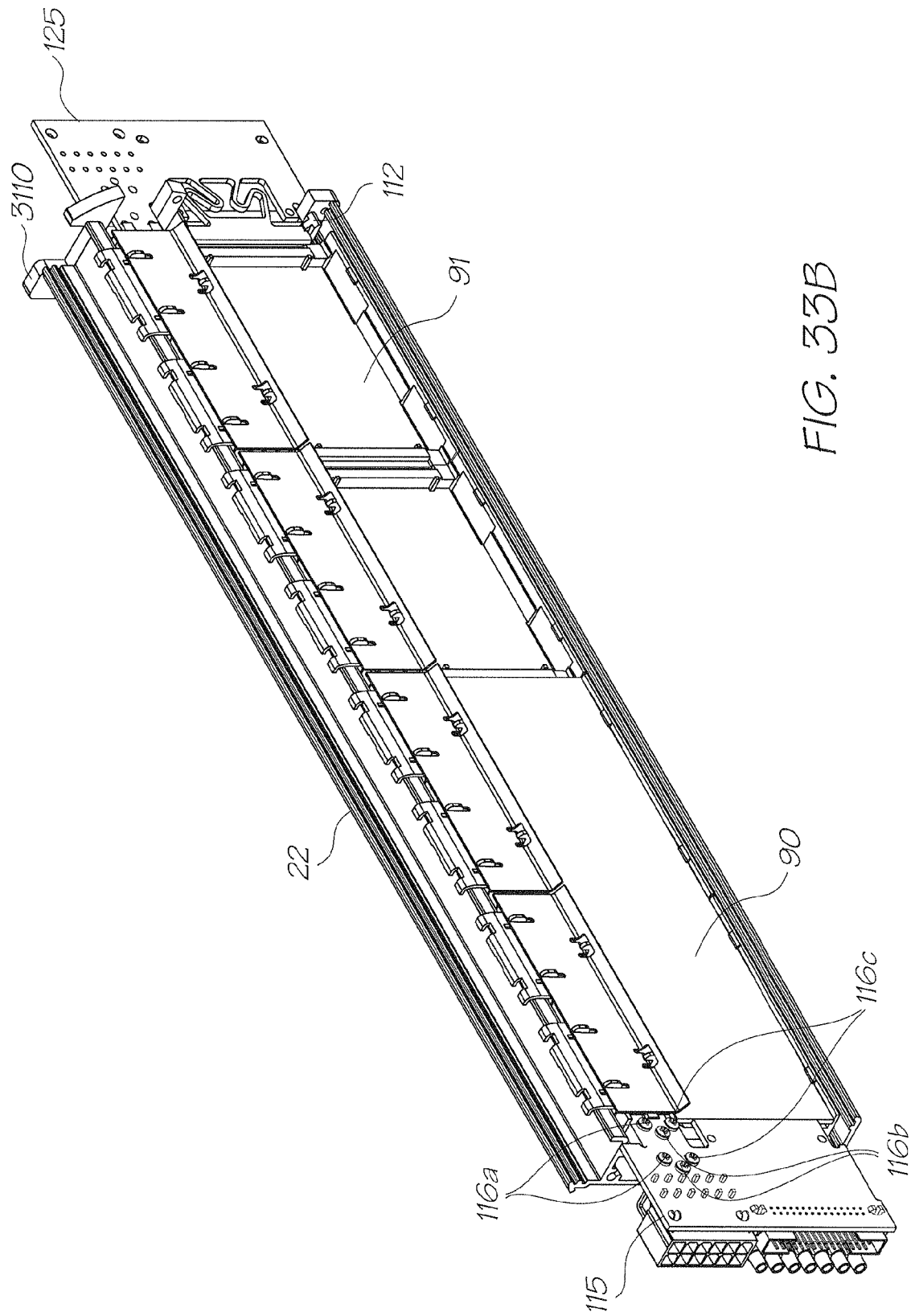
FIG. 33B shows a sectional view of the printhead assembly with the support member of FIG. 33A located therein.
Figure 33C:
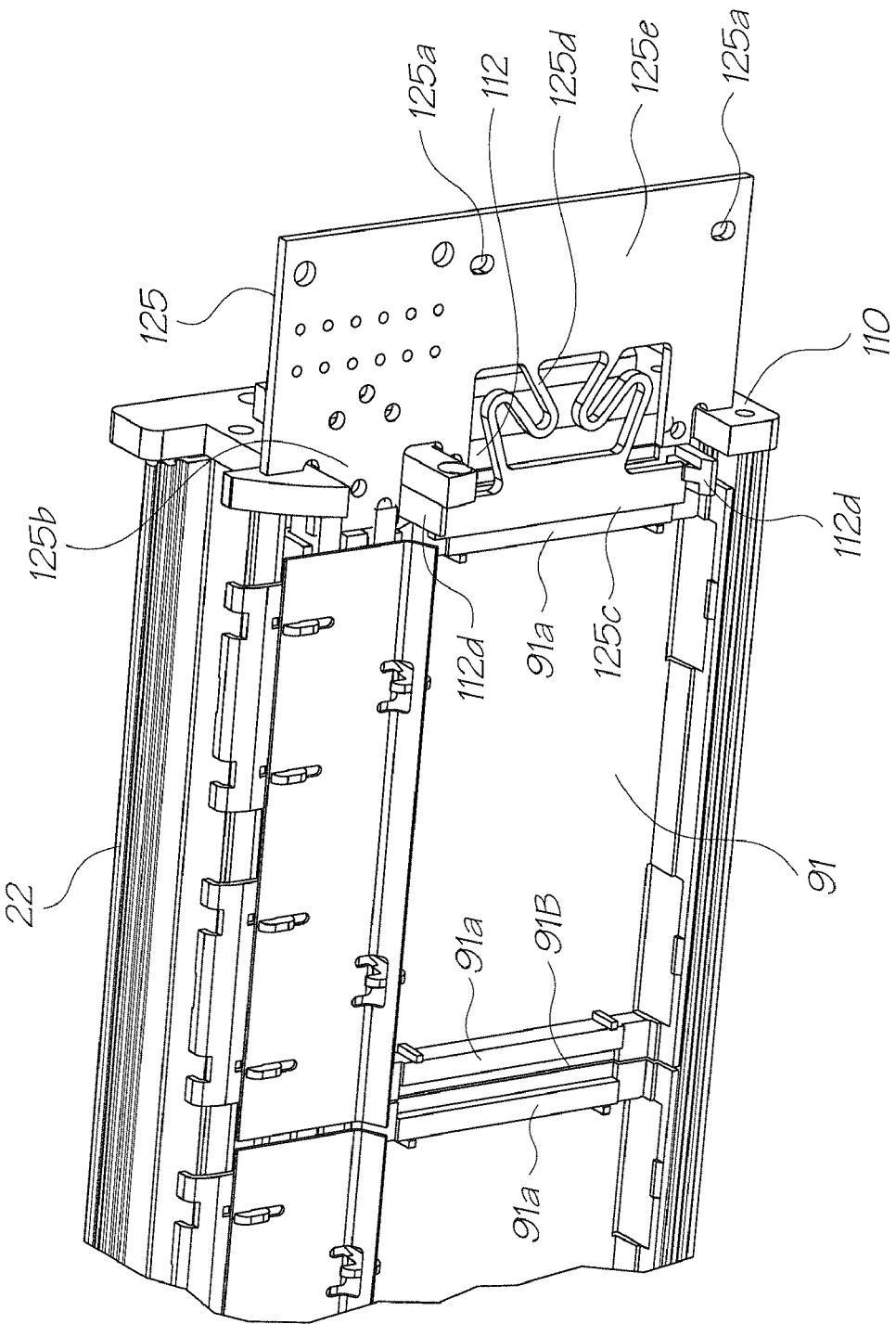
FIG. 33C illustrates a part of the printhead assembly of FIG. 33B in more detail.

Thus, when the end plate 110 is attached to the end of the casing 20, an abutting arrangement is formed between the recessed portions 112b and 91b, similar to the abutting arrangement formed between the recessed portions 91b of the adjacent supports 91 of FIG. 24. Accordingly, the connecting member 102 can be accommodated compactly between the end PCB 90 and the region 115c of the connector arrangement 115. This arrangement is shown in FIGS. 33B and 33C for another type of connector arrangement 125 with a corresponding region 125c, which is described in more detail below with respect to FIGS. 37, 38A and 38B.

This exemplary manner of connecting the data connection portion 117 to the end PCB 90 contributes to the modular aspect of the present invention, in that it is not necessary to provide differently configured PCBs 90 to be arranged at the longitudinal ends of the casing 20 and the same method of data connection can be retained throughout the printhead assembly 10. It will be understood by those skilled in the art however that the provision of additional or other components to connect the data connection portion 117 to the end PCB 90 is also included in the scope of the present invention.

Figure 35A:
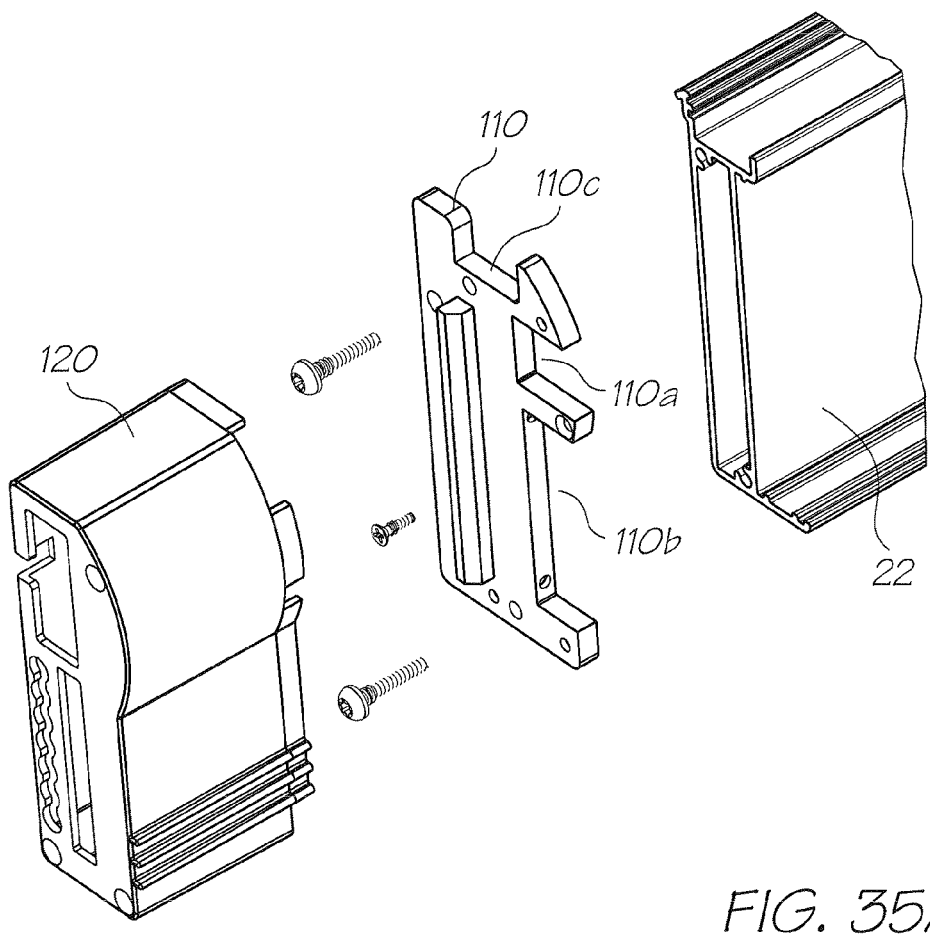
FIG. 35A shows an exploded perspective view of the end housing and plate assembly of FIG. 31.

Returning to FIG. 30, it can be seen that the end plate 110 is shaped so as to conform with the regions 115b and 115c of the connector arrangement 115, such that these regions can project into the casing 20 for connection to the busbars 71, 72 and 73 and the end PCB 90, and so that the busbars 71, 72 and 73 can extend to contact screws 116a, 116b and 116c provided on the connector arrangement 115. This particular shape of the end plate 110 is shown in FIG. 35A, where regions 110a and 110b of the end plate 110 correspond with the regions 115b and 115c of the connector arrangement 115, respectively. Further, a region 110c of the end plate 110 is provided so as to enable connection between the internal fluid delivery tubes 6 and the fluid delivery connectors 47 and 48 of the printhead module 30.

The end housing 120 is also shaped as shown in FIG. 35A, so as to retain the power supply, data and fluid delivery connection portions 116, 117 and 118 so that external connection regions thereof, such as the external tube connector 118c of the fluid delivery connection portion 118 shown in FIG. 32C, are exposed from the printhead assembly 10, as shown in FIG. 29.

Figure 35B:
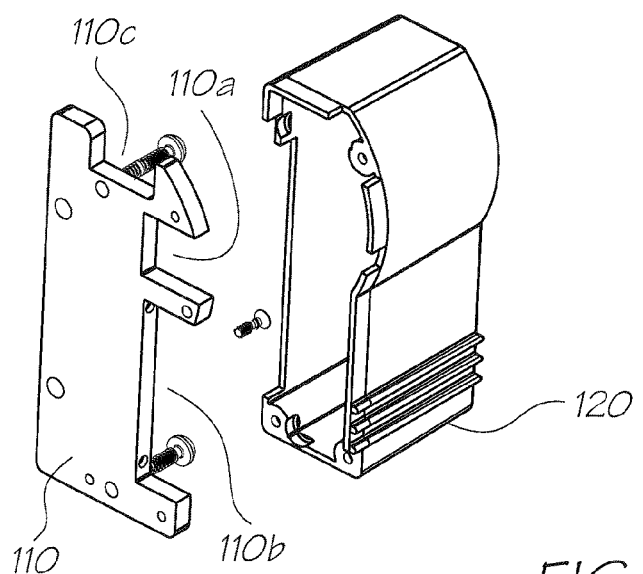
FIG. 35B shows an exploded perspective view of an end housing and plate assembly which forms a portion of the printhead assembly of FIG. 1.
Figure 36:
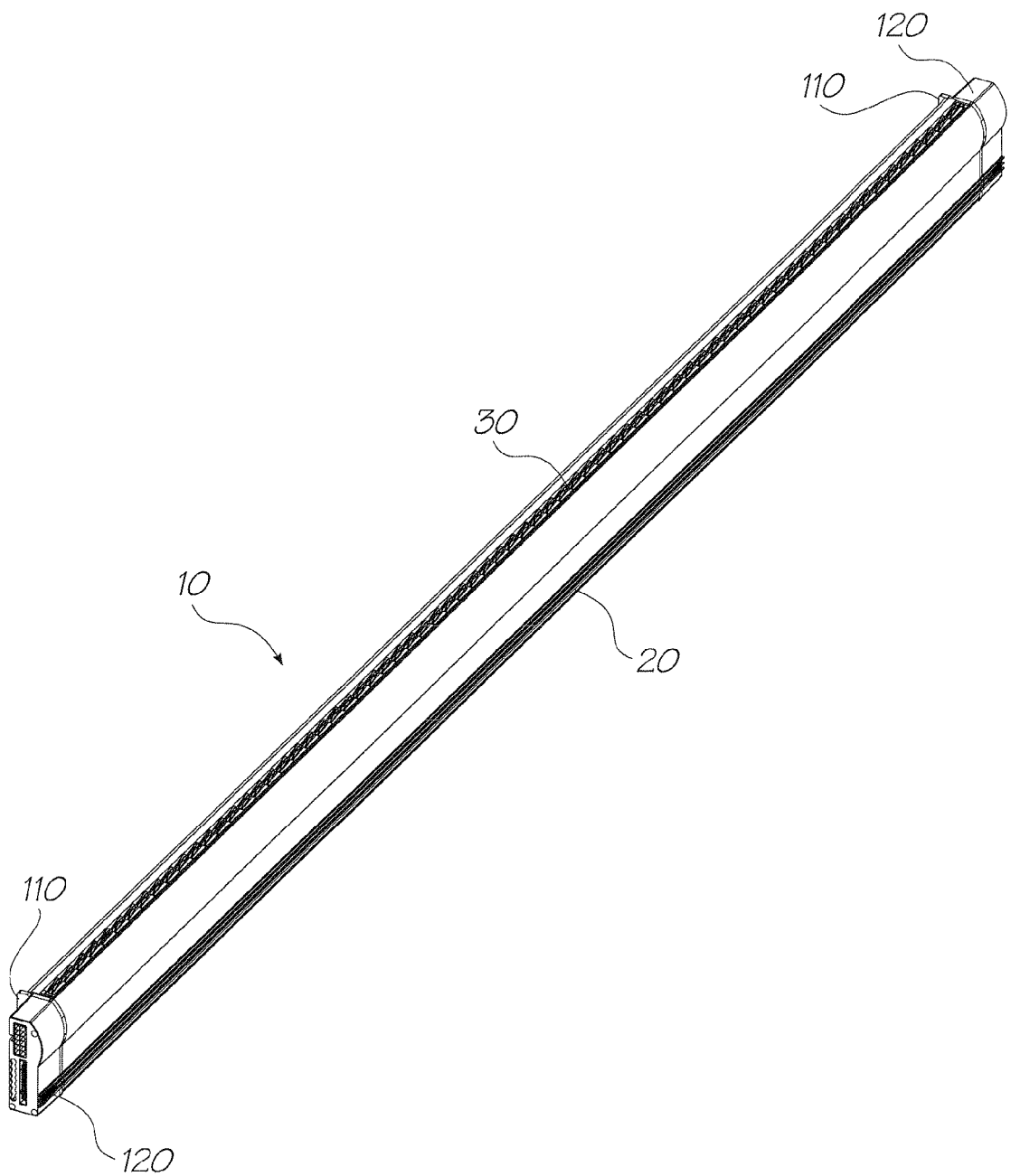
FIG. 36 shows a perspective view of the printhead assembly when in a form which uses both of the end housing and plate assemblies of FIGS. 35A and 35B.

FIG. 35B illustrates the end plate 110 and the end housing 120 which may be provided at the other end of the casing 20 of the printhead assembly 10 according to an exemplary embodiment of the present invention. The exemplary embodiment shown in FIG. 35B, for example, corresponds to a situation where an end housing is provided at both ends of the casing so as to provide power supply and/or fluid delivery connections at both ends of the printhead assembly. Such an exemplary printhead assembly is shown in FIG. 36, and corresponds, for example, to the above-mentioned exemplary application of wide format printing, in which the printhead assembly is relatively long.

Figure 37:
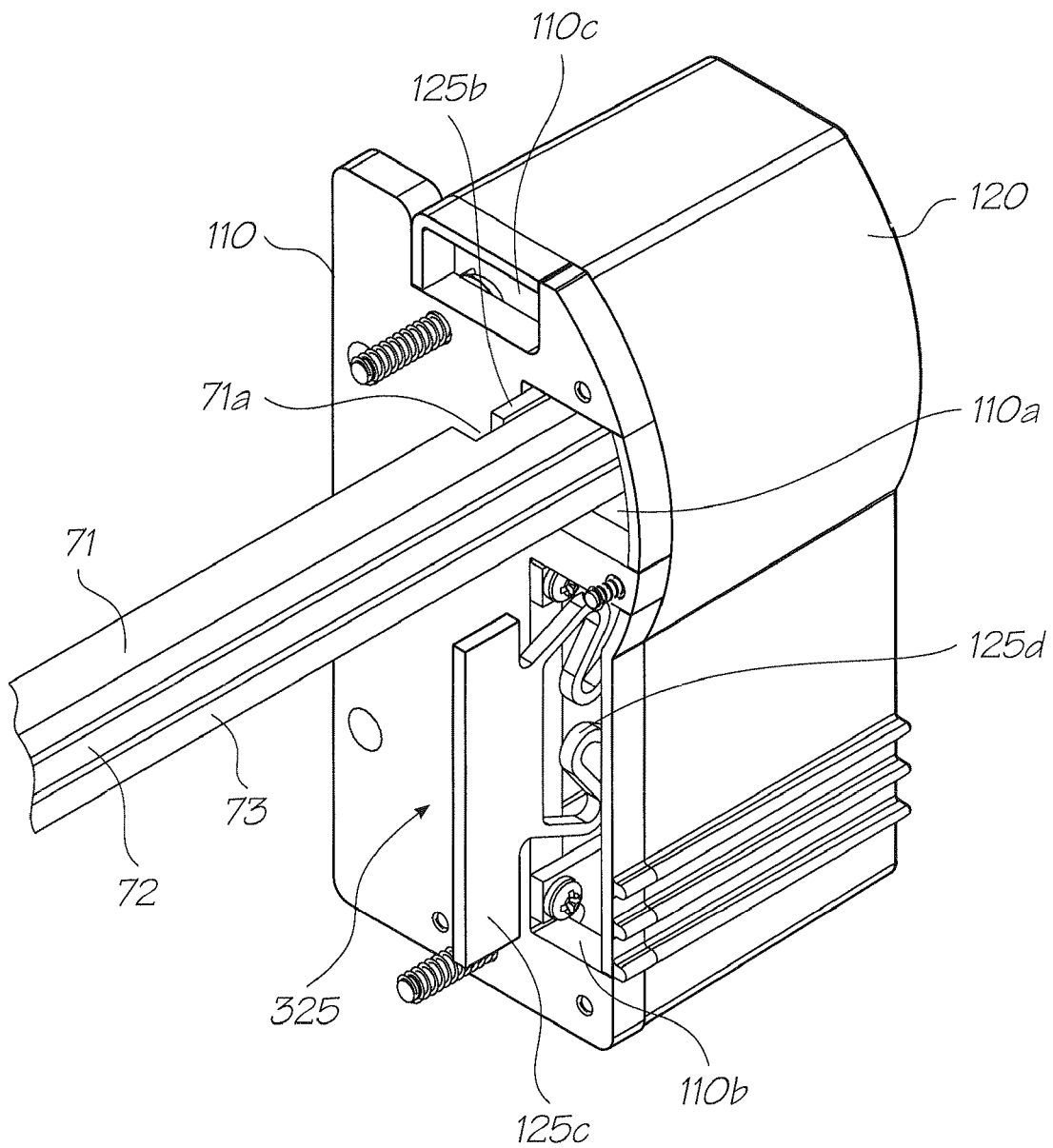
FIG. 37 illustrates a connector arrangement housed in the end housing and plate assembly of FIG. 35B.

To this end, FIG. 37 illustrates the end housing and plate assembly for the other end of the casing with the connector arrangement 125 housed therein. The busbars 71, 72 and 73 are shown attached to the connector arrangement 125 for illustration purposes. As can be seen, the busbars 71, 72 and 73 are provided with connection regions 71*a*, 72*a* and 73*a* for engagement with connector arrangement 125, similar to that shown in FIG. 31 for the connector arrangement 115. The connector arrangement 125 is illustrated in more detail in FIGS. 38A and 38B.

Figure 38A:
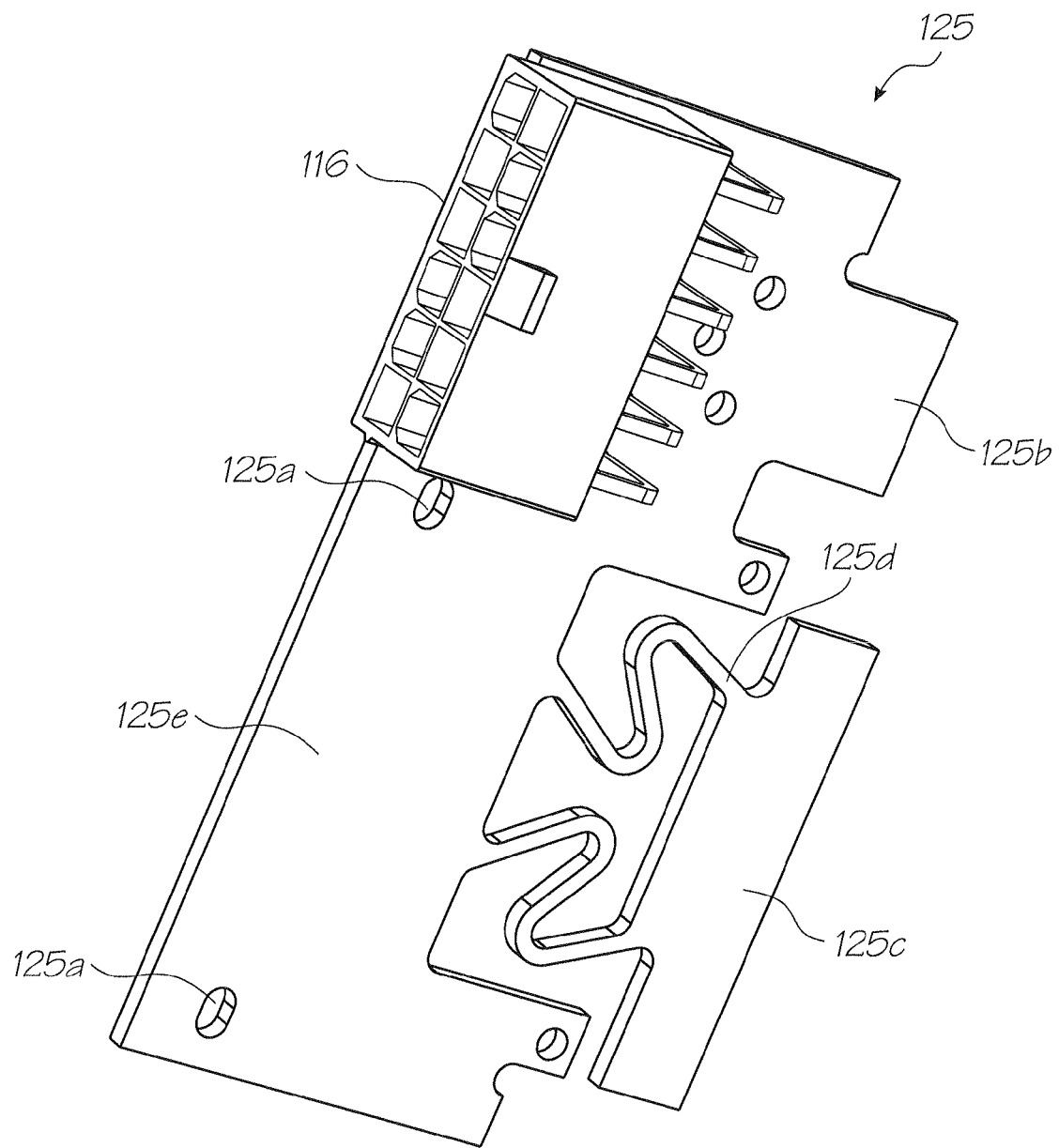
FIGS. 38A and 38B shows opposite side views of the connector arrangement of FIG. 37.
Figure 38B:
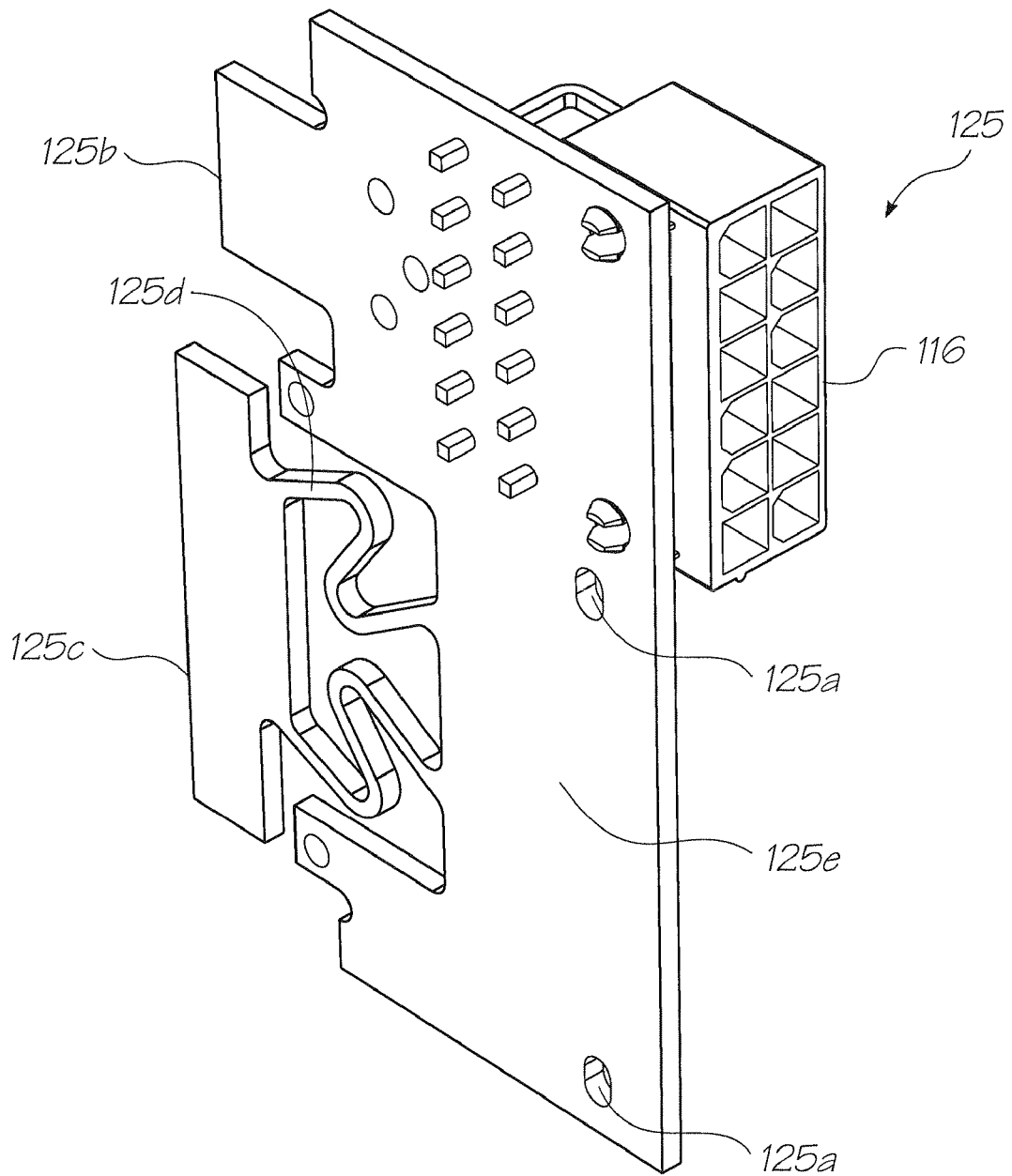

As can be seen from FIGS. 38A and 38B, like the connector arrangement 115, the connector arrangement 125 holds the power supply connection portion 116 and includes places for contact screws for contact with the busbars 71, 72 and 73, holes 125*a* for retaining the clips 118*a* of the fluid delivery portion 118 (not shown), and regions 125*b* and 125*c* for extension into the casing 20 through regions 110*a* and 110*b* of the end plate 110, respectively. However, unlike the connector arrangement 115, the connector arrangement 125 does not hold the data connection portion 117 and includes in place thereof a spring portion 125*d*.

This is because, unlike the power and fluid supply in a relatively long printhead assembly application, it is only necessary to input the driving data from one end of the printhead assembly. However, in order to input the data signals correctly to the plurality of PEC integrated circuits 100, it is necessary to terminate the data signals at the end opposite to the data input end. Therefore, the region 125*c* of the connector arrangement 125 is provided with termination regions (not shown) which correspond with the edge contacting regions on the underside of the end PCB 90 at the terminating end. These termination regions are suitably connected with the contacting regions via a connecting member 102, in the manner described above.

The purpose of the spring portion 125*d* is to maintain these terminal connections even in the event of the casing 20 expanding and contracting due to temperature variations as described previously, any effect of which may exacerbated in the longer printhead applications. The configuration of the spring portion 125*d* shown in FIGS. 38A and 38B, for example, enables the region 125*c* to be displaced through a range of distances from a body portion 125*e* of the connector arrangement 125, whilst being biased in a normal direction away from the body portion 125*e*. The spring portion is formed in the connector arrangement 125 by removing a section of the material making up the body portion 125*e*.

Thus, when the connector arrangement 125 is attached to the end plate 110, which in turn has been attached to the casing 20, the region 125*c* is brought into abutting contact with the adjacent edge of the end PCB 90 in such a manner that the spring portion 125*d* experiences a pressing force on the body of the connector arrangement 125, thereby displacing the region 125*c* from its rest position toward the body portion 125*e* by a predetermined amount. This arrangement ensures that in the event of any dimensional changes of the casing 20 via thermal expansion and contraction thereof, the data signals remain terminated at the end of the plurality of PCBs 90 opposite to the end of data signal input as follows.

The PCB supports 91 are retained on the support frame 22 of the casing 20 so as to "float" thereon, similar to the manner in which the printhead module(s) 30 "float" on the channel 21 as described earlier. Consequently, since the supports 91 and the fluid channel members 40 of the printhead modules 30 are formed of similar materials, such as LCP or the like, which have the same or similar coefficients of expansion, then in the event of any expansion and contraction of the casing 20, the supports 91 retain their relative position with the printhead module(s) 30 via the clipping of the extending arm portions 94.

Therefore, each of the supports 91 retain their adjacent connections via the connecting members 102, which is facilitated by the relatively large overlap of the connecting members 102 and the connection strips 90*a* and 90*b* of the PCBs 90 as shown in FIG. 27. Accordingly, since the PCBs 90, and therefore the supports 91 to which they are mounted, are biased towards the connector arrangement 115 by the spring portion 125*d* of the connector arrangement 125, then should the casing 20 expand and contract, any gaps which might otherwise form between the connector arrangements 115 and 125 and the end PCBs 90 are prevented, due to the action of the spring portion 125*d*.

Accommodation for any expansion and contraction is also facilitated with respect to the power supply by the connecting regions 71*a*, 72*a* and 73*a* of the two groups of busbars 70 which are used in the relatively long printhead assembly application. This is because, these connecting regions 71*a*, 72*a* and 73*a* are configured so that the overlap region between the two groups of busbars 70 allows for the relative movement of the connector arrangements 115 and 125 to which the busbars 71, 72 and 73 are attached whilst maintaining a connecting overlap in this region.

In the examples illustrated in FIGS. 30, 33B, 33C and 37, the end sections of the busbars 71, 72 and 73 are shown connected to the connector arrangements 115 and 125 (via the contact screws 116*a*, 116*b* and 116*c*) on the front surface of the connector arrangements 115 and 125 (with respect to the direction of mounting to the casing 20). Alternatively, the busbars 71, 72 and 73 can be connected at the rear surfaces of the connector arrangements 115 and 125. In such an alternative arrangement, even though the busbars 71, 72 and 73 thus connected may cause the connector arrangements 115 and 125 be slightly displaced toward the cover portion 23, the regions 115*c* and 125*c* of the connector arrangements 115 and 125 are maintained in substantially the same plane as the edge contacting regions of the end PCBs 90 due to the clip portions 112*d* of the support members 112 which retain the upper and lower side surfaces of the regions 115*c* and 125*c*.

Printed circuit boards having connecting regions printed in discrete areas may be employed as the connector arrangements 115 and 125 in order to provide the various above-described electrical connections provided thereby.

Figure 39:
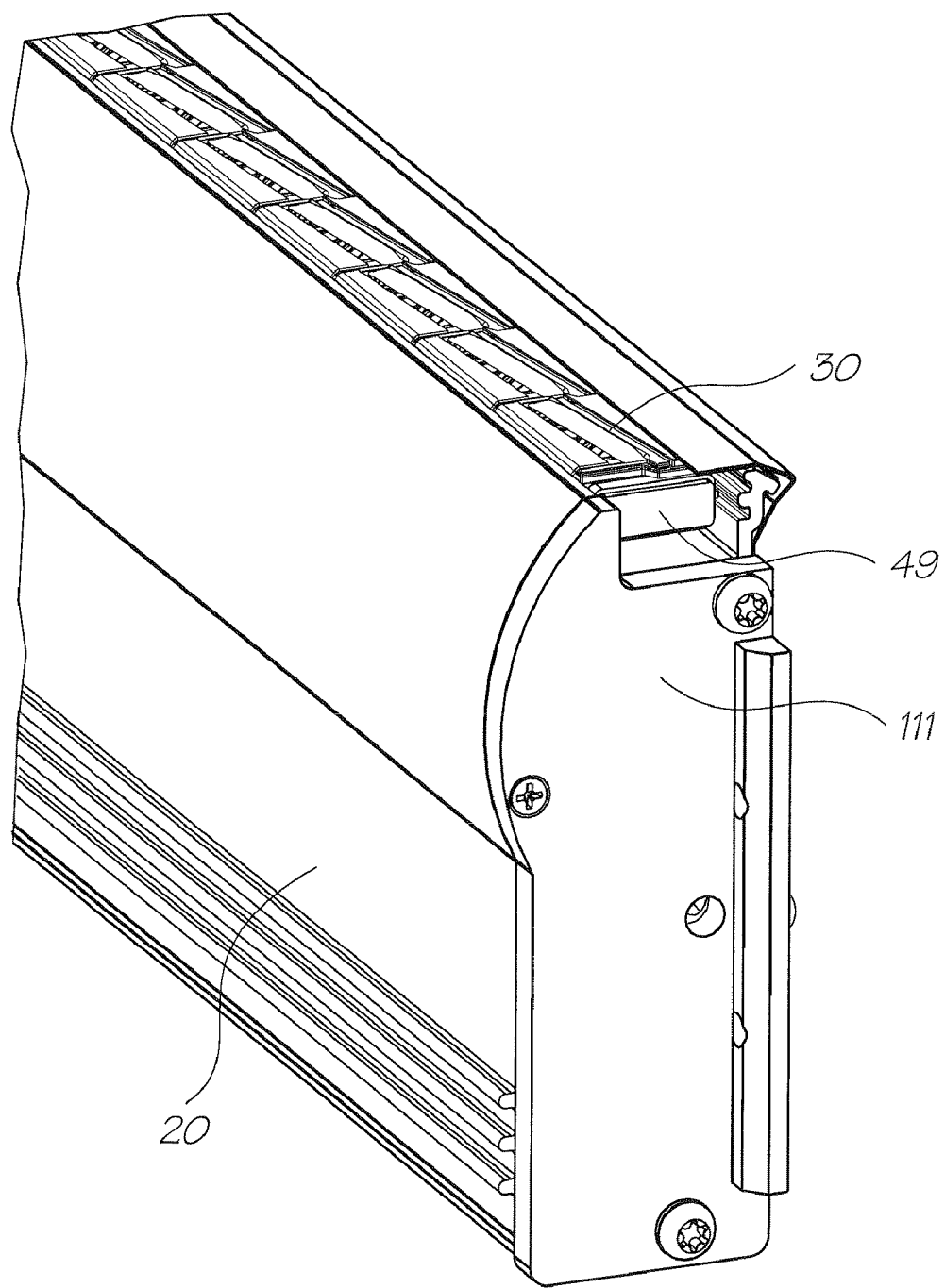
FIG. 39 illustrates an end plate when attached to the printhead assembly of FIG. 29.

FIG. 39 illustrates the end plate 111 which may be attached to the other end of the casing 20 of the printhead assembly 10 according to an exemplary embodiment of the present invention, instead of the end housing and plate assemblies shown in FIGS. 35A and 35B. This provides for a situation where the printhead assembly is not of a length which requires power and fluid to be supplied from both ends. For example, in an A4-sized printing application where a printhead assembly housing one printhead module of 16 printhead tiles may be employed.

In such a situation therefore, since it is unnecessary specifically to provide a connector arrangement at the end of the printhead module 30 which is capped by the capping member 49, then the end plate 111 can be employed which serves to securely hold the support frame 22 and cover portion 23 of the casing 20 together via screws secured to the threaded portions 22*a*, 22*b* and 23*b* thereof, in the manner already described (see also FIG. 2).

Further, if it is necessary to provide data signal termination at this end of the plurality of PCBs 90, then the end plate 111 can be provided with a slot section (not shown) on the inner surface thereof (with respect to the mounting direction on the casing 20), which can support a PCB (not shown) having termination regions which correspond with the edge contacting regions of the end PCB 90, similar to the region 125*c* of the connector arrangement 125. Also similarly, these termination regions may be suitably connected with the contacting regions via a support member 112 and a connecting member 102. This PCB may also include a spring portion between the termination regions and the end plate 111, similar to the spring portion 125d of the connector arrangement 125, in case expansion and contraction of the casing 20 may also cause connection problems in this application.

With either the attachment of the end housing 120 and plate 110 assemblies to both ends of the casing 20 or the attachment of the end housing 120 and plate 110 assembly to one end of the casing 20 and the end plate 111 to the other end, the structure of the printhead assembly according to the present invention is completed.

The thus-assembled printhead assembly can then be mounted to a printing unit to which the assembled length of the printhead assembly is applicable. Exemplary printing units to which the printhead module and printhead assembly of the present invention is applicable are as follows.

For a home office printing unit printing on A4 and letter-sized paper, a printhead assembly having a single printhead module comprising 11 printhead integrated circuits can be used to present a printhead width of 224 mm. This printing unit is capable of printing at approximately 60 pages per minute (ppm) when the nozzle speed is about 20 kHz. At this speed a maximum of about $1690 \times 10^6$ drops or about 1.6896 ml of ink is delivered per second for the entire printhead. This results in a linear printing speed of about 0.32 ms$^{-1}$ or an area printing speed of about 0.07 sqms$^{-1}$. A single PEC integrated circuit can be used to drive all 11 printhead integrated circuits, with the PEC integrated circuit calculating about 1.8 billion dots per second.

For a printing unit printing on A3 and tabloid-sized paper, a printhead assembly having a single printhead module comprising 16 printhead integrated circuits can be used to present a printhead width of 325 mm. This printing unit is capable of printing at approximately 120 ppm when the nozzle speed is about 55 kHz. At this speed a maximum of about $6758 \times 10^6$ drops or about 6.7584 ml of ink is delivered per second for the entire printhead. This results in a linear printing speed of about 0.87 ms$^{-1}$ or an area printing speed of about 0.28 sqms$^{-1}$. Four PEC integrated circuits can be used to each drive four of the printhead integrated circuits, with the PEC integrated circuits collectively calculating about 7.2 billion dots per second.

For a printing unit printing on a roll of wallpaper, a printhead assembly having one or more printhead modules providing 36 printhead integrated circuits can be used to present a printhead width of 732 mm. When the nozzle speed is about 55 kHz, a maximum of about $15206 \times 10^6$ drops or about 15.2064 ml of ink is delivered per second for the entire printhead. This results in a linear printing speed of about 0.87 ms$^{-1}$ or an area printing speed of about 0.64 sqms$^{-1}$. Nine PEC integrated circuits can be used to each drive four of the printhead integrated circuits, with the PEC integrated circuits collectively calculating about 16.2 billion dots per second.

For a wide format printing unit printing on a roll of print media, a printhead assembly having one or more printhead modules providing 92 printhead integrated circuits can be used to present a printhead width of 1869 mm. When the nozzle speed is in a range of about 15 to 55 kHz, a maximum of about $10598 \times 10^6$ to $38861 \times 10^6$ drops or about 10.5984 to 38.8608 ml of ink is delivered per second for the entire printhead. This results in a linear printing speed of about 0.24 to 0.87 ms$^{-1}$ or an area printing speed of about 0.45 to 1.63 sqms$^{-1}$. At the lower speeds, six PEC integrated circuits can be used to each drive 16 of the printhead integrated circuits (with one of the PEC integrated circuits driving 12 printhead integrated circuits), with the PEC integrated circuits collectively calculating about 10.8 billion dots per second. At the higher speeds, 23 PEC integrated circuits can be used each to drive four of the printhead integrated circuits, with the PEC integrated circuits collectively calculating about 41.4 billions dots per second.

For a "super wide" printing unit printing on a roll of print media, a printhead assembly having one or more printhead modules providing 200 printhead integrated circuits can be used to present a printhead width of 4064 mm. When the nozzle speed is about 15 kHz, a maximum of about $23040 \times 10^6$ drops or about 23.04 ml of ink is delivered per second for the entire printhead. This results in a linear printing speed of about 0.24 ms$^{-1}$ or an area printing speed of about 0.97 sqms$^{-1}$. Thirteen PEC integrated circuits can be used to each drive 16 of the printhead integrated circuits (with one of the PEC integrated circuits driving eight printhead integrated circuits), with the PEC integrated circuits collectively calculating about 23.4 billion dots per second.

For the above exemplary printing unit applications, the required printhead assembly may be provided by the corresponding standard length printhead module or built-up of several standard length printhead modules. Of course, any of the above exemplary printing unit applications may involve duplex printing with simultaneous double-sided printing, such that two printhead assemblies are used each having the number of printhead tiles given above. Further, those skilled in the art understand that these applications are merely examples and the number of printhead integrated circuits, nozzle speeds and associated printing capabilities of the printhead assembly depends upon the specific printing unit application.

Print Engine Controller

The functions and structure of the PEC integrated circuit applicable to the printhead assembly of the present invention will now be discussed with reference to FIGS. 40 to 42.

In the above-described exemplary embodiments of the present invention, the printhead integrated circuits 51 of the printhead assembly 10 are controlled by the PEC integrated circuits 100 of the drive electronics 100. One or more PEC integrated circuits 100 is or are provided in order to enable pagewidth printing over a variety of different sized pages. As described earlier, each of the PCBs 90 supported by the PCB supports 91 has one PEC integrated circuit 100 which interfaces with four of the printhead integrated circuits 51, where the PEC integrated circuit 100 essentially drives the printhead integrated circuits 51 and transfers received print data thereto in a form suitable for printing.

An exemplary PEC integrated circuit which is suited to driving the printhead integrated circuits of the present invention is described in the Applicant's co-pending U.S. patent application Ser. Nos. 09/575,108; 09/575,109; 09/575,110; 09/606,999; 09/607,985; and 09/607,990, the disclosures of which are all incorporated herein by reference.

Figure 40:
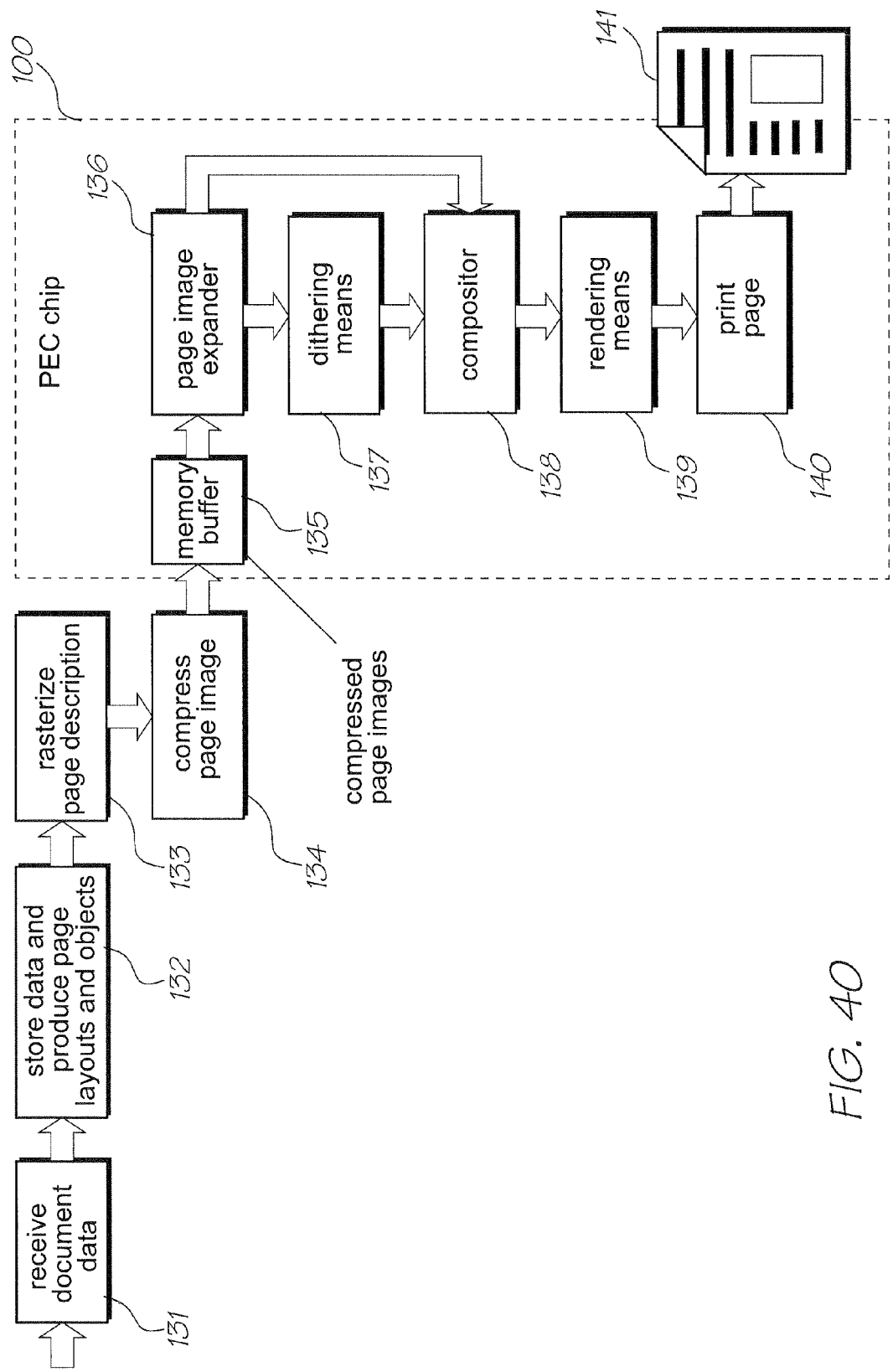
FIG. 40 illustrates data flow and functions performed by a print engine controller integrated circuit that forms one of the circuit components shown in FIG. 18A.

Referring to FIG. 40, the data flow and functions performed by the PEC integrated circuit 100 will be described for a situation where the PEC integrated circuit 100 is suited to driving a printhead assembly having a plurality of printhead modules 30. As described above, the printhead module 30 of one embodiment of the present invention utilises six channels of fluid for printing. These are:

Cyan, Magenta and Yellow (CMY) for regular colour printing;

Black (K) for black text and other black or greyscale printing;

Infrared (IR) for tag-enabled applications; and

Fixative (F) to enable printing at high speed.

As shown in FIG. 40, documents are typically supplied to the PEC integrated circuit 100 by a computer system or the like, having Raster Image Processor(s) (RIP(s)), which is programmed to perform various processing steps 131 to 134 involved in printing a document prior to transmission to the PEC integrated circuit 100. These steps typically involve receiving the document data (step 131) and storing this data in a memory buffer of the computer system (step 132), in which page layouts may be produced and any required objects may be added. Pages from the memory buffer are rasterized by the RIP (step 133) and are then compressed (step 134) prior to transmission to the PEC integrated circuit 100. Upon receiving the page data, the PEC integrated circuit 100 processes the data so as to drive the printhead integrated circuits 51.

Due to the page-width nature of the printhead assembly of the present invention, each page must be printed at a constant speed to avoid creating visible artifacts. This means that the printing speed cannot be varied to match the input data rate. Document rasterization and document printing are therefore decoupled to ensure the printhead assembly has a constant supply of data. In this arrangement, a page is not printed until it is fully rasterized, and in order to achieve a high constant printing speed a compressed version of each rasterized page image is stored in memory. This decoupling also allows the RIP(s) to run ahead of the printer when rasterizing simple pages, buying time to rasterize more complex pages.

Because contone colour images are reproduced by stochastic dithering, but black text and line graphics are reproduced directly using dots, the compressed page image format contains a separate foreground bi-level black layer and background contone colour layer. The black layer is composited over the contone layer after the contone layer is dithered (although the contone layer has an optional black component). If required, a final layer of tags (in IR or black ink) is optionally added to the page for printout.

Dither matrix selection regions in the page description are rasterized to a contone-resolution bi-level bitmap which is losslessly compressed to negligible size and which forms part of the compressed page image. The IR layer of the printed page optionally contains encoded tags at a programmable density.

As described above, the RIP software/hardware rasterizes each page description and compresses the rasterized page image. Each compressed page image is transferred to the PEC integrated circuit 100 where it is then stored in a memory buffer 135. The compressed page image is then retrieved and fed to a page image expander 136 in which page images are retrieved. If required, any dither may be applied to any contone layer by a dithering means 137 and any black bi-level layer may be composited over the contone layer by a compositor 138 together with any infrared tags which may be rendered by the rendering means 139. Returning to a description of process steps, the PEC integrated circuit 100 then drives the printhead integrated circuits 51 to print the composited page data at step 140 to produce a printed page 141.

In this regard, the process performed by the PEC integrated circuit 100 can be considered to consist of a number of distinct stages. The first stage has the ability to expand a JPEG-compressed contone CMYK layer, a Group 4 Fax-compressed bi-level dither matrix selection map, and a Group 4 Fax-compressed bi-level black layer, all in parallel. In parallel with this, bi-level IR tag data can be encoded from the compressed page image. The second stage dithers the contone CMYK layer using a dither matrix selected by a dither matrix select map, composites the bi-level black layer over the resulting bi-level K layer and adds the IR layer to the page. A fixative layer is also generated at each dot position wherever there is a need in any of the C, M, Y, K, or IR channels. The last stage prints the bi-level CMYK+IR data through the printhead assembly.

Figure 41:
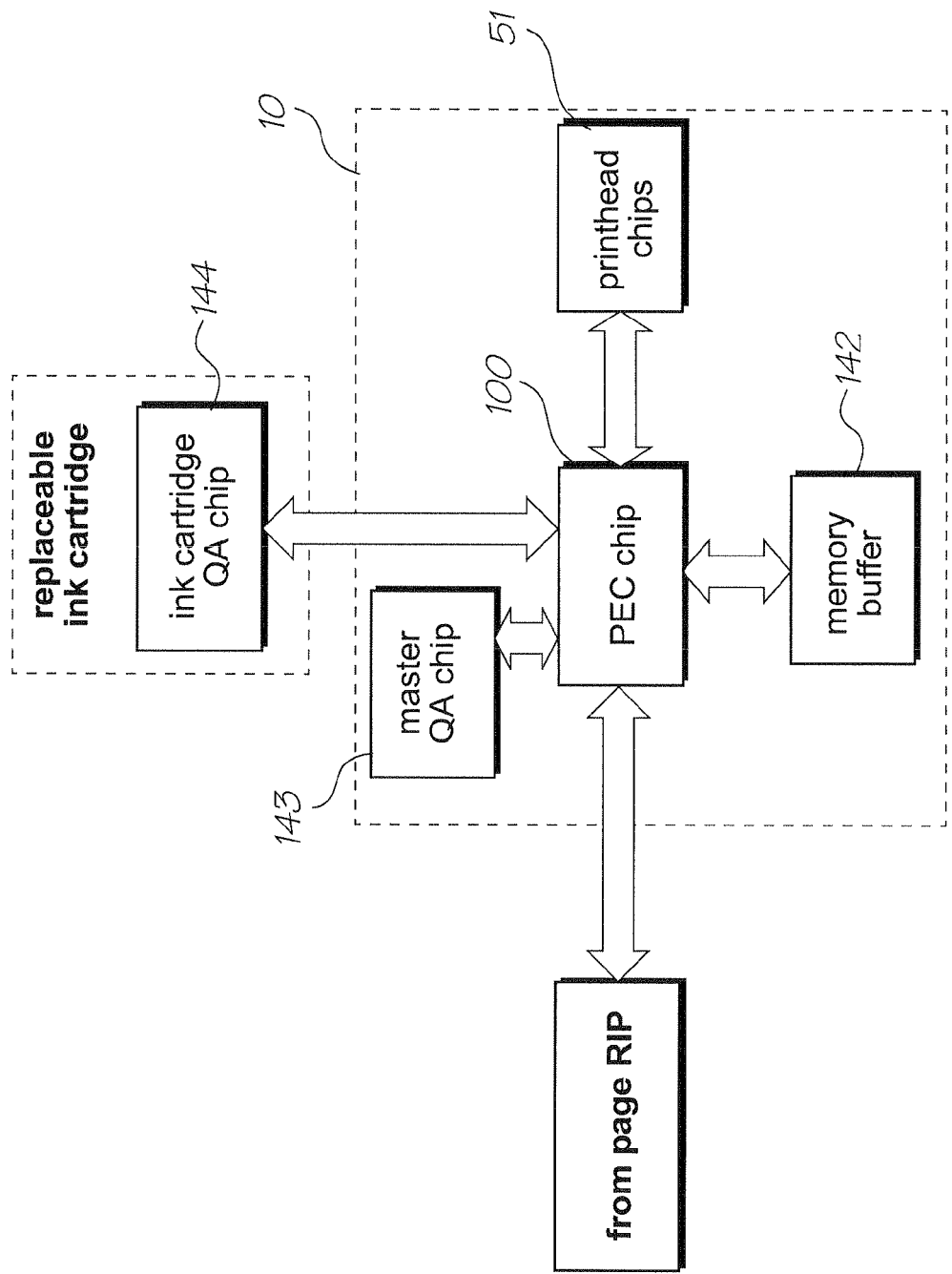
FIG. 41 illustrates the print engine controller integrated circuit of FIG. 40 in the context of an overall printing system architecture.
Figure 42:
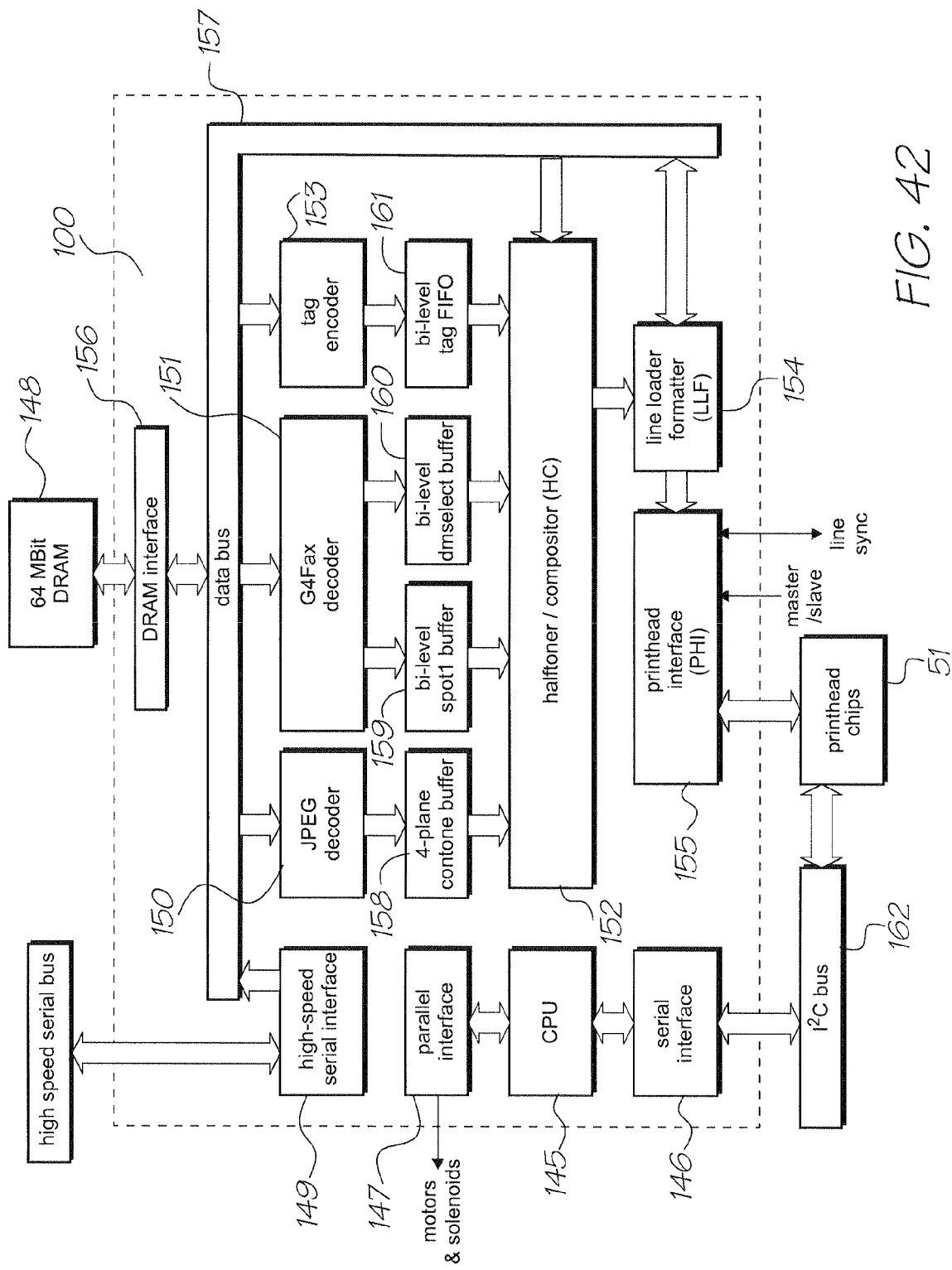
FIG. 42 illustrates the architecture of the print engine controller integrated circuit of FIG. 41.

FIG. 41 shows an exemplary embodiment of the printhead assembly of the present invention including the PEC integrated circuit(s) 100 in the context of the overall printing system architecture. As shown, the various components of the printhead assembly includes:

a PEC integrated circuit 100 which is responsible for receiving the compressed page images for storage in a memory buffer 142, performing the page expansion, black layer compositing and sending the dot data to the printhead integrated circuits 51. The PEC integrated circuit 100 may also communicate with a master Quality Assurance (QA) integrated circuit 143 and a (replaceable) ink cartridge QA integrated circuit 144, and provides a means of retrieving the printhead assembly characteristics to ensure optimum printing;

the memory buffer 142 for storing the compressed page image and for scratch use during the printing of a given page. The construction and working of memory buffers is known to those skilled in the art and a range of standard integrated circuits and techniques for their use might be utilized in use of the PEC integrated circuit(s) 100; and the master integrated circuit 143 which is matched to the replaceable ink cartridge QA integrated circuit 144. The construction and working of QA integrated circuits is known to those skilled in the art and a range of known QA processes might be utilized in use of the PEC integrated circuit(s) 100;

As mentioned in part above, the PEC integrated circuit 100 of the present invention essentially performs four basic levels of functionality:

receiving compressed pages via a serial interface such as an IEEE 1394;

acting as a print engine for producing a page from a compressed form. The print engine functionality includes expanding the page image, dithering the contone layer, compositing the black layer over the contone layer, optionally adding infrared tags, and sending the resultant image to the printhead integrated circuits;

acting as a print controller for controlling the printhead integrated circuits and stepper motors of the printing system; and serving as two standard low-speed serial ports for communication with the two QA integrated circuits. In this regard, two ports are used, and not a single port, so as to ensure strong security during authentication procedures.

These functions are now described in more detail with reference to FIG. 42 which provides a more specific illustration of the PEC integrated circuit architecture according to an exemplary embodiment of the present invention.

The PEC integrated circuit 100 incorporates a simple micro-controller CPU core 145 to perform the following functions:

perform QA integrated circuit authentication protocols via a serial interface 146 between print pages;

run the stepper motor of the printing system via a parallel interface 147 during printing to control delivery of the paper to the printhead integrated circuits 51 for printing (the stepper motor requires a 5 KHz process);

synchronize the various components of the PEC integrated circuit 100 during printing;

provide a means of interfacing with external data requests (programming registers etc.);

provide a means of interfacing with the corresponding printhead module's low-speed data requests (such as reading the characterization vectors and writing pulse profiles); and provide a means of writing the portrait and landscape tag structures to an external DRAM 148.

In order to perform the page expansion and printing process, the PEC integrated circuit 100 includes a high-speed serial interface 149 (such as a standard IEEE 1394 interface), a standard JPEG decoder 150, a standard Group 4 Fax decoder 151, a custom halftoner/compositor (HC) 152, a custom tag encoder 153, a line loader/formatter (LLF) 154, and a printhead interface 155 (PHI) which communicates with the printhead integrated circuits 51. The decoders 150 and 151 and the tag encoder 153 are buffered to the HC 152. The tag encoder 153 establishes an infrared tag(s) to a page according to protocols dependent on what uses might be made of the page.

The print engine function works in a double-buffered manner. That is, one page is loaded into the external DRAM 148 via a DRAM interface 156 and a data bus 157 from the high-speed serial interface 149, while the previously loaded page is read from the DRAM 148 and passed through the print engine process. Once the page has finished printing, then the page just loaded becomes the page being printed, and a new page is loaded via the high-speed serial interface 149.

At the aforementioned first stage, the process expands any JPEG-compressed contone (CMYK) layers, and expands any of two Group 4 Fax-compressed bi-level data streams. The two streams are the black layer (although the PEC integrated circuit 100 is actually colour agnostic and this bi-level layer can be directed to any of the output inks) and a matte for selecting between dither matrices for contone dithering. At the second stage, in parallel with the first, any tags are encoded for later rendering in either IR or black ink.

Finally, in the third stage the contone layer is dithered, and position tags and the bi-level spot layer are composited over the resulting bi-level dithered layer. The data stream is ideally adjusted to create smooth transitions across overlapping segments in the printhead assembly and ideally it is adjusted to compensate for dead nozzles in the printhead assembly. Up to six channels of bi-level data are produced from this stage.

However, it will be understood by those skilled in the art that not all of the six channels need be present on the printhead module 30. For example, the printhead module 30 may provide for CMY only, with K pushed into the CMY channels and IR ignored. Alternatively, the position tags may be printed in K if IR ink is not available (or for testing purposes). The resultant bi-level CMYK-IR dot-data is buffered and formatted for printing with the printhead integrated circuits 51 via a set of line buffers (not shown). The majority of these line buffers might be ideally stored on the external DRAM 148. In the final stage, the six channels of bi-level dot data are printed via the PHI 155.

The HC 152 combines the functions of halftoning the contone (typically CMYK) layer to a bi-level version of the same, and compositing the spot1 bi-level layer over the appropriate halftoned contone layer(s). If there is no K ink, the HC 152 is able to map K to CMY dots as appropriate. It also selects between two dither matrices on a pixel-by-pixel basis, based on the corresponding value in the dither matrix select map. The input to the HC 152 is an expanded contone layer (from the JPEG decoder 146) through a buffer 158, an expanded bi-level spot1 layer through a buffer 159, an expanded dither-matrix-select bitmap at typically the same resolution as the contone layer through a buffer 160, and tag data at full dot resolution through a buffer (FIFO) 161.

The HC 152 uses up to two dither matrices, read from the external DRAM 148. The output from the HC 152 to the LLF 154 is a set of printer resolution bi-level image lines in up to six colour planes. Typically, the contone layer is CMYK or CMY, and the bi-level spot1 layer is K. Once started, the HC 152 proceeds until it detects an "end-of-page" condition, or until it is explicitly stopped via its control register (not shown).

The LLF 154 receives dot information from the HC 152, loads the dots for a given print line into appropriate buffer storage (some on integrated circuit (not shown) and some in the external DRAM 148) and formats them into the order required for the printhead integrated circuits 51. Specifically, the input to the LLF 154 is a set of six 32-bit words and a DataValid bit, all generated by the HC 152. The output of the LLF 154 is a set of 190 bits representing a maximum of 15 printhead integrated circuits of six colours. Not all the output bits may be valid, depending on how many colours are actually used in the printhead assembly.

The physical placement of the nozzles on the printhead assembly of an exemplary embodiment of the present invention is in two offset rows, which means that odd and even dots of the same colour are for two different lines. The even dots are for line L, and the odd dots are for line L-2. In addition, there is a number of lines between the dots of one colour and the dots of another. Since the six colour planes for the same dot position are calculated at one time by the HC 152, there is a need to delay the dot data for each of the colour planes until the same dot is positioned under the appropriate colour nozzle. The size of each buffer line depends on the width of the printhead assembly. Since a single PEC integrated circuit 100 can generate dots for up to 15 printhead integrated circuits 51, a single odd or even buffer line is therefore 15 sets of 640 dots, for a total of 9600 bits (1200 bytes). For example, the buffers required for six colour odd dots totals almost 45 KBytes.

The PHI 155 is the means by which the PEC integrated circuit 100 loads the printhead integrated circuits 51 with the dots to be printed, and controls the actual dot printing process. It takes input from the LLF 154 and outputs data to the printhead integrated circuits 51. The PHI 155 is capable of dealing with a variety of printhead assembly lengths and formats. The internal structure of the PHI 155 allows for a maximum of six colours, eight printhead integrated circuits 51 per transfer, and a maximum of two printhead integrated circuit 51 groups which is sufficient for a printhead assembly having 15 printhead integrated circuits 51 (8.5 inch) printing system capable of printing on A4/Letter paper at full speed.

A combined characterization vector of the printhead assembly 10 can be read back via the serial interface 146. The characterization vector may include dead nozzle information as well as relative printhead module alignment data. Each printhead module can be queried via its low-speed serial bus 162 to return a characterization vector of the printhead module. The characterization vectors from multiple printhead modules can be combined to construct a nozzle defect list for the entire printhead assembly and allows the PEC integrated circuit 100 to compensate for defective nozzles during printing. As long as the number of defective nozzles is low, the compensation can produce results indistinguishable from those of a printhead assembly with no defective nozzles.

Fluid Distribution Stack

An exemplary structure of the fluid distribution stack of the printhead tile will now be described with reference to FIG. 43.

Figure 43:
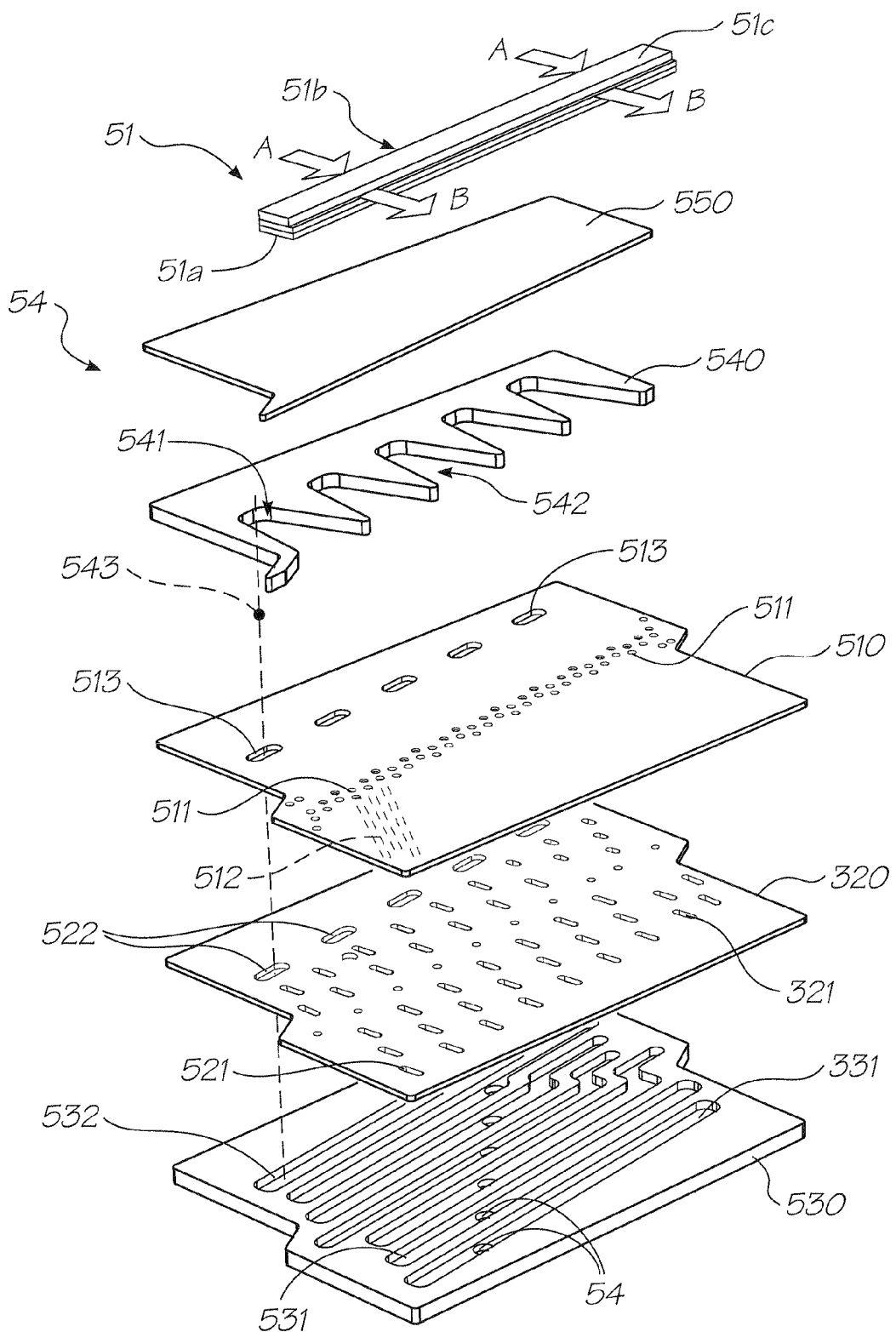
FIG. 43 shows an exploded view of a fluid distribution stack of elements that form the printhead tile of FIG. 5A.

FIG. 43 shows an exploded view of the fluid distribution stack 500 with the printhead integrated circuit 51 also shown in relation to the stack 500. In the exemplary embodiment shown in FIG. 43, the stack 500 includes three layers, an upper layer 510, a middle layer 520 and a lower layer 530, and further includes a channel layer 540 and a plate 550 which are provided in that order on top of the upper layer 510. Each of the layers 510, 520 and 530 are formed as stainless-steel or micro-moulded plastic material sheets.

The printhead integrated circuit 51 is bonded onto the upper layer 510 of the stack 500, so as to overlie an array of holes 511 etched therein, and therefore to sit adjacent the stack of the channel layer 540 and the plate 550. The printhead integrated circuit 51 itself is formed as a multi-layer stack of silicon which has fluid channels (not shown) in a bottom layer 51a. These channels are aligned with the holes 511 when the printhead integrated circuit 51 is mounted on the stack 500. In one embodiment of the present invention, the printhead integrated circuits 51 are approximately 1 mm in width and 21 mm in length. This length is determined by the width of the field of a stepper which is used to fabricate the printhead integrated circuit 51. Accordingly, the holes 511 are arranged to conform to these dimensions of the printhead integrated circuit 51.

The upper layer 510 has channels 512 etched on the underside thereof (FIG. 43 shows only some of the channels 512 as hidden detail). The channels 512 extend as shown so that their ends align with holes 521 of the middle layer 520. Different ones of the channels 512 align with different ones of the holes 521. The holes 521, in turn, align with channels 531 in the lower layer 530.

Each of the channels 531 carries a different respective colour or type of ink, or fluid, except for the last channel, designated with the reference numeral 532. The last channel 532 is an air channel and is aligned with further holes 522 of the middle layer 520, which in turn are aligned with further holes 513 of the upper layer 510. The further holes 513 are aligned with inner sides 541 of slots 542 formed in the channel layer 540, so that these inner sides 541 are aligned with, and therefore in fluid-flow communication with, the air channel 532, as indicated by the dashed line 543.

The lower layer 530 includes the inlet ports 54 of the printhead tile 50, with each opening into the corresponding ones of the channels 531 and 532.

In order to feed air to the printhead integrated circuit surface, compressed filtered air from an air source (not shown) enters the air channel 532 through the corresponding inlet port 54 and passes through the holes 522 and 513 and then the slots 542 in the middle layer 520, the upper layer 510 and the channel layer 540, respectively. The air enters into a side surface 51b of the printhead integrated circuit 51 in the direction of arrows A and is then expelled from the printhead integrated circuit 51 substantially in the direction of arrows B. A nozzle guard 51c may be further arranged on a top surface of the printhead integrated circuit 51 partially covering the nozzles to assist in keeping the nozzles clear of print media dust.

In order to feed different colour and types of inks and other fluids (not shown) to the nozzles, the different inks and fluids enter through the inlet ports 54 into the corresponding ones of the channels 531, pass through the corresponding holes 521 of the middle layer 520, flow along the corresponding channels 512 in the underside of the upper layer 510, pass through the corresponding holes 511 of the upper layer 510, and then finally pass through the slots 542 of the channel layer 540 to the printhead integrated circuit 51, as described earlier.

In traversing this path, the flow diameters of the inks and fluids are gradually reduced from the macro-sized flow diameter at the inlet ports 54 to the required micro-sized flow diameter at the nozzles of the printhead integrated circuit 51.

The exemplary embodiment of the fluid distribution stack shown in FIG. 43 is arranged to distribute seven different fluids to the printhead integrated circuit, including air, which is in conformity with the earlier described exemplary embodiment of the ducts of the fluid channel member. However, it will be understood by those skilled in the art that a greater or lesser number of fluids may be used depending on the specific printing application, and therefore the fluid distribution stack can be configured as necessary.

Nozzles and Actuators

Exemplary nozzle arrangements which are suitable for the printhead assembly of the present invention are described in the Applicant's following co-pending and granted applications:

U.S. Pat. Nos. 6,188,415; 6,209,989; 6,213,588; 6,213,589; 6,217,153; 6,220,694; 6,227,652; 6,227,653; 6,227,654; 6,231,163; 6,234,609; 6,234,610; 6,234,611; 6,238,040; 6,338,547; 6,239,821; 6,241,342; 6,243,113; 6,244,691; 6,247,790; 6,247,791; 6,247,792; 6,247,793; 6,247,794; 6,247,795; 6,247,796; 6,254,220; 6,257,704; 6,257,705; 6,260,953; 6,264,306; 6,264,307; 6,267,469; 6,283,581; 6,283,582; 6,293,653; 6,302,528; 6,312,107; 6,336,710; 6,362,843; 6,390,603; 6,394,581; 6,416,167; 6,416,168; 6,557,977; 6,273,544; 6,299,289; 6,299,290; 6,309,048; 6,378,989; 6,420,196; 6,425,654; 6,439,689; 6,443,558; 6,634,735; 6,848,181; 6,623,101; 6,406,129; 6,457,809; 6,457,812; 6,505,916; 6,550,895; 6,428,133; 6,305,788; 6,315,399; 6,322,194; 6,322,195; 6,328,425; 6,328,431; 6,338,548; 6,364,453; 6,383,833; 6,390,591; 6,390,605; 6,417,757; 6,425,971; 6,426,014; 6,428,139; 6,428,142; 6,439,693; 6,439,908; 6,457,795; 6,502,306; 6,565,193; 6,588,885; 6,595,624; 6,460,778; 6,464,332; 6,478,406; 6,480,089; 6,540,319; 6,575,549; 6,609,786; 6,609,787; 6,612,110; 6,623,106; 6,629,745; 6,652,071; 6,659,590, U.S. patent application Ser. Nos. 09/575,127; 09/575,152; U.S. Pat. Nos. 6,328,417; 6,382,779; U.S. patent application Ser. Nos. 09/608,780; 09/693,079; U.S. Pat. Nos. 6,854,825; 6,684,503; 6,672,707; 6,793,323; 6,676,245; U.S. patent application Ser. Nos. 10/407,207; 10/407,212; 10/683,064 10/683,041, U.S. Pat. Nos. 6,755,509; 6,719,406; 6,824,246; 6,736,489; 6,820,967; 6,669,333; U.S. patent application Ser. No. 10/302,668; U.S. Pat. Nos. 6,692,108; 6,669,334; U.S. patent application Ser. No. 10/303,348; U.S. Pat. Nos. 6,672,709; 6,672,710, U.S. application Ser. Nos. 10/728,804; 10/728,952; 10/728,806; 10/728,834; 10/728,790; 10/728,884; 10/728,970; 10/728,784; 10/728,783; 10/728,925; U.S. Pat. No. 6,962,402, U.S. patent application Ser. Nos. 10/728,803; 10/728,780 and 10/728,779, the disclosures of which are all incorporated herein by reference.

Figure 44:
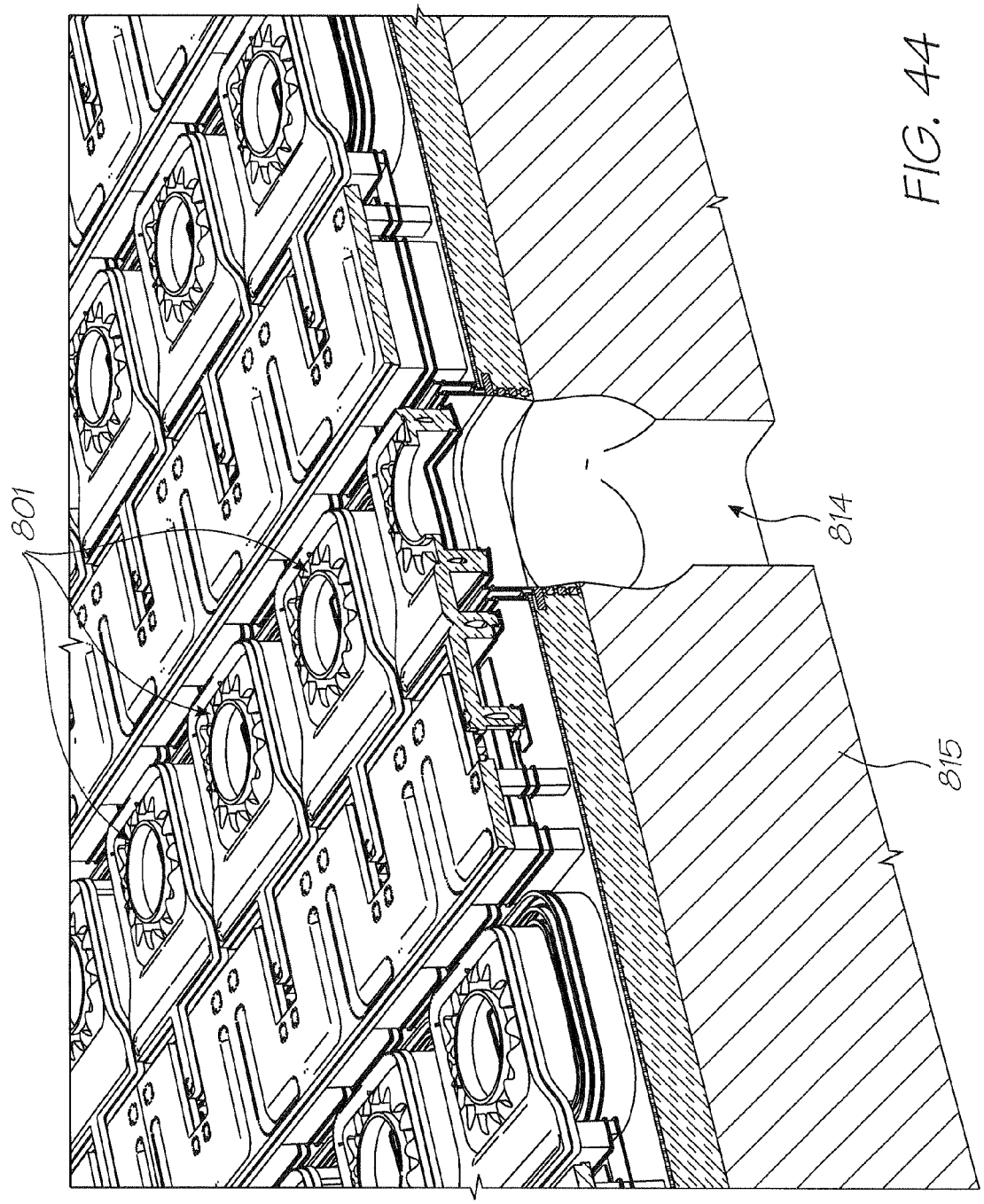
FIG. 44 shows a perspective view (partly in section) of a portion of a nozzle system of a printhead integrated circuit that is incorporated in the printhead module of the printhead assembly of FIG. 1.

Of these, an exemplary nozzle arrangement will now be described with reference to FIGS. 44 to 53. One nozzle arrangement which is incorporated in each of the printhead integrated circuits 51 mounted on the printhead tiles 50 (see FIG. 5A) includes a nozzle and corresponding actuator. FIG. 44 shows an array of the nozzle arrangements 801 formed on a silicon substrate 815. The nozzle arrangements are identical, but in one embodiment, different nozzle arrangements are fed with different coloured inks and fixative. It will be noted that rows of the nozzle arrangements 801 are staggered with respect to each other, allowing closer spacing of ink dots during printing than would be possible with a single row of nozzles. The multiple rows also allow for redundancy (if desired), thereby allowing for a predetermined failure rate per nozzle.

Each nozzle arrangement 801 is the product of an integrated circuit fabrication technique. As illustrated, the nozzle arrangement 801 is constituted by a micro-electromechanical system (MEMS).

For clarity and ease of description, the construction and operation of a single nozzle arrangement 801 will be described with reference to FIGS. 45 to 53.

Each printhead integrated circuit 51 includes a silicon wafer substrate 815. 0.42 Micron 1 P4M 12 volt CMOS microprocessing circuitry is positioned on the silicon wafer substrate 815.

A silicon dioxide (or alternatively glass) layer 817 is positioned on the wafer substrate 815. The silicon dioxide layer 817 defines CMOS dielectric layers. CMOS top-level metal defines a pair of aligned aluminium electrode contact layers 830 positioned on the silicon dioxide layer 817. Both the silicon wafer substrate 815 and the silicon dioxide layer 817 are etched to define an ink inlet channel 814 having a generally circular cross section (in plan). An aluminium diffusion barrier 828 of CMOS metal 1, CMOS metal 2/3 and CMOS top level metal is positioned in the silicon dioxide layer 817 about the ink inlet channel 814. The diffusion barrier 828 serves to inhibit the diffusion of hydroxyl ions through CMOS oxide layers of the drive circuitry layer 817.

A passivation layer in the form of a layer of silicon nitride 831 is positioned over the aluminium contact layers 830 and the silicon dioxide layer 817. Each portion of the passivation layer 831 positioned over the contact layers 830 has an opening 832 defined therein to provide access to the contacts 830.

Figure 45:
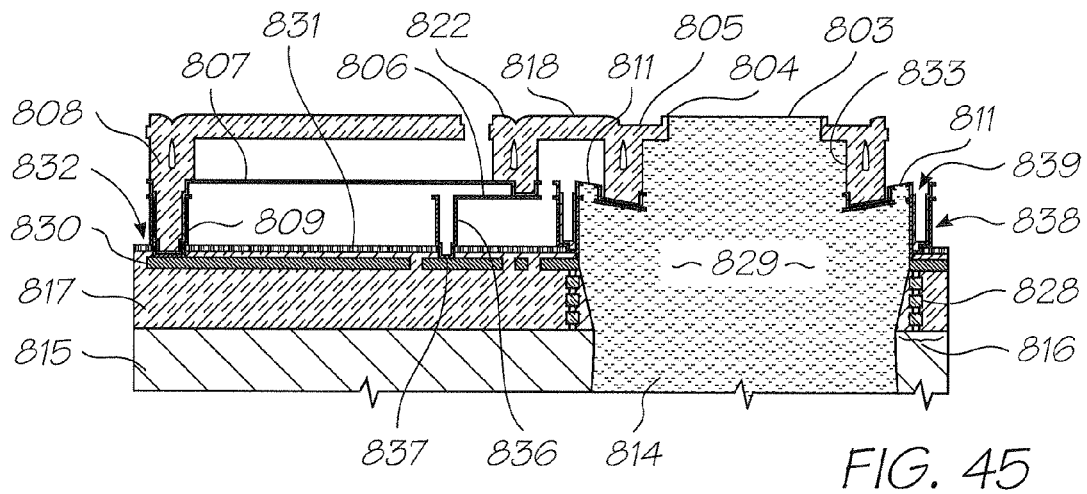
FIG. 45 shows a vertical sectional view of a single nozzle (of the nozzle system shown in FIG. 44) in a quiescent state.

The nozzle arrangement 801 includes a nozzle chamber 829 defined by an annular nozzle wall 833, which terminates at an upper end in a nozzle roof 834 and a radially inner nozzle rim 804 that is circular in plan. The ink inlet channel 814 is in fluid communication with the nozzle chamber 829. At a lower end of the nozzle wall, there is disposed a movable rim 810, that includes a movable seal lip 840. An encircling wall 838 surrounds the movable nozzle, and includes a stationary seal lip 839 that, when the nozzle is at rest as shown in FIG. 45, is adjacent the moving rim 810. A fluidic seal 811 is formed due to the surface tension of ink trapped between the stationary seal lip 839 and the moving seal lip 840. This prevents leakage of ink from the chamber whilst providing a low resistance coupling between the encircling wall 838 and the nozzle wall 833.

Figure 52:
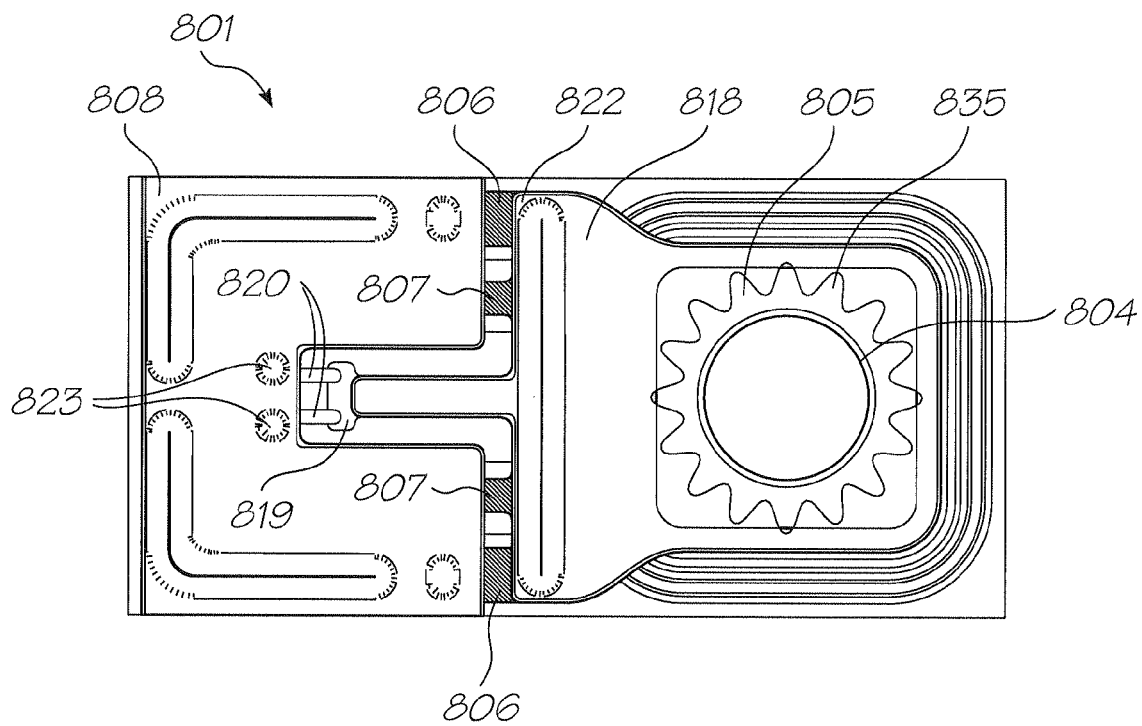
FIG. 52 shows a plan view of the nozzle of FIG. 45.
Figure 53:
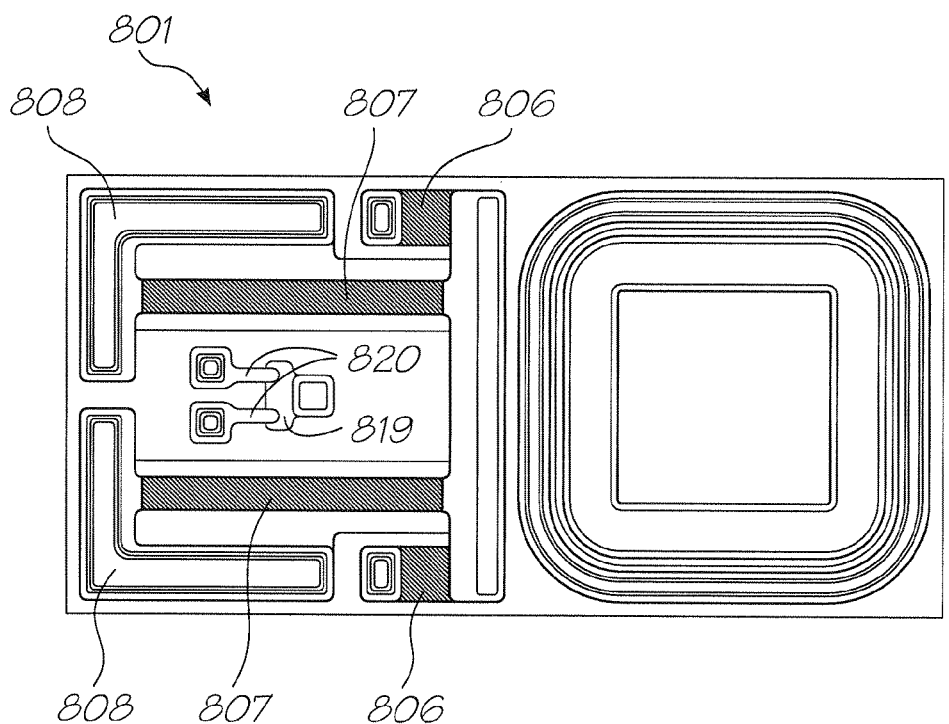
FIG. 53 shows a plan view of the nozzle of FIG. 45 with lever arm and movable nozzle portions omitted.

As best shown in FIG. 52, a plurality of radially extending recesses 835 is defined in the roof 834 about the nozzle rim 804. The recesses 835 serve to contain radial ink flow as a result of ink escaping past the nozzle rim 804.

The nozzle wall 833 forms part of a lever arrangement that is mounted to a carrier 836 having a generally U-shaped profile with a base 837 attached to the layer 831 of silicon nitride.

Figure 48:
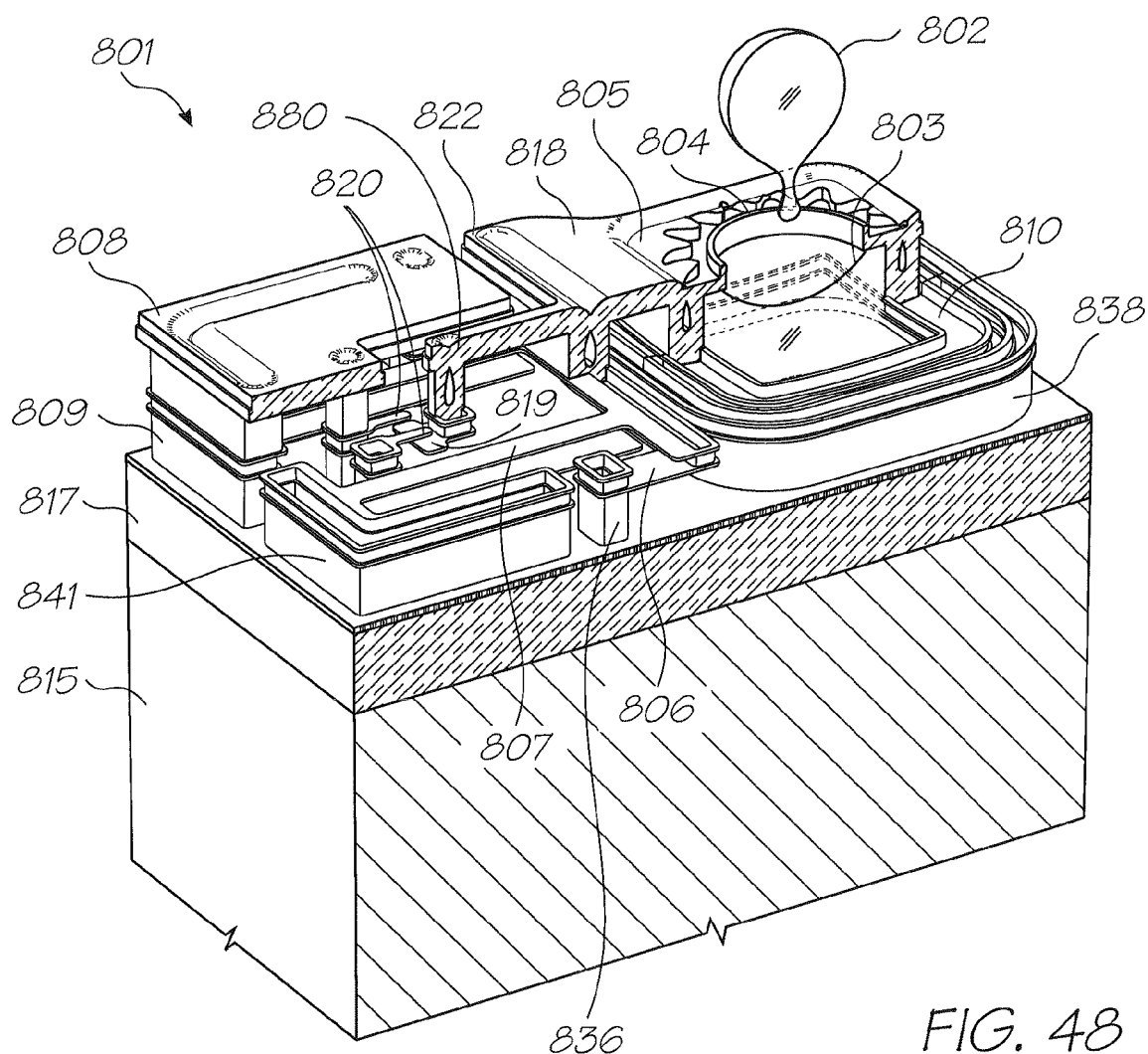
FIG. 48 shows in perspective a partial vertical sectional view of the nozzle of FIG. 45, at the actuation state shown in FIG. 46.
Figure 49:
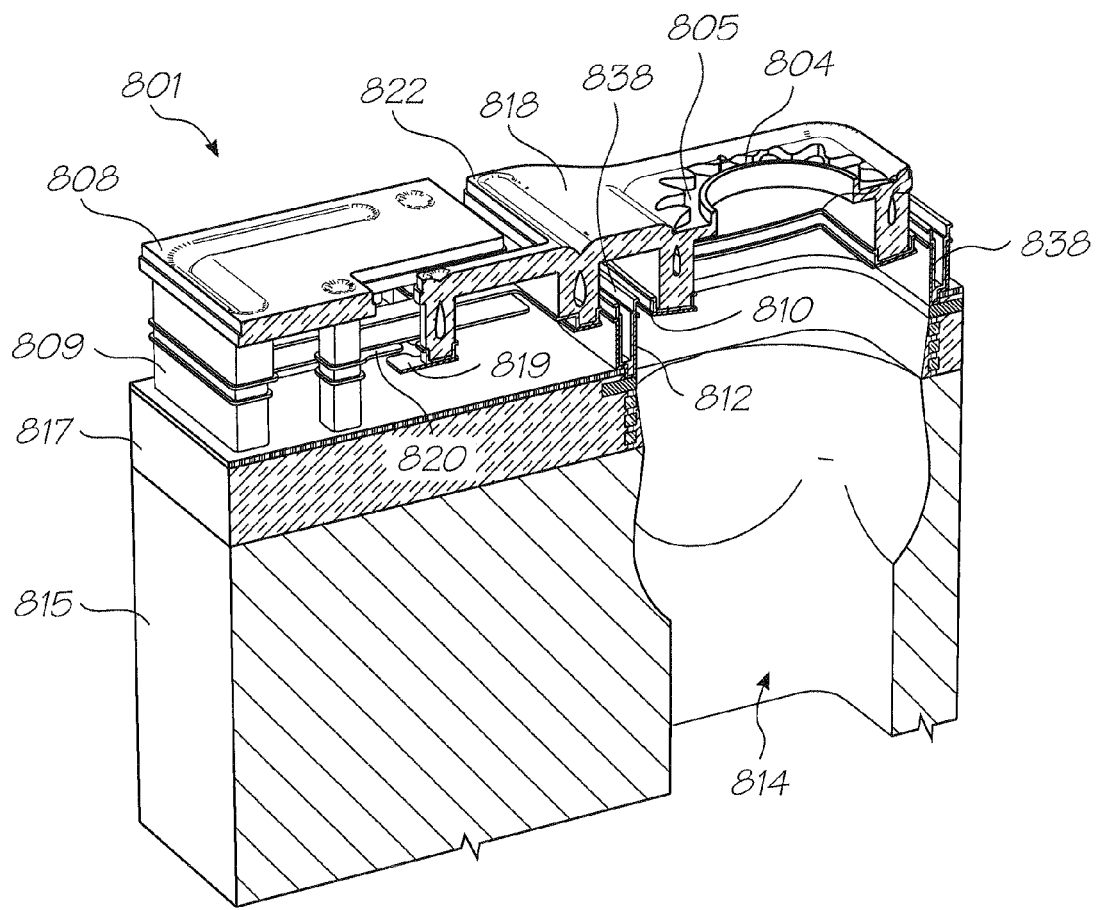
FIG. 49 shows in perspective a vertical section of the nozzle of FIG. 45, with ink omitted.
Figure 50:
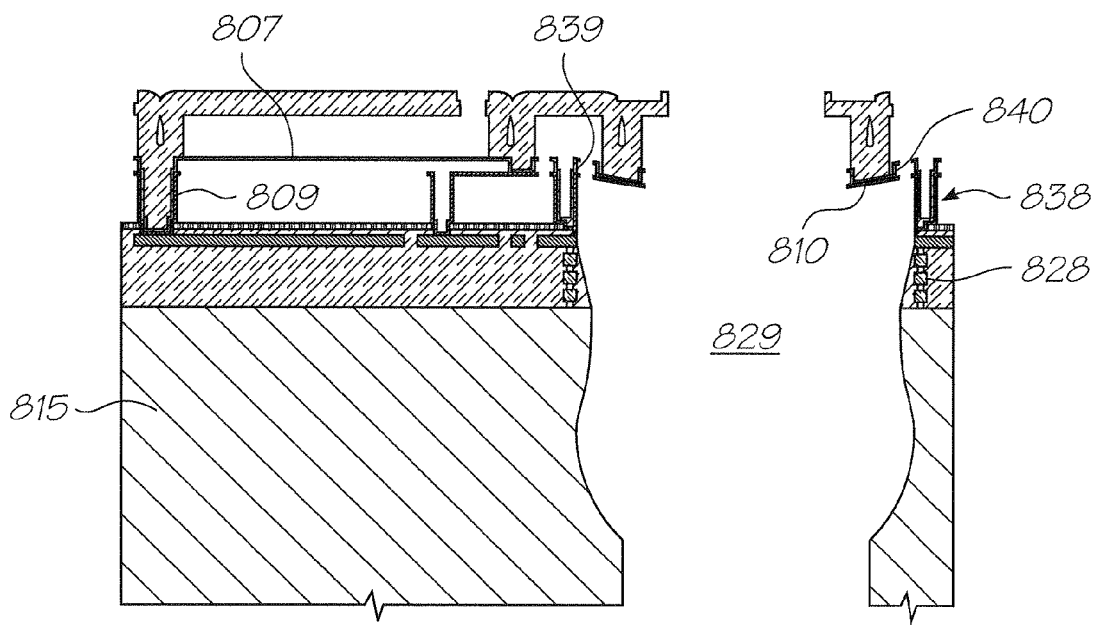
FIG. 50 shows a vertical sectional view of the nozzle of FIG. 49.
Figure 51:
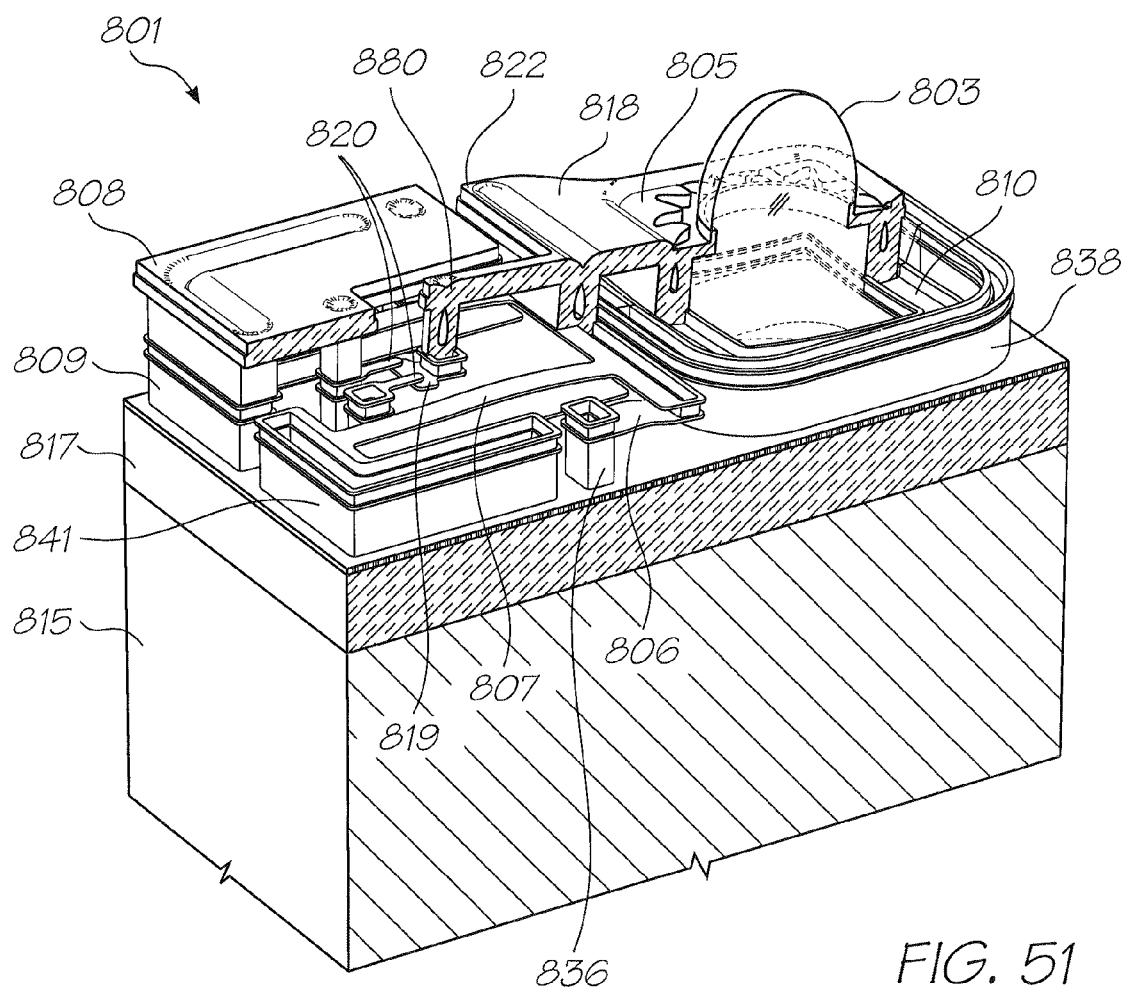
FIG. 51 shows in perspective a partial vertical sectional view of the nozzle of FIG. 45, at the actuation state shown in FIG. 46.

The lever arrangement also includes a lever arm 818 that extends from the nozzle walls and incorporates a lateral stiffening beam 822. The lever arm 818 is attached to a pair of passive beams 806, formed from titanium nitride (TiN) and positioned on either side of the nozzle arrangement, as best shown in FIGS. 48 and 51. The other ends of the passive beams 806 are attached to the carrier 836.

The lever arm 818 is also attached to an actuator beam 807, which is formed from TiN. It will be noted that this attachment to the actuator beam is made at a point a small but critical distance higher than the attachments to the passive beam 806.

As best shown in FIGS. 48 and 51, the actuator beam 807 is substantially U-shaped in plan, defining a current path between the electrode 809 and an opposite electrode 841. Each of the electrodes 809 and 841 is electrically connected to a respective point in the contact layer 830. As well as being electrically coupled via the contacts 809, the actuator beam is also mechanically anchored to anchor 808. The anchor 808 is configured to constrain motion of the actuator beam 807 to the left of FIGS. 45 to 47 when the nozzle arrangement is in operation.

The TiN in the actuator beam 807 is conductive, but has a high enough electrical resistance that it undergoes self-heating when a current is passed between the electrodes 809 and 841. No current flows through the passive beams 806, so they do not expand.

In use, the device at rest is filled with ink 813 that defines a meniscus 803 under the influence of surface tension. The ink is retained in the chamber 829 by the meniscus, and will not generally leak out in the absence of some other physical influence.

Figure 46:
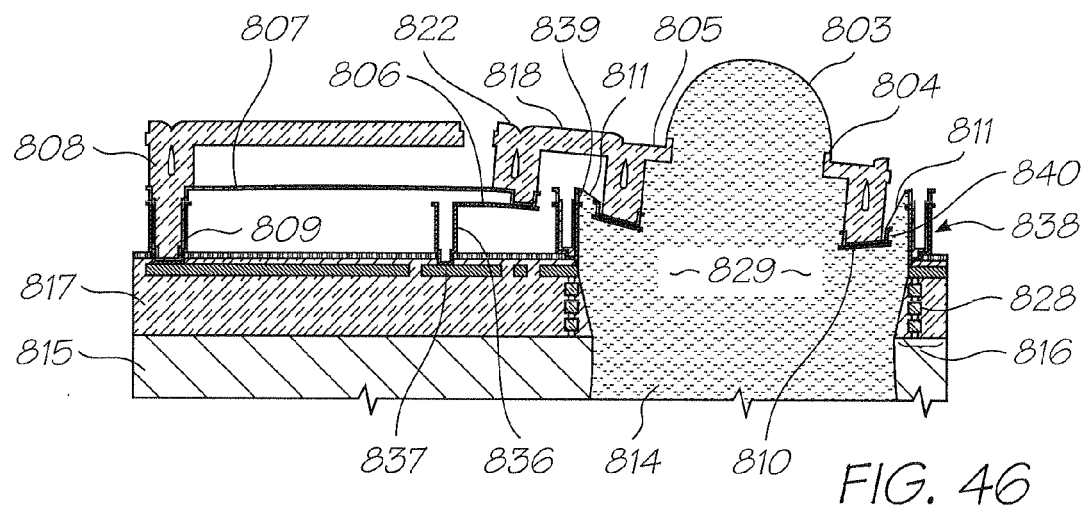
FIG. 46 shows a vertical sectional view of the nozzle of FIG. 45 at an initial actuation state.

As shown in FIG. 46, to fire ink from the nozzle, a current is passed between the contacts 809 and 841, passing through the actuator beam 807. The self-heating of the beam 807 due to its resistance causes the beam to expand. The dimensions and design of the actuator beam 807 mean that the majority of the expansion in a horizontal direction with respect to FIGS. 45 to 47. The expansion is constrained to the left by the anchor 808, so the end of the actuator beam 807 adjacent the lever arm 818 is impelled to the right.

The relative horizontal inflexibility of the passive beams 806 prevents them from allowing much horizontal movement the lever arm 818. However, the relative displacement of the attachment points of the passive beams and actuator beam respectively to the lever arm causes a twisting movement that causes the lever arm 818 to move generally downwards. The movement is effectively a pivoting or hinging motion. However, the absence of a true pivot point means that the rotation is about a pivot region defined by bending of the passive beams 806.

The downward movement (and slight rotation) of the lever arm 818 is amplified by the distance of the nozzle wall 833 from the passive beams 806. The downward movement of the nozzle walls and roof causes a pressure increase within the chamber 29, causing the meniscus to bulge as shown in FIG. 46. It will be noted that the surface tension of the ink means the fluid seal 11 is stretched by this motion without allowing ink to leak out.

Figure 47:
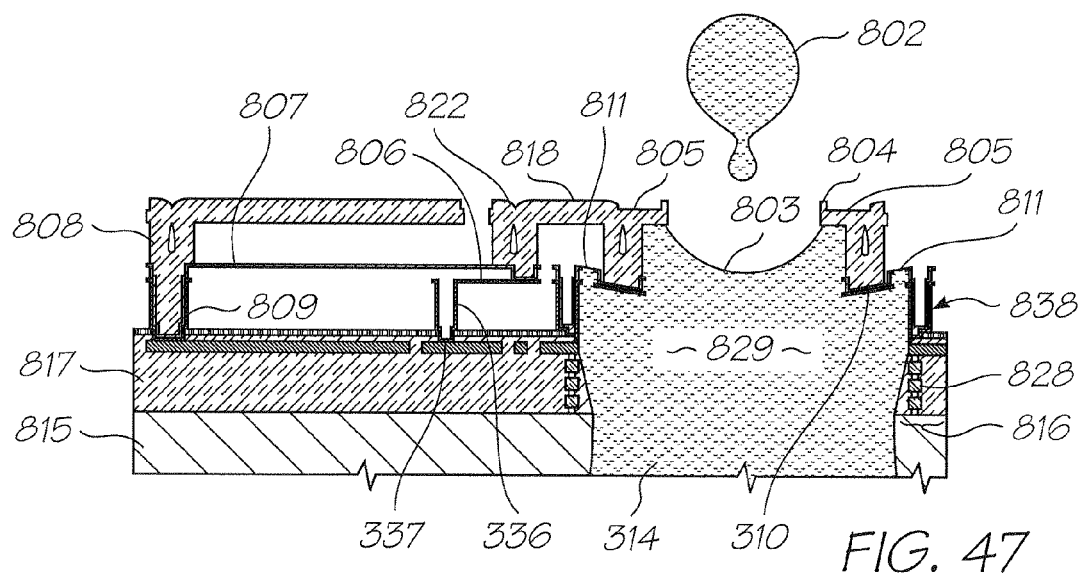
FIG. 47 shows a vertical sectional view of the nozzle of FIG. 46 at a later actuation state.

As shown in FIG. 47, at the appropriate time, the drive current is stopped and the actuator beam 807 quickly cools and contracts. The contraction causes the lever arm to commence its return to the quiescent position, which in turn causes a reduction in pressure in the chamber 829. The interplay of the momentum of the bulging ink and its inherent surface tension, and the negative pressure caused by the upward movement of the nozzle chamber 829 causes thinning, and ultimately snapping, of the bulging meniscus to define an ink drop 802 that continues upwards until it contacts the adjacent print media.

Immediately after the drop 802 detaches, the meniscus forms the concave shape shown in FIG. 45. Surface tension causes the pressure in the chamber 829 to remain relatively low until ink has been sucked upwards through the inlet 814, which returns the nozzle arrangement and the ink to the quiescent situation shown in FIG. 45.

As best shown in FIG. 48, the nozzle arrangement also incorporates a test mechanism that can be used both post-manufacture and periodically after the printhead assembly is installed. The test mechanism includes a pair of contacts 820 that are connected to test circuitry (not shown). A bridging contact 819 is provided on a finger 843 that extends from the lever arm 818. Because the bridging contact 819 is on the opposite side of the passive beams 806, actuation of the nozzle causes the priding contact to move upwardly, into contact with the contacts 820. Test circuitry can be used to confirm that actuation causes this closing of the circuit formed by the contacts 819 and 820. If the circuit is closed appropriately, it can generally be assumed that the nozzle is operative.

Exemplary Method of Assembling Components

An exemplary method of assembling the various above-described modular components of the printhead assembly in accordance with one embodiment of the present invention will now be described. It is to be understood that the below described method represents only one example of assembling a particular printhead assembly of the present invention, and different methods may be employed to assemble this exemplary printhead assembly or other exemplary printhead assemblies of the present invention.

The printhead integrated circuits 51 and the printhead tiles 50 are assembled as follows:

- A. The printhead integrated circuit 51 is first prepared by forming 7680 nozzles in an upper surface thereof, which are spaced so as to be capable of printing with a resolution of 1600 dpi;
- B. The fluid distribution stacks 500 (from which the printhead tiles 50 are formed) are constructed so as to have the three layers 510, 520 and 530, the channel layer 540 and the plate 550 made of stainless steel bonded together in a vacuum furnace into a single body via metal interdiffusion, where the inner surface of the lower layer 530 and the surfaces of the middle and upper layers 520 and 510 are etched so as to be provided with the channels and holes 531 and 532, 521 and 522, and 511 to 513, respectively, so as to be capable of transporting the CYMK and IR inks and fixative to the individual nozzles of the printhead integrated circuit 51 and air to the surface of the printhead integrated circuit 51, as described earlier. Further, the outer surface of the lower layer 530 is etched so as to be provided with the inlet ports 54;
- C. An adhesive, such as a silicone adhesive, is then applied to an upper surface of the fluid distribution stack 500 for attaching the printhead integrated circuit 51 and the (fine pitch) PCB 52 in close proximity thereto;
- D. The printhead integrated circuit 51 and the PCB 52 are picked up, pre-centred and then bonded on the upper surface of the fluid distribution stack 500 via a pick-and-place robot;
- E. This assembly is then placed in an oven whereby the adhesive is allowed to cure so as to fix the printhead integrated circuit 51 and the PCB 52 in place;
- F. Connection between the printhead integrated circuit 51 and the PCB 52 is then made via a wire bonding machine, whereby a 25 micron diameter alloy, gold or aluminium wire is bonded between the bond pads on the printhead integrated circuit 51 and conductive pads on the PCB 52;
- G. The wire bond area is then encapsulated in an epoxy adhesive dispensed by an automatic two-head dispenser. A high viscosity non-sump adhesive is firstly applied to draw a dam around the wire bond area, and the dam is then filled with a low viscosity adhesive to fully encapsulate the wire bond area beneath the adhesive;
- H. This assembly is then placed on levelling plates in an oven and heat cured to form the epoxy encapsulant 53. The levelling plates ensure that no encapsulant flows from the assembly during curing; and
- I. The thus-formed printhead tiles 50 and printhead integrated circuits 51 are 'wet' tested with a suitable fluid, such as pure water, to ensure reliable performance and are then dried out, where they are then ready for assembly on the fluid channel member 40.

The units composed of the printhead tiles 50 and the printhead integrated circuits 51 are prepared for assembly to the fluid channel members 40 as follows:

- J. The (extended) flex PCB 80 is prepared to provide data and power connection to the printhead integrated circuit 51 from the PCB 90 and busbars 71, 72 and 73; and
- K. The flex PCB 80 is aligned with the PCB 52 and attached using a hot bar soldering machine.

The fluid channel members 40 and the casing 20 are formed and assembled as follows:

- L. Individual fluid channel members 40 are formed by injection moulding an elongate body portion 44a so as to have seven individual grooves (channels) extending therethrough and the two longitudinally extending tabs 43 extending therealong on either side thereof. The (elongate) lid portion 44b is also moulded so as to be capable of enclosing the body portion 44a to separate each of the channels. The body and lid portions are both moulded so as to have end portions which form the female and male end portions 45 and 46 when assembled together. The lid portion 44b and the body portion 44a are then adhered together with epoxy and cured so as to form the seven ducts 41;
- M. The casing 20 is then formed by extruding aluminium to a desired configuration and length by separately forming the (elongate) support frame 22, with the channel 21 formed on the upper wall 27 thereof, and the (elongate) cover portion 23;
- N. The end plate 110 is attached with screws via the threaded portions 22a and 22b formed in the support frame 22 to one (first) end of the casing 20, and the end plate 111 is attached with screws via the threaded portions 22a and 22b to the other (second) end of the casing 20;
- O. An epoxy is applied to the appropriate regions (i.e., so as not to cover the channels) of either a female or male connector 47 or 48, and either the female or male connecting section 49a or 49b of a capping member 49 via a controlled dispenser;
- P. An epoxy is applied to the appropriate regions (i.e., so as not to cover the channels) of the female and male end portions 45 and 46 of the plurality of fluid channel members 40 to be assembled together, end-to-end, so as to correspond to the desired length via the controlled dispenser;
- Q. The female or male connector 47 or 48 is then attached to the male or female end portion 46 or 45 of the fluid channel member 40 which is to be at the first end of the plurality of fluid channel members 40 and the female or male connecting section 49a or 49b of the capping member 49 is attached to the male or female end portion 46 or 45 of the fluid channel member 40 which is to be at the second end of the plurality of fluid channel members 40;
- R. Each of the fluid channel members 40 is then placed within the channel 21 one-by-one. Firstly, the (first) fluid channel member 40 to be at the first end is placed within the channel 21 at the first end, and is secured in place by way of the PCB supports 91 which are clipped into the support frame 22, in the manner described earlier, so that the unconnected end portion 45 or 46 of the fluid channel member 40 is left exposed with the epoxy thereon. Then, a second member 40 is placed in the channel 21 so as to mate with the first fluid channel member 40 via its corresponding end portion 45 or 46 and the epoxy therebetween and is then clipped into place with its PCB supports 91. This can then be repeated until the final fluid channel member 40 is in place at the second end of the channel 21. Of course, only one fluid channel member 40 may be used, in which case it may have a connector 47 or 48 attached to one end portion 46 or 45 and a capping member 49 attached at the other end portion 45 or 46;

S. This arrangement is then placed in a compression jig, whereby a compression force is applied against the ends of the assembly to assist in sealing the connections between the individual fluid channel members 40 and their end connector 47 or 48 and capping member 49. The complete assembly and jig is then placed in an oven at a temperature of about 100° C. for a predefined period, for example, about 45 minutes, to enhance the curing of the adhesive connections. However, other methods of curing, such as room temperature curing, could also be employed;

T. Following curing, the arrangement is pressure tested to ensure the integrity of the seal between the individual fluid channel members 40, the connector 47 or 48, and the capping member 49; and U. The exposed upper surface of the assembly is then oxygen plasma cleaned to facilitate attachment of the individual printhead tiles 50 thereto.

The printhead tiles 50 are attached to the fluid channel members 40 as follows:

V. Prior to placement of the individual printhead tiles 50 upon the upper surface of the fluid channel members 40, the bottom surface of the printhead tiles 50 are argon plasma cleaned to enhance bonding. An adhesive is then applied via a robotic dispenser to the upper surface of the fluid channel members 40 in the form of an epoxy in strategic positions on the upper surface around and symmetrically about the outlet ports 42. To assist in fixing the printhead tiles 50 in place a fast acting adhesive, such as cyanoacrylate, is applied in the remaining free areas of the upper surface as the adhesive drops 62 immediately prior to placing the printhead tiles 50 thereon;

W. Each of the individual printhead tiles 50 is then carefully aligned and placed on the upper surface of the fluid channel members 40 via a pick-and-place robot, such that a continuous print surface is defined along the length of the printhead module 30 and also to ensure that that the outlet ports 42 of the fluid channel members 40 align with the inlet ports 54 of the individual printhead tiles 50. Following placement, the pick-and-place robot applies a pressure on the printhead tile 50 for about 5 to 10 seconds to assist in the setting of the cyanoacrylate and to fix the printhead tile 50 in place. This process is repeated for each printhead tile 50;

X. This assembly is then placed in an oven at about 100° C. for about 45 minutes to cure the epoxy so as to form the gasket member 60 and the locators 61 for each printhead tile 50 which seal the fluid connection between each of the outlet and inlet ports 42 and 54. This fixes the printhead tiles 50 in place on the fluid channel members 40 so as to define the print surface; and Y. Following curing, the assembly is inspected and tested to ensure correct alignment and positioning of the printhead tiles 50.

The printhead assembly 10 is assembled as follows:

Z. The support member 112 is attached to the end PCB supports 91 so as to align with the recessed portion 91b of the end supports 91;

AA. The connecting members 102 are placed in the abutting recessed portions 91b between the adjacent PCB supports 91 and in the abutting recessed portions 112b and 91b of the support members 112 and end PCB supports 91, respectively;

BB. The PCBs 90, each having assembled thereon a PEC integrated circuit 100 and its associated circuitry, are then mounted on the PCB supports 91 along the length of the casing 20 and are retained in place between the notch portions 96a of the retaining clips 96 and the recessed portions 93a and locating lugs 93b of the base portions 93 of the PCB supports 91. As described earlier, the PCBs 90 can be arranged such that the PEC integrated circuit 100 of one PCB 90 drives the printhead integrated circuits 51 of four printhead tiles 50, or of eight printhead tiles 50, or of 16 printhead tiles 50. Each of the PCBs 90 include the connection strips 90a and 90b on the inner face thereof which communicate with the connecting members 102 allowing data transfer between the PEC integrated circuits 100 of each of the PCBs 90, between the printhead integrated circuits 51 and PEC integrated circuits 100 of each of the PCBs 90, and between the data connection portion 117 of the connector arrangement 115;

CC. The connector arrangement 115, with the power supply, data and fluid delivery connection portions 116, 117 and 118 attached thereto, is attached to the end plate 110 with screws so that the region 115c of the connector arrangement 115 is clipped into the clip portions 112d of the support member 112;

DD. The busbars 71, 72 and 73 are inserted into the corresponding channeled recesses 95a, 95b and 95c of the plurality of PCB supports 91 and are connected at their ends to the corresponding contact screws 116a, 116b and 116c of the power supply connection portion 116 of the connector arrangement 115. The busbars 71, 72 and 73 provide a path for power to be distributed throughout the printhead assembly;

EE. Each of the flex PCBs 80 extending from each of the printhead tiles 50 is then connected to the connectors 98 of the corresponding PCBs 90 by slotting the slot regions 81 into the connectors 98;

FF. The pressure plates 74 are then clipped onto the PCB supports 91 by engaging the holes 74a and the tab portions 74c of the holes 74b with the corresponding retaining clips 99 and 96 of the PCB supports 91, such that the raised portions 75 of the pressure plates 74 urge the power contacts of the flex PCBs 80 into contact with each of the busbars 71, 72 and 73, thereby providing a path for the transfer of power between the busbars 71, 72 and 73, the PCBs 90 and the printhead integrated circuits 51;

GG. The internal fluid delivery tubes 6 are then attached to the corresponding tubular portions 47b or 48b of the female or male connector 47 or 48; and HH. The elongate, aluminium cover portion 23 of the casing 20 is then placed over the assembly and screwed into place via screws through the remaining holes in the end plates 110 and 111 into the threaded portions 23b of the cover portion 23, and the end housing 120 is placed over the connector arrangement 115 and screwed into place with screws into the end plate 110 thereby completing the outer housing of the printhead assembly and so as to provide electrical and fluid communication between the printhead assembly and a printer unit. The external fluid tubes or hoses can then be assembled to supply ink and the other fluids to the channels ducts. The cover portion 23 can also act as a heat sink for the PEC integrated circuits 100 if the fin portions 23*d* are provided thereon, thereby protecting the circuitry of the printhead assembly 10.

Testing of the printhead assembly occurs as follows:

II. The thus-assembled printhead assembly 10 is moved to a testing area and inserted into a final print test machine which is essentially a working printing unit, whereby connections from the printhead assembly 10 to the fluid and power supplies are manually performed;

JJ. A test page is printed and analysed and appropriate adjustments are made to finalise the printhead electronics; and KK. When passed, the print surface of the printhead assembly 10 is capped and a plastic sealing film is applied to protect the printhead assembly 10 until product installation.

While the present invention has been illustrated and described with reference to exemplary embodiments thereof, various modifications will be apparent to and might readily be made by those skilled in the art without departing from the scope and spirit of the present invention. Accordingly, it is not intended that the scope of the claims appended hereto be limited to the description as set forth herein, but, rather, that the claims be broadly construed.

What is claimed is:

1. A printed circuit board (PCB) assembly that comprises a number of modular PCBs;

electrical connector assemblies for operatively connecting respective PCBs to each other, each connector assembly having a connecting member with a series of parallel spaced conducting strips, said member shaped and configured for fitment into a cavity defined by the raised and recessed portions of two abutting supports to connect the connecting strips of two PCBs via said conducting strips; and modular supports, each PCB mounted to a respective modular support defining a raised portion and a recessed portion at an end thereof, each PCB having electrical connecting strips which overlie the respective recessed portions.

2. The PCB assembly of claim 1, wherein the conducting strips of each connecting member are provided in a 2:1 relationship with the connecting strips of the PCB.

3. The PCB assembly of claim 1, wherein the connecting strips are each about 0.4 mm wide with a 0.4 mm gap between adjacent strips.

4. The PCB assembly of claim 1, wherein the conducting strips are gold plated.

* * * * *